US009580810B2

(12) United States Patent
Yamasaki et al.

(10) Patent No.: US 9,580,810 B2
(45) Date of Patent: Feb. 28, 2017

(54) DISPERSION OF METAL NANOPARTICLES, METHOD FOR PRODUCING THE SAME, AND METHOD FOR SYNTHESIZING METAL NANOPARTICLES

(75) Inventors: Kazuhiko Yamasaki, Naka-gun (JP); Airi Katagiri, Minamisaitama-gun (JP); Masahide Arai, Naka-gun (JP); Yoshiaki Takata, Iwaki (JP); Toshiharu Hayashi, Naka-gun (JP)

(73) Assignee: Mitsubishi Materials Corporation, Tokyo (JP)

( * ) Notice: Subject to any disclaimer, the term of this patent is extended or adjusted under 35 U.S.C. 154(b) by 500 days.

(21) Appl. No.: 12/528,625

(22) PCT Filed: Feb. 27, 2008

(86) PCT No.: PCT/JP2008/053399
§ 371 (c)(1),
(2), (4) Date: Aug. 25, 2009

(87) PCT Pub. No.: WO2008/105456
PCT Pub. Date: Sep. 4, 2008

(65) Prior Publication Data
US 2010/0101637 A1    Apr. 29, 2010

(30) Foreign Application Priority Data

Feb. 27, 2007  (JP) ................................. 2007-047246
Jan. 17, 2008  (JP) ................................. 2008-007650
(Continued)

(51) Int. Cl.
C23C 18/00       (2006.01)
C23C 18/54       (2006.01)
(Continued)

(52) U.S. Cl.
CPC ............. *C23C 18/54* (2013.01); *B22F 1/0022* (2013.01); *B22F 9/24* (2013.01); *B82Y 30/00* (2013.01);
(Continued)

(58) Field of Classification Search
CPC ..................................................... C23C 18/54
(Continued)

(56) References Cited

U.S. PATENT DOCUMENTS

2001/0051102 A1    12/2001  Wolmer et al.
2003/0004186 A1*   1/2003   Greco .................. C07D 207/48
                                                              514/317
(Continued)

FOREIGN PATENT DOCUMENTS

CN          1600477 A         3/2005
JP          07-145409 A       6/1995
(Continued)

OTHER PUBLICATIONS

Office Action mailed Jun. 3, 2014 for the related Japanese Application No. 2013-098550.
(Continued)

*Primary Examiner* — Robert Vetere
(74) *Attorney, Agent, or Firm* — Leason Ellis LLP

(57) ABSTRACT

The present invention aims to provide a method for producing a dispersion of metal nanoparticles which enables to control the shape and the particle diameter over a wide range, a dispersion of metal nanoparticles having superior dispersion stability, and a method for producing the same. In addition, the present invention further aims to provide a dispersion of metal nanoparticles which has a volume resistivity of $2 \times 10^{-6}$ to $6 \times 10^{-6}$ Ω·cm and is suitable for use as an electrically conductive material, and a method for producing the same. Moreover, the present invention further aims to
(Continued)

provide a method for synthesizing metal nanoparticles which can produce metal nanoparticles suitable for use as electrically conductive materials by synthesizing the metal nanoparticles from a insoluble metal salt which is free of corrosive materials.

64 Claims, 5 Drawing Sheets

(30) Foreign Application Priority Data

| | | | |
|---|---|---|---|
| Jan. 17, 2008 | (JP) | | 2008-007656 |
| Jan. 17, 2008 | (JP) | | 2008-007658 |
| Jan. 17, 2008 | (JP) | | 2008-007669 |
| Jan. 22, 2008 | (JP) | | 2008-011334 |
| Jul. 17, 2008 | (JP) | | 2008-007670 |

(51) Int. Cl.

| | |
|---|---|
| *B22F 1/00* | (2006.01) |
| *B22F 9/24* | (2006.01) |
| *B82Y 30/00* | (2011.01) |
| *H01B 1/16* | (2006.01) |
| *H01L 31/0224* | (2006.01) |
| *C23C 24/08* | (2006.01) |

(52) U.S. Cl.
CPC ............. *C23C 24/087* (2013.01); *H01B 1/16* (2013.01); *H01L 31/022408* (2013.01); *H01L 31/022425* (2013.01); *Y02E 10/50* (2013.01)

(58) Field of Classification Search
USPC .................................................... 427/74, 226
See application file for complete search history.

(56) References Cited

U.S. PATENT DOCUMENTS

| | | | | |
|---|---|---|---|---|
| 2003/0004316 A1* | 1/2003 | Da Fonseca | ........... | C07K 14/76 530/362 |
| 2003/0124959 A1* | 7/2003 | Schroeder | ................ | C09G 1/02 451/41 |
| 2003/0136223 A1 | 7/2003 | Jin et al. | | |
| 2005/0022374 A1* | 2/2005 | Hirai et al. | .................... | 29/825 |
| 2005/0061107 A1* | 3/2005 | Hampden-Smith et al. | ... | 75/332 |
| 2005/0148164 A1* | 7/2005 | Casey et al. | .................. | 438/610 |
| 2006/0065075 A1* | 3/2006 | Chang et al. | ................... | 75/371 |
| 2006/0068217 A1* | 3/2006 | Mizuno et al. | ............... | 428/570 |
| 2006/0073667 A1* | 4/2006 | Li et al. | ........................ | 438/311 |
| 2007/0069183 A1* | 3/2007 | Sato et al. | .................... | 252/500 |
| 2007/0134902 A1* | 6/2007 | Bertino et al. | ................ | 438/610 |
| 2008/0032047 A1* | 2/2008 | Parashar et al. | ........... | 427/372.2 |
| 2008/0145633 A1* | 6/2008 | Kodas et al. | ................ | 428/220 |
| 2008/0152926 A1* | 6/2008 | Baikerikar et al. | ........ | 428/422.8 |

FOREIGN PATENT DOCUMENTS

| | | |
|---|---|---|
| JP | 10-317022 A | 12/1998 |
| JP | 11-106806 A | 4/1999 |
| JP | 2000-087122 A | 3/2000 |
| JP | 2003-160876 A | 6/2003 |
| JP | 2003-253311 A | 9/2003 |
| JP | 2005-105376 A | 4/2005 |
| JP | 2005-220380 A | 8/2005 |
| JP | 2005-248204 A | 9/2005 |
| JP | 2006-045655 A | 2/2006 |
| JP | 2006-118010 A | 5/2006 |
| JP | 2006-152344 A | 6/2006 |
| JP | 2006-193795 A | 7/2006 |
| JP | 2006-225760 A | 8/2006 |
| JP | 2007-016258 A | 1/2007 |
| TW | 533431 | 5/2003 |
| TW | 200640596 | 12/2006 |

OTHER PUBLICATIONS

Office Action mailed Mar. 26, 2013 for the corresponding Japanese Application No. 2008-038277.
Office Action mailed Apr. 9, 2013 for the corresponding Taiwanese Application No. 097106864.
Office Action mailed Jan. 6, 2015 for the related Japanese Application No. 2013-098550.
International Search Report mailed May 13, 2008 for the corresponding PCT Application No. PCT/JP2008/053399.

\* cited by examiner

DISPERSION OF METAL NANOPARTICLES, METHOD FOR PRODUCING THE SAME, AND METHOD FOR SYNTHESIZING METAL NANOPARTICLES

CROSS REFERENCE TO PRIOR APPLICATIONS

This is the U.S. National Phase application under 35 U.S.C. §371 of International Patent Application No. PCT/JP2008/053399, filed Feb. 27, 2008, and claims the benefit of Japanese Patent Application Nos. JP2007-047246, filed Feb. 27, 2007, JP2008-007650, filed Jan. 17, 2008, JP2008-007656, filed Jan. 17, 2008, JP2008-007658, filed Jan. 17, 2008 JP2008-007669, filed Jan. 17, 2008, JP2008-007670, filed Jan. 17, 2008, JP2008-011334, filed Jan. 22, 2008, JP2008-011340, filed Jan. 22, 2008, JP2008-011343, filed Jan. 22, 2008, JP2008-038277, filed Feb. 20, 2008, JP2008-038280, filed Feb. 20, 2008, JP2008-038281, filed Feb. 20, 2008, JP2008-038283, filed Feb. 20, 2008, and JP2008-038285, filed Feb. 20, 2008, all of which are incorporated by reference herein. The International Application was published in English on Sep. 4, 2008 as WO 2008/105456 under PCT Article 21(2).

TECHNICAL FIELD

The present invention relates to a dispersion of metal nanoparticles and a method for producing the same. Moreover, the present invention relates to a method for synthesizing metal nanoparticles.

BACKGROUND ART

Since the melting point of metal nanoparticles having a particle diameter on the order of several nanometers differs dramatically from that of a bulk metal, these metal nanoparticles have conventionally been expected to be applied to electrically conductive pastes and the like which can be used for a low-temperature baking. In the past, methods involving the reduction of a metal in a solvent are known to have been used to produce such metal nanoparticles.

For example, numerous techniques have been studied as methods for synthesizing silver nanoparticles in an aqueous solution, a typical example of which is the so-called Carey-Lea sol method in which an aqueous silver nitrate solution is added to an aqueous solution of a ferrous salt and a citric acid salt. According to this method, a silver colloid dispersion can be obtained which has superior dispersion stability, a particle diameter on the order of 10 nm, and a narrow particle size distribution. By coating a dispersion containing such metal nanoparticles on a base material, and then baking at a low temperature, a film is formed which has a volume resistivity and a reflectance close to those of bulk metals, and this film can be used as an electrode. When using these metal colloid dispersions, it is known that their properties can be changed considerably by controlling the particle diameter, the particle size distribution, and the shape of the microparticles.

As an example of a method for producing such metal nanoparticles, a method for forming a nanoprism is disclosed in which silver crystals are formed by exposing a dispersion of amorphous silver particles to a light source having a wavelength of less than 700 nm (see, for example, US Patent Application, Publication No. 2003/0136223 (claim 1, FIG. 7)). According to this method, plate-like silver single crystals are formed.

In addition, a method for producing silver powder composed of hexagonal plate-like crystalline silver particles is disclosed which includes temporarily mixing a slurry containing an ammine complex of a silver salt and an ammine complex of a heavy-metal salt that functions as a habit modifier during a reduction reaction, with a solution containing potassium sulfite that is a reducing agent and a gelatin that is a protective colloid, so as to reduce the ammine complex of the silver salt, and recovering the formed silver particles (see, for example, Japanese Unexamined Patent Application, First Publication No. H11-106806 (claim 2, paragraph [0021] of specification)). In the method disclosed in Patent Document 2, hexagonal plate-like crystalline microparticles having a primary particle diameter of 5 to 10 μm are obtained.

Moreover, silver microparticles are known that are roughly plate-like particles having two principal planes and having a particle thickness of 50 nm or less and a length of a major axis of 5000 nm or less (see, for example, Japanese Unexamined Patent Application, First Publication No. 2005-105376 (claims 1 and 4)). In the method disclosed in Patent Document 3, silver microparticles are produced by stirring a solution in which at least a polymer compound, a reducing agent, and a silver salt are dissolved at a temperature of 25 to 60° C.

On the other hand, as was previously described, since the melting point of the metal nanoparticles having a particle diameter on the order of several nanometers differs dramatically from that of a bulk metal, the metal nanoparticles have conventionally been expected to be applied to the electrically conductive pastes and the like which can be used for a low-temperature baking. In order to produce such metal nanoparticles, methods have been used in the past in which a metal is reduced in a solvent like that described above.

Therefore, in order to prepare desired metal nanoparticles in the form of a uniform dispersion, it has been considered that it is necessary to use a raw material metal salt (metal compound) that dissolves in the liquid (solvent), and the number of raw materials available for that use have conventionally been limited for that reason. For example, in the case of obtaining silver nanoparticles, soluble compounds have been exclusively used, such as silver nitrate or silver perchlorate in the case of using aqueous solvents, and silver complexes in the case of using organic solvents.

However, since silver halides can be easily acquired for use as silver raw materials from the viewpoint that they are already produced in large volume as photographic raw materials, and since they can also be handled easily as solids, it would be preferable if silver nanoparticles could be produced from such insoluble silver salts. From this viewpoint, a method for producing silver nanoparticles by reducing a silver salt in a solvent has been proposed in which a silver halide is used as the silver salt, a metal coordinating compound capable of dissolving in the solvent and coordinating with silver is used as a protective agent for the silver salt serving as the raw material, and the reduction is carried out in the presence of the protective agent composed of that compound (see, for example, Japanese Unexamined Patent Application, First Publication No. 2003-253311 (paragraphs [0002] to [0005] of specification)). This method is based on the finding that by using a specific protective agent, an insoluble silver salt such as a silver halide can be effectively reduced in a solvent to produce nanoparticles, and according to this method, silver nanoparticles can be produced from an insoluble silver salt.

SUMMARY OF THE INVENTION

Problems to be Solved by the Invention

However, in the methods of the prior art disclosed above, there were few controllable factors, and there is a problem that the shape and the particle diameter of metal nanoparticles can not be controlled over a wide range.

Therefore, a first object of the present invention is to provide a method for producing metal nanoparticles which enables to control the shape and the particle diameter over a wide range as compared with the aforementioned methods.

A second object of the present invention is to provide a dispersion of metal nanoparticles having superior dispersion stability and a method for producing the same.

A third object of the present invention is to provide a dispersion of metal nanoparticles which has a volume resistivity of 2 to $6 \times 10^{-6}$ Ω·cm and is suitable for use as an electrically conductive material and a method for producing the same.

Moreover, in a method for producing metal nanoparticles of the prior art in which a silver halide is used as a silver salt as described in the aforementioned JP2003-253311, the silver halide used as a raw material contains halogen which causes corrosion, and sulfur is contained in a portion of the raw materials. Therefore, in the case where a dispersion obtained by this production method and in which silver nanoparticles are dispersed is used as a paste and the like for electronic equipment wirings, the problem of lacking long-term stability that needed to be solved has still remained. In particular, since a thiol-based compound is used as a protective agent for the silver nanoparticles, sulfur is expected to remain in the wirings even after baking.

Therefore, a fourth object of the present invention is to provide a method for synthesizing metal nanoparticles which can produce metal nanoparticles suitable for use as electrically conductive materials by synthesizing the metal nanoparticles from insoluble metal salts which are free of corrosive materials.

Embodiments of the present invention relating to the following [1] to [17] are described below.

[1] An embodiment of the dispersion of metal nanoparticles includes metal nanoparticles which are dispersed in a dispersion medium, wherein the metal nanoparticles are synthesized by adding and mixing a metal salt in which the proportion of silver to metal elements is 75% by mass or more, a carboxylic acid, a reducing agent, and an additive in the form of a salt of one type or two or more types of metal elements selected from the group consisting of sodium, magnesium, potassium, calcium, aluminum, chromium, manganese, iron, cobalt, nickel, copper, zinc, zirconium, molybdenum, indium, tin, barium, lead, bismuth, and cerium, which differ from the metal elements that compose the metal salt and which are not reduced by the reducing agent, in a liquid phase, and stirring the resulting suspension at a temperature of 25 to 95° C., and the concentration of the additive contained in the dispersion is within a range from 0.01 to 100 ppm.

In accordance with the embodiment as described in [1], the dispersion has superior dispersion stability, provided that the concentration of the additive contained in the dispersion is within the aforementioned range.

[2] The embodiment of the dispersion according to [1], wherein the dispersion medium contains 1% by mass or more of water and 2% by mass or more of alcohol.

[3] The embodiment of the dispersion according to [2], wherein the alcohol is one type or two or more types of alcohol selected from the group consisting of methanol, ethanol, propanol, butanol, ethylene glycol, propylene glycol, diethylene glycol, isobornyl hexanol, glycerol, and erythritol.

[4] An embodiment of the method for producing a dispersion of metal nanoparticles, includes: synthesizing metal nanoparticles by mixing a metal salt in which the proportion of silver to the metal elements is 75% by mass or more, a carboxylic acid, and a reducing agent in a liquid phase; and dispersing the synthesized metal nanoparticles in a dispersion medium, wherein the synthesizing of the metal nanoparticles is carried out by adding and mixing an additive in the form of a salt of one type or two or more types of metal elements selected from the group consisting of sodium, magnesium, potassium, calcium, aluminum, chromium, manganese, iron, cobalt, nickel, copper, zinc, zirconium, molybdenum, indium, tin, barium, lead, bismuth and cerium, which differ from the metal elements that compose the metal salt and which are not reduced by the reducing agent, together with the metal salt, the carboxylic acid, and the reducing agent in the liquid phase, and stirring the resulting suspension at a temperature of 25 to 95° C., and after the synthesizing of the metal nanoparticles, the concentration of the additive contained in the prepared dispersion is reduced to be within a range from 0.01 to 100 ppm.

In accordance with the embodiment as described in [4], when synthesizing the metal nanoparticles, the shape and the particle diameter of the generating metal particles can be controlled over a wide range by adding and mixing the additive in the form of the salt of the above-listed types of metal elements together with the metal salt, the carboxylic acid, and the reducing agent in the liquid phase, and stirring the resulting suspension at a temperature of 25 to 95° C. In addition, a dispersion having superior dispersion stability can be obtained by reducing the concentration of the additive contained in the prepared dispersion to be within a range from 0.01 to 100 ppm after the synthesizing of the metal nanoparticles.

[5] The embodiment of the production method according to [4], wherein the carboxylic acid is one type or two or more types selected from the group consisting of glycolic acid, citric acid, malic acid, maleic acid, malonic acid, fumaric acid, succinic acid, tartaric acid, and salts thereof.

[6] The embodiment of the production method according to [4], wherein the reducing agent is one type or two or more types selected from the group consisting of hydrazine, sodium borohydride, ascorbic acid, oxalic acid, formic acid, salts thereof, and salts of Fe(II).

[7] The embodiment of the production method according to [4], wherein metal nanoparticles which has a composition, a mixed composition, or an alloy composition composed of one type or two or more types selected from the group consisting of gold, platinum, palladium, and ruthenium, are contained at a content within a range from 0.02% by mass or more to less than 25% by mass.

[8] The embodiment of the production method according to [4], wherein the dispersion medium contains 1% by mass or more of water and 2% by mass or more of alcohol.

[9] The embodiment of the production method according to [8], wherein the alcohol is one type or two or more types selected from the group consisting of methanol, ethanol, propanol, butanol, ethylene glycol, propylene glycol, diethylene glycol, isobornyl hexanol, glycerol, and erythritol.

[10] An embodiment of the dispersion of metal nanoparticles which is obtained by the production method according to any one of [4] to [9], wherein the concentration of the additive contained in the dispersion is within a range from 0.01 to 100 ppm.

In accordance with the embodiment as described in [10], the dispersion has superior dispersion stability, provided that the concentration of the additive contained in the dispersion is within the aforementioned range.

[11] An embodiment of the method for forming an electrode for a solar cell, includes: preparing an electrode-forming composition by using the dispersion of metal nanoparticles according to any one of [1] to [3], a dispersion of metal nanoparticles obtained by the method according to any one of [4] to [9], or the dispersion of metal nanoparticles according to [10]; and coating the electrode-forming composition on a base material by a wet coating process.

[12] An embodiment of the method for forming an electrode of a solar cell, includes: preparing an electrode-forming composition by using the dispersion of metal nanoparticles according to any one of [1] to [3], a dispersion of metal nanoparticles obtained by the method according to any one of [4] to [9], or the dispersion of metal nanoparticles according to [10]; coating the electrode-forming composition on a base material by a wet coating process to form a film such that the thickness of the film after baking becomes within a range from 0.1 to 2.0 µm; and baking the base material having the film on the upper surface thereof at 130 to 400° C.

[13] The embodiment of the method for forming an electrode of a solar cell according to [11] or [12], wherein the base material is a substrate composed of either one of silicon, glass, ceramic containing a transparent electrically conductive material, polymer material, and metal, or a laminate of two or more types of materials selected from the group consisting of silicon, glass, ceramic containing a transparent electrically conductive material, polymer material, and metal.

[14] The embodiment of the method for forming an electrode of a solar cell according to [11] or [12], wherein the base material is either one of a solar cell element and a solar cell element having a transparent electrode.

[15] The embodiment of the method for forming an electrode of a solar cell according to [11] or [12], wherein the wet coating process is either one of spray coating, dispenser coating, spin coating, knife coating, slit coating, ink jet coating, screen printing, offset printing, and die coating.

[16] An embodiment of the electrode for a solar cell which is obtained by the method for forming an electrode of a solar cell according to [11] to [15].

[17] An embodiment of the solar cell includes the electrode according to [16].

Moreover, embodiments of the present invention relating to the following [18] to [34] are described below.

[18] An embodiment of the dispersion of metal nanoparticles includes metal nanoparticles which are dispersed in a dispersion medium, wherein the metal nanoparticles are synthesized by adding and mixing a metal salt in which the proportion of silver to metal elements is 75% by mass or more, a carboxylic acid, a reducing agent, and an additive containing one type or two or more types of anions selected from the group consisting of chlorine ions, sulfate ions, iodine ions, bromine ions, borate ions, and phosphate ions in a liquid phase, and stirring the resulting suspension at a temperature of 25 to 95° C., and the concentration of the additive contained in the dispersion is within a range from 0.01 to 100 ppm.

In accordance with the embodiment as described in [18], the dispersion has superior dispersion stability, provided that the concentration of the additive contained in the dispersion is within the aforementioned range.

[19] The embodiment of the dispersion according to [18], wherein the dispersion medium contains 1% by mass or more of water and 2% by mass or more of alcohol.

[20] The embodiment of the dispersion according to [19], wherein the alcohol is one type or two or more types of alcohol selected from the group consisting of methanol, ethanol, propanol, butanol, ethylene glycol, propylene glycol, diethylene glycol, isobornyl hexanol, glycerol, and erythritol.

[21] An embodiment of the method for producing a dispersion of metal nanoparticles, includes: synthesizing metal nanoparticles by mixing a metal salt in which the proportion of silver to metal elements is 75% by mass or more, a carboxylic acid, and a reducing agent in a liquid phase; and dispersing the synthesized metal nanoparticles in a dispersion medium, wherein the synthesizing of the metal nanoparticles is carried out by adding and mixing an additive containing one type or two or more types of anions selected from the group consisting of chlorine ions, sulfate ions, iodine ions, bromine ions, borate ions, and phosphate ions together with the metal salt, the carboxylic acid, and the reducing agent in the liquid phase, and stirring the resulting suspension at a temperature of 25 to 95° C., and after the synthesizing of the metal nanoparticles, the concentration of the additive contained in the prepared dispersion is reduced to be within a range from 0.01 to 100 ppm.

In accordance with the embodiment as described in [21], when synthesizing the metal nanoparticles, the shape and the particle diameter of the generating metal particles can be controlled over a wide range by adding and mixing the additive containing the above-listed types of anions together with the metal salt, the carboxylic acid, and the reducing agent in the liquid phase, and stirring the resulting suspension at a temperature of 25 to 95° C. In addition, a dispersion having superior dispersion stability can be obtained by reducing the concentration of the additive contained in the prepared dispersion to be within a range from 0.01 to 100 ppm after the synthesizing of the metal nanoparticles.

[22] The embodiment of the production method according to [21], wherein the carboxylic acid is one type or two or more types selected from the group consisting of glycolic acid, citric acid, malic acid, maleic acid, malonic acid, fumaric acid, succinic acid, tartaric acid, and salts thereof.

[23] The embodiment of the production method according to [21], wherein the reducing agent is one type or two or more types selected from the group consisting of hydrazine, sodium borohydride, ascorbic acid, oxalic acid, formic acid, salts thereof, and salts of Fe(II).

[24] The embodiment of the production method according to [21], wherein metal nanoparticles which has a composition, a mixed composition, or an alloy composition composed of one type or two or more types selected from the group consisting of gold, platinum, palladium, and ruthenium, are contained at a content within a range from 0.02% by mass or more to less than 25% by mass.

[25] The embodiment of the production method according to [21], wherein the dispersion medium contains 1% by mass or more of water and 2% by mass or more of alcohol.

[26] The embodiment of the production method according to [25], wherein the alcohol is one type or two or more types selected from the group consisting of methanol, ethanol, propanol, butanol, ethylene glycol, propylene glycol, diethylene glycol, isobornyl hexanol, glycerol, and erythritol.

[27] An embodiment of the dispersion of metal nanoparticles which is obtained by the production method according to any one of [21] to [26], wherein the concentration of the additive contained in the dispersion is within a range from 0.01 to 100 ppm.

In accordance with the embodiment as described in [27], the dispersion has superior dispersion stability, provided that the concentration of the additive contained in the dispersion is within the aforementioned range.

[28] An embodiment of the method for forming an electrode for a solar cell, includes: preparing an electrode-forming composition by using the dispersion of metal nanoparticles according to any one of [18] to [20], a dispersion of metal nanoparticles obtained by the method according to any one of [21] to [26], or the dispersion of metal nanoparticles according to [27]; and coating the electrode-forming composition on a base material by a wet coating process.

[29] An embodiment of the method for forming an electrode of a solar cell, includes: preparing an electrode-forming composition by using the dispersion of metal nanoparticles according to any one of [18] to [20], a dispersion of metal nanoparticles obtained by the method according to any one of [21] to [26], or the dispersion of metal nanoparticles according to [27]; coating the electrode-forming composition on a base material by a wet coating process to form a film such that the thickness of the film after baking becomes within a range from 0.1 to 2.0 µm; and baking the base material having the film on the upper surface thereof at 130 to 400° C.

[30] The embodiment of the method for forming an electrode of a solar cell according to [28] or [29] that is a method for forming an electrode of a solar cell, wherein the base material is a substrate composed of either one of silicon, glass, ceramic containing a transparent electrically conductive material, polymer material, and metal, or a laminate of two or more types of materials selected from the group consisting of silicon, glass, ceramic containing a transparent electrically conductive material, polymer material, and metal.

[31] The embodiment of the method for forming an electrode of a solar cell according to [28] or [29], wherein the base material is either one of a solar cell element and a solar cell element having a transparent electrode.

[32] The embodiment of the method for forming an electrode of a solar cell according to [28] or [29], wherein the wet coating process is either one of spray coating, dispenser coating, spin coating, knife coating, slit coating, ink jet coating, screen printing, offset printing, and die coating.

[33] An embodiment of the electrode for a solar cell which is obtained by the electrode formation method according to any one of [28] to [32].

[34] An embodiment of the solar cell includes the electrode according to [33].

Moreover, embodiments of the present invention relating to the following [35] to [52] are described below.

[35] An embodiment of the dispersion of metal nanoparticles includes metal nanoparticles which are dispersed in a dispersion medium, wherein the metal nanoparticles are synthesized by adding and mixing a metal salt in which the proportion of silver to metal elements is 75% by mass or more, a carboxylic acid, a reducing agent, and an additive containing one type or two or more types of organic compounds selected from the group consisting of polyvinyl pyrrolidone, polyvinyl pyrrolidone copolymer, cellulose ether, polyvinyl alcohol, and polyacrylic acid, in a liquid phase, and stirring the resulting suspension at a temperature of 25 to 95° C., and the concentration of the additive contained in the dispersion is within a range from 0.5 to 5000 ppm.

In accordance with the embodiment as described in [35], the dispersion has superior dispersion stability, provided that the concentration of the additive contained in the dispersion is within the aforementioned range.

[36] The embodiment of the dispersion according to [35], wherein the dispersion medium contains 1% by mass or more of water and 2% by mass or more of alcohol.

[37] The embodiment of the dispersion according to [36], wherein the alcohol is one type or two or more types of alcohol selected from the group consisting of methanol, ethanol, propanol, butanol, ethylene glycol, propylene glycol, diethylene glycol, isobornyl hexanol, glycerol, and erythritol.

[38] An embodiment of the method for producing a dispersion of metal nanoparticles, includes: synthesizing metal nanoparticles by mixing a metal salt in which the proportion of silver to the metal elements is 75% by mass or more, a carboxylic acid, and a reducing agent in a liquid phase; and dispersing the synthesized metal nanoparticles in a dispersion medium, wherein the synthesizing of the metal nanoparticles is carried out by adding and mixing an additive containing one type or two or more types of organic compounds selected from the group consisting of polyvinyl pyrrolidone, polyvinyl pyrrolidone copolymer, cellulose ether, polyvinyl alcohol, and polyacrylic acid, together with the metal salt, the carboxylic acid, and the reducing agent in the liquid phase, and stirring the resulting suspension at a temperature of 25 to 95° C., and after the synthesizing of the metal nanoparticles, the concentration of the additive contained in the prepared dispersion is reduced to be within a range from 0.5 to 5000 ppm.

In accordance with the embodiment as described in [38], when synthesizing the metal nanoparticles, the shape and the particle diameter of the generating metal particles can be controlled over a wide range by adding and mixing the additive containing the above-listed types of organic compounds together with the metal salt, the carboxylic acid, and the reducing agent in the liquid phase, and stirring the resulting suspension at a temperature of 25 to 95° C. In addition, a dispersion having superior dispersion stability can be obtained by reducing the concentration of the additive contained in the prepared dispersion to be within a range from 0.5 to 5000 ppm after the synthesizing of the metal nanoparticles.

[39] The embodiment of the production method according to [38], wherein the carboxylic acid is one type or two or more types selected from the group consisting of glycolic acid, citric acid, malic acid, maleic acid, malonic acid, lactic acid, succinic acid, fumaric acid, tartaric acid, and salts thereof.

[40] The embodiment of the production method according to [38], wherein the reducing agent is one type or two or more types selected from the group consisting of hydrazine, sodium borohydride, ascorbic acid, oxalic acid, formic acid, salts thereof, glucose, and salts of Fe(II).

[41] The embodiment of the production method according to [38], wherein metal nanoparticles which has a composition, a mixed composition, or an alloy composition composed of one type or two or more types selected from the group consisting of gold, platinum, palladium, ruthenium, nickel, copper, tin, indium, zinc, iron, chromium, manganese, and molybdenum, are contained at a content within a range from 0.02% by mass or more to less than 25% by mass.

[42] The embodiment of the production method according to [38], wherein the metal nanoparticles are synthesized by adding and mixing the metal salt, the carboxylic acid, the reducing agent, and the additive in an oxygen-free atmosphere.

[43] The embodiment of the production method according to [38], wherein the dispersion medium contains 1% by mass or more of water and 2% by mass or more of alcohol.

[44] The embodiment of the production method according to [43], wherein the alcohol is one type or two or more types selected from the group consisting of methanol, ethanol, propanol, butanol, ethylene glycol, propylene glycol, diethylene glycol, isobornyl hexanol, glycerol, and erythritol.

[45] An embodiment of the dispersion of metal nanoparticles which is obtained by the production method according to any one of [38] to [44], wherein the concentration of the additive contained in the dispersion is within a range from 0.5 to 5000 ppm.

In accordance with the embodiment as described in [45], the dispersion has superior dispersion stability, provided that the concentration of the additive contained in the dispersion is within the aforementioned range.

[46] An embodiment of the method for forming an electrode for a solar cell, includes: preparing an electrode-forming composition by using the dispersion of metal nanoparticles according to any one of [35] to [37], a dispersion of metal nanoparticles obtained by the method according to any one of [38] to [44], or the dispersion of metal nanoparticles according to [45]; and coating the electrode-forming composition on a base material by a wet coating process.

[47] An embodiment of the method for forming an electrode of a solar cell, includes: preparing an electrode-forming composition by using the dispersion of metal nanoparticles according to any one of [35] to [37], a dispersion of metal nanoparticles obtained by the method according to any one of [38] to [44], or the dispersion of metal nanoparticles according to [45]; coating the electrode-forming composition on a base material by a wet coating process to form a film such that the thickness of the film after baking becomes within a range from 0.1 to 2.0 μm; and baking the base material having the film on the upper surface thereof at 130 to 400° C.

[48] The embodiment of the method for forming an electrode of a solar cell according to [46] or [47], wherein the base material is a substrate composed of either one of silicon, glass, ceramic containing a transparent electrically conductive material, polymer material, and metal, or a laminate of two or more types of materials selected from the group consisting of silicon, glass, ceramic containing a transparent electrically conductive material, polymer material, and metal.

[49] The embodiment of the method for forming an electrode of a solar cell according to [46] or [47], wherein the base material is either one of a solar cell element and a solar cell element having a transparent electrode.

[50] The embodiment of the method for forming an electrode of a solar cell according to [46] or [47], wherein the wet coating process is either one of spray coating, dispenser coating, spin coating, knife coating, slit coating, ink jet coating, screen printing, offset printing, and die coating.

[51] An embodiment of the electrode for a solar cell which is obtained by the electrode formation method according to any one of [46] to [50].

[52] An embodiment of the solar cell includes the electrode according to [51].

Moreover, embodiments of the present invention relating to the following [53] to [57] are described below.

[53] An embodiment of the method for synthesizing metal nanoparticles, as shown in FIGS. 3 and 4, includes: preparing an aqueous metal salt solution A by dissolving a metal salt; preparing an aqueous carboxylic acid solution B by dissolving one type or two or more types of compounds selected from the group consisting of glycolic acid, citric acid, malic acid, maleic acid, malonic acid, fumaric acid, succinic acid, tartaric acid, and salts thereof; preparing an aqueous reducing agent solution C; forming a mixed liquid by mixing the aqueous carboxylic acid solution B with either one of the aqueous metal salt solution A and the aqueous reducing agent solution C; and forming metal nanoparticles by adding and mixing the other one of the aqueous metal salt solution A and the aqueous reducing agent solution C with the mixed liquid, wherein metal elements contained in the metal salt include 75% by mass or more of silver, and the mixing with the aqueous reducing agent solution is carried out by stirring at a temperature of 25 to 95° C.

In accordance with the embodiment as described in [53], all raw materials other than raw material metal are composed of C, H, N, and O, and no corrosive substances are contained. Consequently, even though metal nanoparticles are produced from an insoluble metal salt, metal nanoparticles can be obtained that do not contain a corrosive material and are suitable for use as an electrically conductive material. Metal nanoparticles synthesized according to this method can be sintered at a low temperature, and in the case where the metal nanoparticles are silver nanoparticles, for example, the silver nanoparticles can be used to form, at a low temperature, an electrode having a volume resistivity on the order of $10^{-6}$ Ω·cm, or an electrically conductive reflective film having high reflectance characteristic of silver.

[54] The embodiment of the method for synthesizing metal nanoparticles according to [53], wherein one type or two or more types of metals selected from the group consisting of gold, platinum, palladium, and ruthenium are included as the remainder of the metal elements contained in the metal salt of the aqueous metal salt solution A other than silver.

In the method for synthesizing metal nanoparticles according to [54], the effect of controlling the reflectance and the volume resistivity is obtained as a result of synthesizing metal nanoparticles as a mixture of different metal nanoparticles, metal nanoparticles of an alloy, or metal nanoparticles having a so-called core-shell structure in which one of the elements forms a shell around a center portion formed of the other element.

[55] The embodiment of the method for synthesizing metal nanoparticles according to [53] or [54], wherein the reducing agent is one type or two or more types of compounds selected from the group consisting of hydrazine, ascorbic acid, oxalic acid, formic acid and, salts thereof.

[56] The embodiment of the method for synthesizing metal nanoparticles according to [53] or [54], wherein the reducing agent is one type or two or more types of compounds selected from the group consisting of sodium borohydride, potassium borohydride, and glucose.

[57] In the methods for synthesizing metal nanoparticles according to [55] and [56], examples of the carboxylic acid used in the embodiment include citric acid, malic acid, maleic acid, malonic acid, and the like. In the case in which a basic substance such as alkali metals including sodium, potassium, and the like, alkaline-earth metals, ammonia, and the like is used in order to adjust pH during the reaction, the carboxylic acid can be partially or completely neutralized. Moreover, the pH during the reaction can be set to the basic side by adding an excess amount of the basic substance.

[57] An embodiment of the method for producing a metal film, includes: obtaining a dispersion of metal nanoparticles by dispersing the metal nanoparticles which are obtained by the synthesis method according to any one of [53] to [56] in a dispersion medium; and forming a metal film by coating the dispersion of metal nanoparticles as a composition for producing a metal film on a base material by a wet coating process.

Moreover, embodiments of the present invention relating to the following [58] to [62] are described below.

[58] An embodiment of the method for synthesizing metal nanoparticles, as shown in FIG. 5, includes: preparing an aqueous metal salt solution A by dissolving a metal salt; preparing an aqueous carboxylic acid solution B by dissolving one type or two or more types of compounds selected from the group consisting of glycolic acid, citric acid, malic acid, maleic acid, malonic acid, fumaric acid, succinic acid, tartaric acid, and salts thereof; preparing an aqueous reducing agent solution C; preparing a basic aqueous solution D; forming a mixed liquid by dropping the aqueous carboxylic acid solution B into the aqueous metal salt solution A while stirring; forming a suspension of a carboxylic acid salt by dropping the basic aqueous solution D into the mixed liquid while stirring; and forming metal nanoparticles by dropping the aqueous reducing agent solution C into the suspension of a carboxylic acid salt, wherein metal elements contained in the metal salt include 75% by mass or more of silver, and the forming of the metal nanoparticles by dropping the aqueous reducing agent solution C while stirring is carried out by stirring at a temperature of 25 to 95° C.

In the method for synthesizing metal nanoparticles according to [58], as a result of dropping the aqueous carboxylic acid solution B into the aqueous metal salt solution A while stirring, metal ions form carboxylic acid complexes in the formed mixed liquid. Then, as a result of dropping the basic aqueous solution D into the mixed liquid while stirring, the solubility of the formed metal complexes decreases, and the majority of the metal complexes precipitate in the form of carboxylic acid salt. As a result of dropping the aqueous reducing agent solution C into the suspension of a carboxylic acid salt while stirring at a temperature of 25 to 95° C., the precipitated carboxylic acid salt is reduced; thereby, the technical effect of forming metal nanoparticles can be realized. In addition, all raw materials other than raw material metal are composed of C, H, N, and O, and no corrosive substances are contained. Consequently, even though metal nanoparticles are produced from an insoluble metal salt, metal nanoparticles can be obtained that do not contain a corrosive material and are suitable for use as an electrically conductive material. Metal nanoparticles synthesized according to this method can be sintered at a low temperature, and in the case where the metal nanoparticles are silver nanoparticles, for example, the silver nanoparticles can be used to form, at a low temperature, an electrode having a volume resistivity on the order of $10^{-6}$ Ω·cm, or an electrically conductive reflective film having high reflectance characteristic of silver.

[59] The embodiment of the method for synthesizing metal nanoparticles according to [58], wherein one type or two or more types of metals selected from the group consisting of gold, platinum, palladium, and ruthenium are included as the remainder of the metal elements contained in the metal salt of the aqueous metal salt solution A other than silver.

In the method for synthesizing metal nanoparticles according to [59], the effect of controlling the reflectance and the volume resistivity is obtained as a result of synthesizing metal nanoparticles as a mixture of different metal nanoparticles, metal nanoparticles of an alloy, or metal nanoparticles having a so-called core-shell structure in which one of the elements forms a shell around a center portion formed of the other element.

[60] The embodiment of the method for synthesizing metal nanoparticles according to [58] or [59], wherein the reducing agent is one type or two or more types of compounds selected from the group consisting of hydrazine, ascorbic acid, oxalic acid, formic acid, and salts thereof.

[61] The embodiment of the method for synthesizing metal nanoparticles according to [58] or [59], wherein the reducing agent is one type or two or more types of compounds selected from the group consisting of sodium borohydride, potassium borohydride, and glucose.

In accordance with the methods for synthesizing metal nanoparticles described in [60] and [61], by using the above types of compounds, the effects can be attained in which no corrosive substance is contained and the compound can be easily decomposed by baking even when the compound remains within the product of a dispersion.

[62] An embodiment of the method for producing a metal film, includes: obtaining a dispersion of metal nanoparticles by dispersing the metal nanoparticles which are obtained by the synthesis method according to any one of [58] to [61] in a dispersion medium; and forming a metal film by coating the dispersion of metal nanoparticles as a composition for producing a metal film on a base material by a wet coating process.

Moreover, embodiments of the present invention relating to the following [63] to [67] are described below.

[63] An embodiment of the method for synthesizing metal nanoparticles, as shown in FIG. 6, includes: preparing an aqueous metal salt solution A by dissolving a metal salt; preparing an aqueous carboxylic acid solution B by dissolving one type or two or more types of compounds selected from the group consisting of glycolic acid, citric acid, malic acid, maleic acid, malonic acid, fumaric acid, succinic acid, tartaric acid, and salts thereof; preparing an aqueous reducing agent solution C; preparing a basic aqueous solution D; forming a mixed liquid by dropping the basic aqueous solution D into the aqueous metal salt solution A while stirring; forming a suspension of a carboxylic acid salt by dropping the aqueous carboxylic acid solution B into the mixed liquid while stirring; and forming metal nanoparticles by dropping the aqueous reducing agent solution C into the suspension of a carboxylic acid salt while stirring, wherein metal elements contained in the metal salt include 75% by mass or more of silver, and the forming of the metal nanoparticles by dropping the aqueous reducing agent solution C while stirring is carried out by stirring at a temperature of 25 to 95° C.

In the method for synthesizing metal nanoparticles according to [63], as a result of dropping the basic aqueous solution D into the aqueous metal salt solution A while stirring, the mixed liquid is prepared of which the pH is adjusted so as to improve the yield of the carboxylic acid salt precipitated in the next step. Then, as a result of dropping the aqueous carboxylic acid solution B into the mixed liquid while stirring, the suspension of a carboxylic acid salt is formed in which the carboxylic acid salt is precipitated at high yield. As a result of dropping the aqueous reducing agent solution C into the suspension of a carboxylic acid salt while stirring at a temperature of 25 to 95° C., the precipitated carboxylic acid salt is reduced; thereby the technical effect of forming metal nanoparticles can be realized. In addition, all raw materials other than raw material metal are composed of C, H, N, and O, and no corrosive substances are contained. Consequently, even though metal nanoparticles are produced from an insoluble metal salt, metal nanoparticles can be obtained that do not contain a corrosive material and are suitable for use as an electrically conductive material. Metal nanoparticles synthesized according to this method can be sintered at a low temperature, and in the case where the metal nanoparticles are silver nanoparticles, for example, the silver nanoparticles can be used to form, at a low temperature, an electrode having a volume resistivity on the order of $10^{-6}$ $\Omega \cdot cm$, or an electrically conductive reflective film having high reflectance characteristic of silver.

[64] The embodiment of the method for synthesizing metal nanoparticles according to [63], wherein one type or two or more types of metals selected from the group consisting of gold, platinum, palladium, and ruthenium are included as the remainder of the metal elements contained in the metal salt of the aqueous metal salt solution A other than silver.

In the method for synthesizing metal nanoparticles according to [64], the effect of controlling the reflectance and the volume resistivity is obtained as a result of synthesizing metal nanoparticles as a mixture of different metal nanoparticles, metal nanoparticles of an alloy, or metal nanoparticles having a so-called core-shell structure in which one of the elements forms a shell around a center portion formed of the other element.

[65] The embodiment of the method for synthesizing metal nanoparticles according to [63] or [64], wherein the reducing agent is one type or two or more types of compounds selected from the group consisting of hydrazine, ascorbic acid, oxalic acid, formic acid, and salts thereof.

[66] The embodiment of the method for synthesizing metal nanoparticles according to [63] or [64], wherein the reducing agent is one type or two or more types of compounds selected from the group consisting of sodium borohydride, potassium borohydride, and glucose.

In accordance with the method for synthesizing metal nanoparticles described in [65] and [66], by using the above types of compounds, the effects can be attained in which no corrosive substance is contained and the compound can be easily decomposed by baking even when the compound remains within the product of a dispersion.

[67] An embodiment of the method for producing a metal film includes: obtaining a dispersion of metal nanoparticles by dispersing the metal nanoparticles which are obtained by the synthesis method according to any one of [63] to [66] in a dispersion medium; and forming a metal film by coating the dispersion of metal nanoparticles as a composition for producing a metal film on a base material by a wet coating process.

Moreover, embodiments of the present invention relating to the following [68] to [72] are described below.

[68] An embodiment of the method for synthesizing metal nanoparticles, as shown in FIG. 7, includes: preparing an aqueous metal salt solution A by dissolving a metal salt; preparing an aqueous carboxylic acid solution B by dissolving one type or two or more types of compounds selected from the group consisting of glycolic acid, citric acid, malic acid, maleic acid, malonic acid, fumaric acid, succinic acid, tartaric acid, and salts thereof; preparing an aqueous reducing agent solution C; preparing a basic aqueous solution D; forming a mixed liquid by dropping the aqueous metal salt solution A into the aqueous carboxylic acid solution B while stirring; forming a suspension of a carboxylic acid salt by dropping the basic aqueous solution D into the mixed liquid while stirring; and forming metal nanoparticles by dropping the aqueous reducing agent solution C into the suspension of a carboxylic acid salt while stirring, wherein metal elements contained in the metal salt include 75% by mass or more of silver, and the forming of the metal nanoparticles by dropping the aqueous reducing agent solution C while stirring is carried out by stirring at a temperature of 25 to 95° C.

In the method for synthesizing metal nanoparticles according to [68], as a result of dropping the aqueous metal salt solution A into the aqueous carboxylic acid solution B while stirring, metal ions form carboxylic acid complexes in the formed mixed liquid. Then, as a result of dropping the basic aqueous solution D into the mixed liquid while stirring, the solubility of the formed metal complexes decreases, and the majority of the metal complexes precipitate as a carboxylic acid salt. As a result of dropping the aqueous reducing agent solution C into the suspension of a carboxylic acid salt while stirring at a temperature of 25 to 95° C., the precipitated carboxylic acid salt is reduced; thereby, the technical effect of forming metal nanoparticles can be realized. In addition, all raw materials other than raw material metal are composed of C, H, N, and O, and no corrosive substances are contained. Consequently, even though metal nanoparticles are produced from an insoluble metal salt, metal nanoparticles can be obtained that do not contain a corrosive material and are suitable for use as an electrically conductive material. Metal nanoparticles synthesized according to this method can be sintered at a low temperature, and in the case where the metal nanoparticles are silver nanoparticles, for example, the silver nanoparticles can be used to form, at a low temperature, an electrode having a volume resistivity on the order of $10^{-6}$ $\Omega \cdot cm$, or an electrically conductive reflective film having high reflectance characteristic of silver.

[69] The embodiment of the method for synthesizing metal nanoparticles according to [68], wherein one type or two or more types of metals selected from the group consisting of gold, platinum, palladium, and ruthenium are included as the remainder of the metal elements contained in the metal salt of the aqueous metal salt solution A other than silver.

In the method for synthesizing metal nanoparticles according to [69], the effect of controlling the reflectance and the volume resistivity is obtained as a result of synthesizing metal nanoparticles as a mixture of different metal nanoparticles, metal nanoparticles of an alloy, or metal nanoparticles having a so-called core-shell structure in which one of the elements forms a shell around a center portion formed of the other element.

[70] The embodiment of the method for synthesizing metal nanoparticles according to [68] or [69], wherein the reducing agent is one type or two or more types of compounds selected from the group consisting of hydrazine, ascorbic acid, oxalic acid, formic acid, and salts thereof.

[71] The embodiment of the method for synthesizing metal nanoparticles according to [68] or [69], wherein the reducing agent is one type or two or more types of compounds selected from the group consisting of sodium borohydride, potassium borohydride, and glucose.

In accordance with the methods for synthesizing metal nanoparticles described in [70] and [71], by using the above types of compounds, the effects can be attained in which no corrosive substance is contained and the compound can be easily decomposed by baking even when the compound remains within the product of a dispersion.

[72] An embodiment of the method for producing a metal film includes: obtaining a dispersion of metal nanoparticles by dispersing the metal nanoparticles which are obtained by the synthesis method according to any one of [68] to [71] in a dispersion medium; and forming a metal film by coating the dispersion of metal nanoparticles as a composition for producing a metal film on a base material by a wet coating process.

Moreover, embodiments of the present invention relating to the following [73] to [77] are described below.

[73] An embodiment of the method for synthesizing metal nanoparticles, as shown in FIG. 8, includes: preparing an aqueous metal salt solution A by dissolving a metal salt; preparing an aqueous carboxylic acid solution B by dissolving one type or two or more types of compounds selected from the group consisting of glycolic acid, citric acid, malic acid, maleic acid, malonic acid, fumaric acid, succinic acid, tartaric acid, and salts thereof; preparing an aqueous reducing agent solution C; preparing a basic aqueous solution D; forming a mixed liquid by dropping the aqueous metal salt solution A into the basic aqueous solution D while stirring; forming a suspension of a carboxylic acid salt by dropping the aqueous carboxylic acid solution B into the mixed liquid while stirring; and forming metal nanoparticles by dropping the aqueous reducing agent solution C into the suspension of a carboxylic acid salt, wherein metal elements contained in the metal salt include 75% by mass or more of silver, and the forming of the metal nanoparticles by dropping the aqueous reducing agent solution C while stirring is carried out by stirring at a temperature of 25 to 95° C.

In the method for synthesizing metal nanoparticles according to [73], as a result of dropping the aqueous metal salt solution A into the basic aqueous solution D while stirring, the mixed liquid is prepared of which the pH is adjusted so as to improve the yield of the carboxylic acid salt precipitated in the next step. Then, as a result of dropping the aqueous carboxylic acid solution B into the mixed liquid while stirring, the suspension of a carboxylic acid salt is formed in which the carboxylic acid salt is precipitated at high yield. As a result of dropping the aqueous reducing agent solution C into the suspension of a carboxylic acid salt while stirring at a temperature of 25 to 95° C., the precipitated carboxylic acid salt is reduced; thereby, the technical effect of forming metal nanoparticles can be realized. In addition, all raw materials other than raw material metal are composed of C, H, N, and O, and no corrosive substances are contained. Consequently, even though metal nanoparticles are produced from an insoluble metal salt, metal nanoparticles can be obtained that do not contain a corrosive material and are suitable for use as an electrically conductive material. Metal nanoparticles synthesized according to this method can be sintered at a low temperature, and in the case where the metal nanoparticles are silver nanoparticles, for example, the silver nanoparticles can be used to form, at a low temperature, an electrode having a volume resistivity on the order of $10^{-6}$ $\Omega \cdot$cm, or an electrically conductive reflective film having high reflectance characteristic of silver.

[74] The embodiment according to [73], wherein one type or two or more types of metals selected from the group consisting of gold, platinum, palladium, and ruthenium are included as the remainder of the metal elements contained in the metal salt of the aqueous metal salt solution A other than silver.

In the method for synthesizing metal nanoparticles according to [74], the effect of controlling the reflectance and the volume resistivity is obtained as a result of synthesizing metal nanoparticles as a mixture of different metal nanoparticles, metal nanoparticles of an alloy, or metal nanoparticles having a so-called core-shell structure in which one of the elements forms a shell around a center portion formed of the other element.

[75] The embodiment of the method for synthesizing metal nanoparticles according to [73] or [74], wherein the reducing agent is one type or two or more types of compounds selected from the group consisting of hydrazine, ascorbic acid, oxalic acid, formic acid, and salts thereof.

[76] The embodiment of the method for synthesizing metal nanoparticles according to [73] or [74], wherein the reducing agent is one type or two or more types of compounds selected from the group consisting of sodium borohydride, potassium borohydride, and glucose.

In accordance with the methods for synthesizing metal nanoparticles described in [75] and [76], by using the above types of compounds, the effects can be attained in which no corrosive substance is contained and the compound can be easily decomposed by baking even when the compound remains within the product of a dispersion.

[77] A method for producing a metal film, includes: obtaining a dispersion of metal nanoparticles by dispersing the metal nanoparticles which are obtained by the synthesis method according to any one of [73] to [76] in a dispersion medium; and forming a metal film by coating the dispersion of metal nanoparticles as a composition for producing a metal film on a base material by a wet coating process.

The embodiment of the method for producing a dispersion of metal nanoparticles according to any one of [4] to [9] is a modification of a method for producing a dispersion of metal nanoparticles that includes: synthesizing metal nanoparticles by mixing a metal salt in which the proportion of silver to metal elements is 75% by mass or more, a carboxylic acid, and a reducing agent in a liquid phase; and dispersing the synthesized metal nanoparticles in a dispersion medium. The embodiment is characterized in that the synthesizing of the metal nanoparticles is carried out by adding and mixing an additive in the form of a salt of one type or two or more types of metal elements selected from the group consisting of sodium, magnesium, potassium, calcium, aluminum, chromium, manganese, iron, cobalt, nickel, copper, zinc, zirconium, molybdenum, indium, tin, barium, lead, bismuth, and cerium, which differ from the metal elements that compose the metal salt and which are not reduced by the reducing agent, together with the metal salt, the carboxylic acid, and the reducing agent in a liquid phase, and stirring the resulting suspension at a temperature of 25 to 95° C. The embodiment is also characterized in that after the synthesizing of the metal nanoparticles, the concentration of the additive contained in the prepared dispersion is reduced to be within a range from 0.01 to 100 ppm.

The shape and the particle diameter of the generating metal particles can be controlled over a wide range by adding and mixing the additive in the form of the salt of the aforementioned types of metal elements together with the metal salt, the carboxylic acid, and the reducing agent in the liquid phase, and then stirring the resulting suspension at a temperature of 25 to 95° C. when synthesizing the metal nanoparticles. In addition, a dispersion having superior dispersion stability can be obtained by reducing the concentration of the additive contained in the prepared dispersion to be within a range from 0.01 to 100 ppm after the synthesizing of the metal nanoparticles.

The embodiment of the method for producing a dispersion of metal nanoparticles according to any one of [21] to [26] is a modification of a method for producing a dispersion of metal nanoparticles that includes: synthesizing metal nanoparticles by mixing a metal salt in which the proportion of silver to metal elements is 75% by mass or more, a carboxylic acid, and a reducing agent in a liquid phase; and dispersing the synthesized metal nanoparticles in a dispersion medium. The embodiment is characterized in that in that the synthesizing of the metal nanoparticles is carried out by adding and mixing an additive containing one type or two or more types of anions selected from the group consisting of chlorine ions, sulfate ions, iodine ions, bromine ions, borate ions, and phosphate ions, together with the metal salt, the carboxylic acid, and the reducing agent in a liquid phase, and stirring the resulting suspension at a temperature of 25 to 95° C. The embodiment is also characterized in that the concentration of the additive contained in the prepared dispersion is reduced to be within a range from 0.01 to 100 ppm after synthesizing the metal nanoparticles. The shape and particle diameter of the generating metal particles can be controlled over a wide range by adding and mixing the additive containing the aforementioned types of anions together with the metal salt, the carboxylic acid, and the reducing agent in the liquid phase, and then stirring the resulting suspension at a temperature of 25 to 95° C. when synthesizing the metal nanoparticles. In addition, a dispersion having superior dispersion stability can be obtained by reducing the concentration of the additive contained in the prepared dispersion to be within a range from 0.01 to 100 ppm after the synthesizing of the metal nanoparticles.

The embodiment of the method for producing a dispersion of metal nanoparticles according to any one of [38] to [44] is a modification of a method for producing a dispersion of metal nanoparticles that includes: synthesizing metal nanoparticles by mixing a metal salt in which the proportion of silver to metal elements is 75% by mass or more, a carboxylic acid, and a reducing agent in a liquid phase; and dispersing the synthesized metal nanoparticles in a dispersion medium. The embodiment is characterized in that the synthesizing of the metal nanoparticles is carried out by adding and mixing an additive containing one type or two or more types of organic compounds selected from the group consisting of polyvinyl pyrrolidone, polyvinyl pyrrolidone copolymer, cellulose ether, polyvinyl alcohol, and polyacrylic acid together with the metal salt, the carboxylic acid, and the reducing agent in a liquid phase, and stirring the resulting suspension at a temperature of 25 to 95° C. The embodiment is also characterized in that after the synthesizing of the metal nanoparticles, the concentration of the additive contained in the prepared dispersion is reduced to be within a range from 0.5 to 5000 ppm. The shape and the particle diameter of the generating metal particles can be controlled over a wide range by mixing and adding the additive containing the aforementioned types of organic compounds together with the metal salt, the carboxylic acid, and the reducing agent in the liquid phase, and then stirring the resulting suspension at a temperature of 25 to 95° C. when synthesizing the metal nanoparticles. In addition, a dispersion having superior dispersion stability can be obtained by reducing the concentration of the additive contained in the prepared dispersion to be within a range from 0.5 to 5000 ppm after the synthesizing of the metal nanoparticles.

The embodiment of the method for synthesizing metal nanoparticles according to any one of [53] to [56] includes: forming a mixed liquid by mixing an aqueous carboxylic acid solution with either one of an aqueous metal salt solution and an aqueous reducing agent solution; and adding and mixing the other one of the aqueous metal salt solution and the aqueous reducing agent solution with the mixed liquid. Therefore, all raw materials other than raw material metal are composed of C, H, N, and O, and no corrosive substances are contained. Consequently, even though metal nanoparticles are produced from an insoluble metal salt, metal nanoparticles can be obtained that do not contain a corrosive material and are suitable for use as an electrically conductive material.

In the embodiment of the method for synthesizing metal nanoparticles according to any one of [53] to [61], as a result of dropping an aqueous carboxylic acid solution B into an aqueous metal salt solution A while stirring, metal ions form carboxylic acid complexes in a formed mixed liquid. Then, as a result of dropping a basic aqueous solution D into the mixed liquid while stirring, the solubility of the formed metal complexes decreases, and the majority of the metal complexes precipitate as a carboxylic acid salt. As a result of dropping an aqueous reducing agent solution C into a suspension of a carboxylic acid salt while stirring at a temperature of 25 to 95° C., the precipitated carboxylic acid salt is reduced; thereby, the technical effect of forming metal nanoparticles can be realized. In addition, all raw materials other than raw material metal are composed of C, H, N, and O, and no corrosive substances are contained. Consequently, even though metal nanoparticles are produced from an insoluble metal salt, metal nanoparticles can be obtained that do not contain a corrosive material and are suitable for use as an electrically conductive material.

In the embodiment of the method for synthesizing metal nanoparticles according to any one of [63] to [66], as a result of dropping a basic aqueous solution D into an aqueous metal salt solution A while stirring, a mixed liquid is prepared of which the pH is adjusted so as to improve the yield of a carboxylic acid salt precipitated in the next step. Then, as a result of dropping an aqueous carboxylic acid solution B into the mixed liquid while stirring, a suspension of a carboxylic acid salt is formed in which the carboxylic acid salt is precipitated at high yield. As a result of dropping an aqueous reducing agent solution C into the suspension of a carboxylic acid salt while stirring at a temperature of 25 to 95° C., the precipitated carboxylic acid salt is reduced; thereby the technical effect of forming metal nanoparticles can be realized. In addition, all raw materials other than raw material metal are composed of C, H, N, and O, and no corrosive substances are contained. Consequently, even though metal nanoparticles are produced from an insoluble metal salt, metal nanoparticles can be obtained that do not contain a corrosive material and are suitable for use as an electrically conductive material.

In the embodiment of the method for synthesizing metal nanoparticles according to any one of [53] and remains, as a result of dropping an aqueous metal salt solution A into an aqueous carboxylic acid solution B while stirring, metal ions form carboxylic acid complexes in a formed mixed liquid. Then, as a result of dropping a basic aqueous solution D into the mixed liquid while stirring, the solubility of the formed metal complexes decreases, and the majority of the metal complexes precipitate as a carboxylic acid salt. As a result of dropping an aqueous reducing agent solution C into a suspension of a carboxylic acid salt while stirring at a temperature of 25 to 95° C., the precipitated carboxylic acid salt is reduced; thereby, the technical effect of forming metal nanoparticles can be realized. In addition, all raw materials other than raw material metal are composed of C, H, N, and O, and no corrosive substances are contained. Consequently, even though metal nanoparticles are produced from an insoluble metal salt, metal nanoparticles can be obtained that do not contain a corrosive material and are suitable for use as an electrically conductive material.

DETAILED DESCRIPTION OF THE INVENTION

The following provides an explanation of preferred embodiments of the present invention with reference to the drawings.

(Explanation of Embodiments According to [1] to [17])

The present embodiment of the method for producing a dispersion of metal nanoparticles includes: synthesizing metal nanoparticles by mixing in a liquid phase a metal salt in which the proportion of silver to metal elements is 75% by mass or more, a carboxylic acid, and a reducing agent; and dispersing the synthesized metal nanoparticles in a dispersion medium. The present embodiment is characterized in that the synthesizing of the metal nanoparticles is carried out by adding and mixing an additive in the form of a salt of one type or two or more types of metal elements selected from the group consisting of sodium, magnesium, potassium, calcium, aluminum, chromium, manganese, iron, cobalt, nickel, copper, zinc, zirconium, molybdenum, indium, tin, barium, lead, bismuth, and cerium, which differ from the metal elements that compose the metal salt and which are not reduced by the reducing agent, together with the metal salt, the carboxylic acid, and the reducing agent in the liquid phase, and stirring the resulting suspension at a temperature of 25 to 95° C. The present embodiment is also characterized in that the concentration of the additive contained in the prepared dispersion is reduced to be within a range from 0.01 to 100 ppm after the synthesizing of the metal nanoparticles.

Figure 1:
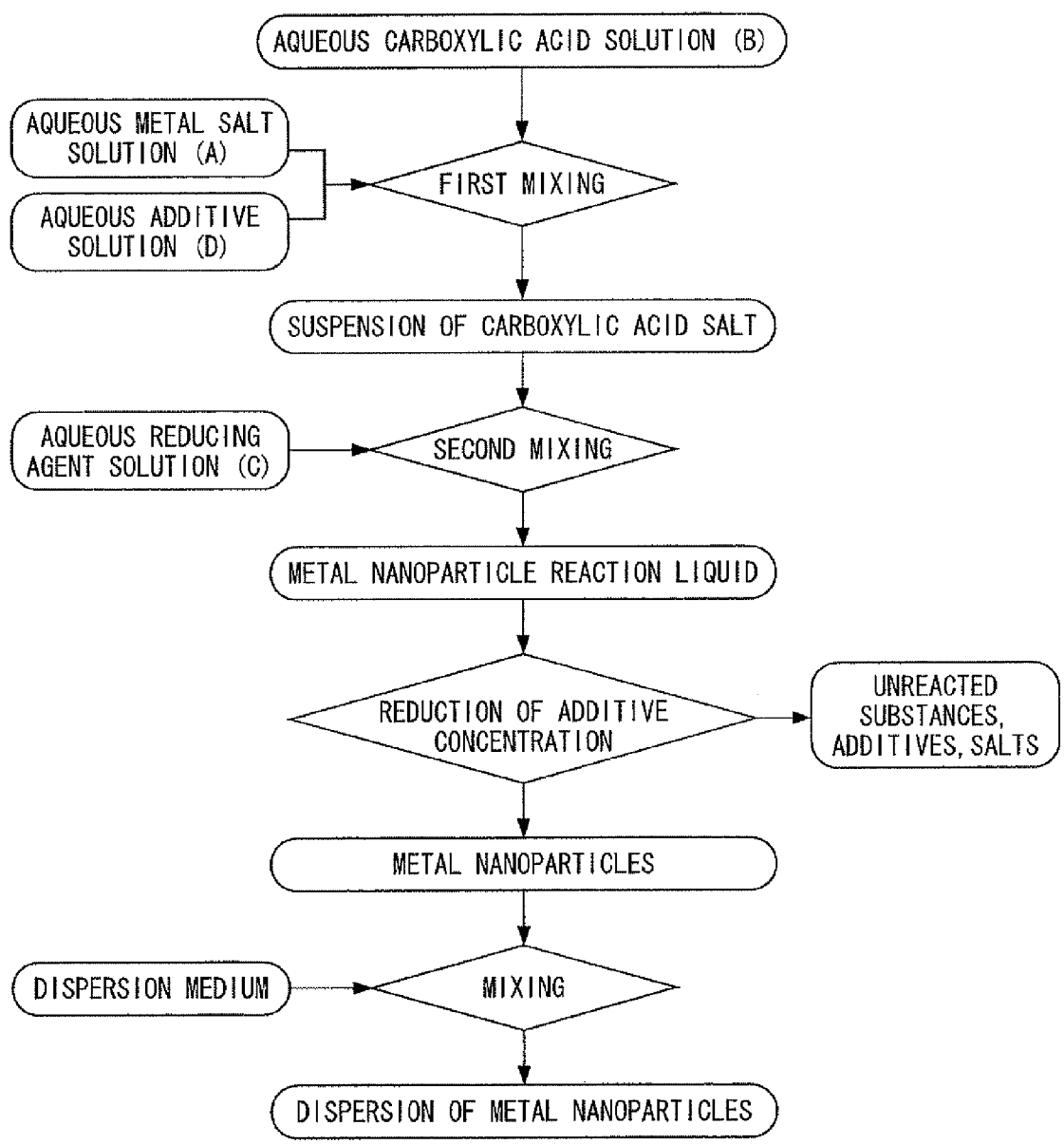
FIG. 1 is a drawing showing the flow of a production method according to one embodiment of the present invention.
Figure 2:
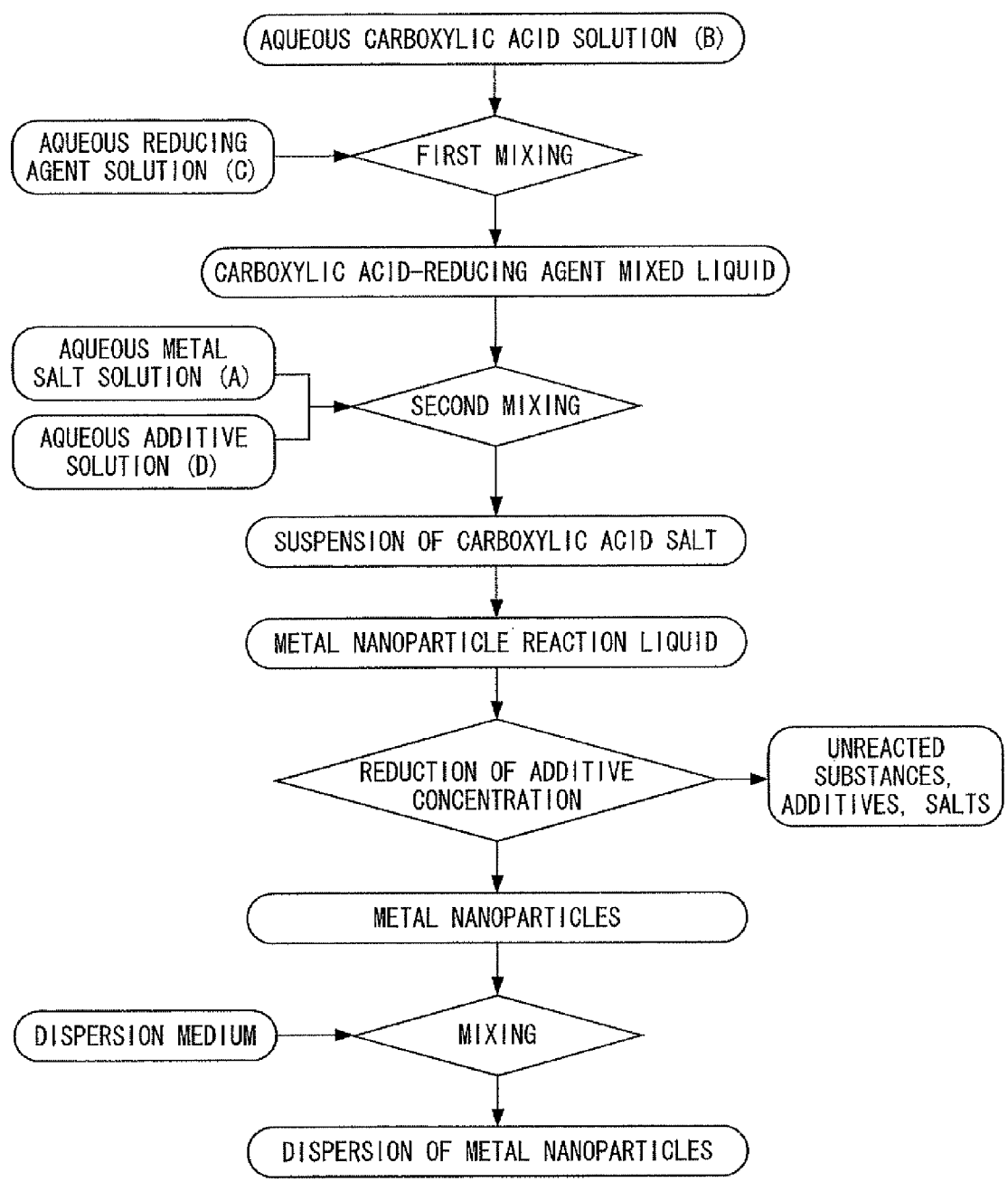
FIG. 2 is a drawing showing the flow of a production method according to other embodiment of the present invention.

As shown in FIGS. 1 and 2, in the method for synthesizing metal nanoparticles, an aqueous metal salt solution A, an aqueous carboxylic acid solution B, an aqueous reducing agent solution C, and an aqueous additive solution D are respectively prepared.

<Aqueous Metal Salt Solution A Preparation Step>

Preparation of the aqueous metal salt solution A is carried out by dissolving a metal salt in water which is a solvent. It is preferable to dissolve the metal salt in deionized water to prepare a saturated aqueous solution at room temperature. Here, the metal salt to be dissolved contains at least silver salt. The aqueous metal salt solution A is prepared such that when the total amount of all metal elements contained in the metal salt is taken to be 100%, the silver accounts for 75% by mass or more. Here, the reason for limiting the proportion of silver to the metal elements contained in the metal salt to the range of 75% by mass or more is that, if the proportion of silver is less than 75% by mass, the reflectance of an electrode of a solar cell ends up decreasing in the case where the electrode of a solar cell is formed by using a produced dispersion of nanoparticles as an electrode-forming composition. The proportion of silver to the metal elements may be 100% by mass; however, in the case where the metal salt contains a salt of metal other than silver salt, residual metal elements in the metal salt other than silver preferably include one type or two or more types of metals selected from the group consisting of gold, platinum, palladium, and ruthenium. Metal nanoparticles other than silver nanoparticles contained in the synthesized metal nanoparticles are metal nanoparticles which has a composition, a mixed composition, or an alloy composition composed of one type or two or more types of metals selected from the group consisting of gold, platinum, palladium and ruthenium, and these metal nanoparticles other than silver nanoparticles are contained at a content within a range from 0.02% or more to less than 25% by mass, and preferably within a range from 0.03% to 20% by mass, based on a value of 100% by mass for all metal nanoparticles. Here, the reason for setting the content of the metal nanoparticles other than silver nanoparticles to be within a range from 0.02% by mass or more to less than 25% by mass based on a value of 100% by mass for all metal nanoparticles is that, although there is no particular problem with the content being less than 0.02% by mass, if the content is within a range from 0.02% or more to less than 25% by mass, the effect is attained that the electrical conductivity and the reflectance of an electrode after weather resistance testing (testing involving holding for 1000 hours in a constant temperature and humidity chamber at a temperature of 100° C. and a humidity of 50%) are not deteriorated as compared with those prior to the weather resistance testing, while if the content is 25% by mass or more, the electrical conductivity and the reflectance of an electrode immediately after baking decreases, and furthermore the electrical conductivity and the reflectance of the electrode after weather resistance testing are deteriorated as compared with those prior to weather resistance testing. As a result, the effect of controlling the reflectance and the volume resistivity is obtained as a result of synthesizing metal nanoparticles as a mixture of different metal nanoparticles, metal nanoparticles of an alloy, or metal nanoparticles having a so-called core-shell structure in which one of the elements forms a shell around a center portion formed of the other element.

<Aqueous Carboxylic Acid Solution B Preparation Step>

Preparation of the aqueous carboxylic acid solution B is carried out by dissolving a carboxylic acid in water which is a solvent. It is preferable to dissolve the carboxylic acid in deionized water to prepare a saturated aqueous solution at room temperature. Here, the carboxylic acid to be dissolved is one type or two or more types of compounds selected from the group consisting of glycolic acid, citric acid, malic acid, maleic acid, malonic acid, fumaric acid, succinic acid, tartaric acid, and salts thereof These carboxylic acids are preferable because they favorably function as protective materials that modify the surface of the metal nanoparticles, and furthermore, they do not contain corrosive substances such as thiols and the like. The aforementioned carboxylic acids can be partially or completely neutralized using a basic substance such as an alkali metal such as sodium, alkaline earth metal such as potassium or ammonia in order to adjust pH at the time of reaction. Moreover, the pH during the reaction can also be set to the basic side by adding an excess of basic substance.

<Aqueous Reducing Agent Solution C Preparation Step>

Preparation of the aqueous reducing agent solution C is carried out by dissolving a reducing agent in water which is a solvent. It is preferable to dissolve the reducing agent in deionized water to prepare a saturated aqueous solution at room temperature. Here, the reducing agent to be dissolved is one type or two or more types of compounds selected from the group consisting of hydrazine, sodium borohydride, ascorbic acid, oxalic acid, formic acid, salts thereof, and salts of Fe(II). An example of the salt of Fe(II) is ferrous sulfate. As a result, the effects can be attained in which no corrosive substance is contained and the compound can be easily decomposed by baking even when the compound remains within the product of a dispersion.

<Aqueous Additive Solution D Preparation Step>

Preparation of the aqueous additive solution is carried out by dissolving an additive in water which is a solvent. It is preferable to dissolve the additive in deionized water to prepare a saturated aqueous solution at room temperature. It is necessary to select an element for use as the additive to be used that is not reduced by the reducing agent used for the synthesizing of the nanoparticles. In addition, a salt of a metal element that differs from metal elements composing the aforementioned metal salt is used. The additive to be dissolved is a compound in the form of a salt of one type or two or more types of metal elements selected from the group consisting of sodium, magnesium, potassium, calcium, aluminum, chromium, manganese, iron, cobalt, nickel, copper, zinc, zirconium, molybdenum, indium, tin, barium, lead, bismuth, and cerium, which differ from the metal elements that compose the metal salt and which are not reduced by the aforementioned reducing agent. When synthesizing the metal nanoparticles, the shape and the particle diameter of the generating metal particles can be controlled by adding and mixing metal ions as the additive which are different from the metal ions to be reduced, together with the metal salt, the carboxylic acid, and the reducing agent. In addition, the additive used in the present embodiment may also function as an auxiliary reducing agent. The aforementioned salts of metals that compose the additive used for this synthesis are thought to function as so-called habit modifiers. One of the functions thereof is to adhere to a specific surface of crystal seeds growing in a supersaturated solution; thereby, the effects are attained in which the growth of that surface is inhibited to affect the shape of the precipitated crystals, and the growth of the crystal seeds is suppressed to control the particle diameter.

Examples of the methods used in the synthesizing of the metal nanoparticles in the present embodiment include the following methods, but are not limited thereto. The first method is a so-called Carey-Lea sol method in which an aqueous silver nitrate solution is added to an aqueous solution of a ferrous salt and a citric acid salt. The second method involves the reduction of a carboxylic acid suspension with a reducing agent. In this embodiment, an explanation of the second method is provided in which a carboxylic acid suspension is reduced by a reducing agent.

In the method for synthesizing metal nanoparticles in the present embodiment, the aqueous metal salt solution A, the aqueous carboxylic acid solution B, and the aqueous reducing agent solution C which are obtained in the aforementioned steps are mixed; however, the order in which they are mixed is such that the aqueous carboxylic acid solution B is first mixed with either one of the aqueous metal salt solution A and the aqueous reducing agent solution C to form a mixed liquid, and then the other one of the aqueous metal salt solution A and the aqueous reducing agent C is added to the resulting mixed liquid and is further mixed therewith. The following provides an explanation of the case of first mixing the aqueous carboxylic acid solution B with the aqueous metal salt solution A with reference to FIG. 1.

<First Mixing Step>

The aqueous carboxylic acid solution B is first mixed with the aqueous metal salt solution A and the aqueous additive solution D. The mixing ratio is preferably such that the amount of carboxylic acid contained in the aqueous carboxylic acid solution B is within a range from 0.3 to 3.0 mol relative to 1 mol of the metal element contained in the aqueous metal salt solution A. In addition, the amount of the metal element contained in the aqueous additive solution D is preferably within a range from 0.01 to 0.05 mol relative to 1 mol of the metal element contained in the aqueous metal salt solution A. In addition, the mixing is preferably carried out within a temperature range of 25 to 70° C. at atmospheric pressure. When the aqueous carboxylic acid solution is mixed with the aqueous metal salt solution and the aqueous additive solution, poorly-soluble carboxylic acid salt precipitates and a suspension of a carboxylic acid salt is obtained. Accordingly, the mixing of the aqueous carboxylic acid solution B with the aqueous metal salt solution A and the aqueous additive solution D is preferably carried out for an amount of time sufficient to obtain that suspension adequately. Furthermore, with regard to the case of using a carboxylic acid salt for the carboxylic acid, for example, the result obtained in the case of using sodium carbonate is as same as that obtained in the case of adding an aqueous sodium hydroxide solution after adding the aqueous carboxylic acid solution.

<Second Mixing Step>

After obtaining the suspension in which the carboxylic acid salt precipitates, the aqueous reducing agent solution C is added to that suspension in the form of a mixed liquid and then is further mixed therewith. The mixing ratio is preferably such that the amount of reducing agent contained in the aqueous reducing agent solution C is within a range from 0.2 to 3.0 mol relative to 1 mol of the metal element serving as the raw material of the suspension. In addition, the mixing is carried out within a temperature range of 25 to 95° C. at atmospheric pressure. When mixed at a temperature within this range, the mean particle diameter of the formed particles can be made to be 100 nm or less, and when a film is formed by using the resulting dispersion of metal nanoparticles as an electrode-forming composition, low volume resistivity can be achieved at low temperatures. As a result of mixing the aqueous reducing agent solution into the suspension and stirring within a prescribed temperature range in this manner, the metal salt is reduced and metal nanoparticles can be synthesized.

In the method for synthesizing metal nanoparticles of the present embodiment which includes these steps, metal nanoparticles can be produced from an insoluble metal salt. In the present embodiment, all of the raw materials are composed of C, H, N, and O, with the exception of the raw material metal, sodium, calcium, and the like which are used to cause the carboxylic acid and the like to form a salt, and boron contained in the case of using sodium borohydride and the like for the reducing agent, and corrosive substances are not contained. Consequently, metal nanoparticles can be obtained that are suitable for use as electrically conductive materials without containing a corrosive substance. In addition, the metal nanoparticles synthesized according to the method of the present embodiment can be sintered at low temperatures. For example, in the case of silver nanoparticles, an electrode having a volume resistivity on the order of $10^{-6}$ Ω·cm or an electrically conductive reflective film having high reflectance characteristic of silver can be formed at low temperatures. In addition, the reflectance and the electrical conductivity of an electrically conductive reflective film formed in this manner can be controlled depending on the purpose of use by controlling the particle size distribution and the shape of the metal nanoparticles to be coated.

Here, in the aforementioned embodiment, the case is explained in which the aqueous carboxylic acid solution B is first mixed with the aqueous metal salt solution A and the aqueous additive solution D; however, as shown in FIG. 2, the aqueous carboxylic acid solution B may first be mixed with the aqueous reducing agent solution C to form a mixed liquid of the carboxylic acid and the reducing agent, and then the aqueous salt solution A and the aqueous additive solution D may be added to the resulting mixed liquid and further mixed therewith. In this case, the reduction reaction proceeds simultaneously with the precipitation of poorly-soluble salt at the stage where the aqueous metal salt solution A and the aqueous additive solution D are added to the mixed aqueous solution of the carboxylic acid and the reducing agent, and ultimately a dispersion of metal nanoparticles can be obtained. In this case as well, all of the raw materials consist of C, H, N, and O with the exception of the raw material metal, and boron and the like that causes the carboxylic acid to form a salt, and corrosive substances are not contained. Consequently, metal nanoparticles can be obtained that are suitable for use as an electrically conductive material without containing a corrosive substance.

In the aforementioned embodiment, the case is explained in which each of the aqueous carboxylic acid solution B and the aqueous metal salt solution A is first prepared, and then they are mixed together; however, in the process of forming a mixed liquid by mixing the aqueous carboxylic acid solution B and the aqueous metal salt solution A, the case may also be included where the solute of the aqueous carboxylic acid solution B is preliminarily mixed with the solute of the aqueous metal salt A, and then the mixed solutes are dissolved by adding water thereto. Similarly, as shown in FIG. 2, in the process of first forming a mixed liquid of the carboxylic acid and the reducing agent by preliminarily mixing the aqueous carboxylic acid solution B and the aqueous reducing agent solution C, the case may also be included where the solute of the aqueous carboxylic acid solution B is preliminarily mixed with the solute of the aqueous reducing agent solution C, and then the mixed solutes are dissolved by adding water thereto.

As a result of going through the aforementioned steps, metal nanoparticles can be synthesized of which the shape and the particle diameter are controlled over a wide range.

<Additive Concentration Reduction Step>

By using various separation techniques, the concentration of the additive is reduced in the reaction liquid containing the metal nanoparticles after the reduction, and excess salts are removed from the reaction liquid. As a result, the dispersion stability can be increased. The concentration of the additive contained in the prepared dispersion is reduced to be within a range from 0.01 to 100 ppm. This is because if the concentration of the additive contained in the dispersion is 100 ppm or less, the dispersion stability of the resulting dispersion of metal nanoparticles is maintained for a fixed period of time. The reason for limiting the concentration of the additive in the dispersion to the aforementioned range is that, superior dispersion stability is maintained even when the proportion of the contained additive is less than the lower limit of the aforementioned range, it is not preferable to remove the additive from the dispersion until the concentration becomes less than 0.01 ppm from the viewpoint of cost. In addition, if the proportion of the contained additive exceeds the upper limit of the aforementioned range, the metal nanoparticles end up easily forming precipitates due to the coagulation action thereof. Examples of the methods for reducing the additive concentration or separating the excess salts include a centrifugal separation, an ultrafiltration, and the use of an ion exchange membrane or an ion exchange resin. The volume resistivity of an electrode obtained by coating and baking these metal nanoparticles generally demonstrates a tendency to be closer to that of a bulk metal, the more the amount of the excess salts are removed.

<Dispersion Step>

Next, the synthesized metal nanoparticles are added to a dispersion medium and are further mixed therewith; thereby, the particles are dispersed in the dispersion medium to prepare a dispersion of metal nanoparticles. The dispersion is prepared so that the content of metal nanoparticles including silver nanoparticles in the dispersion is within a range from 2.5 to 95.0% by mass and preferably within a range from 3.5 to 90.0% by mass based on a value of 100% by mass for the composition composed of the metal nanoparticles and the dispersion medium. The dispersion medium contains water at a content of 1% by mass or more and preferably 2% by mass or more and alcohol at a content of 2% by mass or more and preferably 3% by mass or more based on a value of 100% by mass for the total dispersion medium. For example, in the case where the dispersion medium is composed only of water and alcohol, when the dispersion medium contains 2% by mass of water, it contains 98% by mass of alcohol, and when the dispersion medium contains 2% by mass of alcohol, it contains 98% by mass of water. Here, the reason for limiting the content of metal nanoparticles including silver nanoparticles to within a range from 2.5 to 95.0% by mass based on a value of 100% by mass for the composition composed of the metal nanoparticles and the dispersion medium is that, if the content is less than 2.5% by mass, there are no particular effects on electrode properties after baking; however, it becomes difficult to obtain an electrode of a required thickness, while if the content exceeds 95.0% by mass, the required fluidity for use as an ink or a paste during wet coating of the composition ends up being lost. In addition, the reason for limiting the content of water to 1% by mass or more based on a value of 100% by mass for the total dispersion medium is that, if the water content is less than 1% by mass, it becomes difficult to sinter at low temperatures a film obtained by coating the composition by wet coating, and the electrical conductivity and the reflectance of the electrode end up decreasing after baking. The reason for limiting the content of alcohol to 2% by mass or more based on a value of 100% for the total dispersion medium is that, if the content of alcohol is less than 2% by mass, it also becomes difficult to sinter at low temperatures a film obtained by coating the composition by wet coating in the same manner as described above, and the electrical conductivity and the reflectance of the electrode end up decreasing after baking.

In addition, the aforementioned alcohol is preferably one type or two or more types selected from the group consisting of methanol, ethanol, propanol, butanol, ethylene glycol, propylene glycol, diethylene glycol, glycerol, isobornyl alcohol, and erythritol.

As a result of going through the aforementioned steps, a dispersion can be obtained in which metal nanoparticles are dispersed, and the shape and the particle diameter of the metal nanoparticles are controlled over a wide range.

The dispersion of metal nanoparticles of the present embodiment is a dispersion of metal nanoparticles obtained by the production method of the present embodiment as previously described, and is characterized in that the additive are contained in the dispersion at a concentration within a range from 0.01 to 100 ppm. If the additive is contained in the dispersion at a concentration of 100 ppm or less, the dispersion stability is maintained for a fixed period of time. The reason for defining the concentration of the additive in the dispersion to be within the aforementioned range is that, superior dispersion stability is maintained even when the proportion of the contained additive is less than the lower limit of the aforementioned range, it is not preferable to remove the additive from the dispersion until the concentration becomes less than 0.01 ppm from the viewpoint of cost. In addition, if the proportion of the contained additive exceeds the upper limit of the aforementioned range, the metal nanoparticles end up easily forming precipitates due to the coagulation action thereof.

The following provides an explanation of a method for forming an electrode using a dispersion of metal nanoparticles produced in this manner.

First, the aforementioned dispersion of metal nanoparticles is used as a solar cell electrode-forming composition and is coated on a base material by a wet coating process. The coating by this wet coating process involves forming a film such that the thickness of the film after baking will become within a range from 0.1 to 2.0 μm and preferably within a range from 0.3 to 1.5 μm. The aforementioned base material can be a substrate composed of either one of silicon, glass, ceramics containing a transparent electrically conductive material, polymer material, and metal, or can be a laminate of two or more types of materials selected from the group consisting of silicon, glass, ceramics containing a transparent electrically conductive material, polymer material, and metal. In addition, the base material is preferably either one of a solar cell element and a solar cell element having a transparent electrode. Examples of the transparent electrodes include indium tin oxide (ITO), antimony tin oxide (ATO), tin oxide ($SnO_2$: NESA), indium zinc oxide (IZO), and aluminum-doped zinc oxide (AZO). The aforementioned electrode-forming composition is coated on the surface of a photoelectric converting semiconductor layer of a solar cell element or on the surface of a transparent electrode of a solar cell element having a transparent electrode. Moreover, the wet coating process is particularly preferably any one of spray coating, dispenser coating, spin coating, knife coating, slit coating, ink jet coating, screen printing, offset printing, and die coating; however, the method to be used is not limited thereto, and any method can be used. The spray coating is a method which includes coating the electrode-forming composition in the form of a mist on the base material using compressed air, or coating the electrode-forming composition in the form of a mist on the base material by pressurizing the electrode-forming composition itself. The dispenser coating is a method which includes, for example, while placing the electrode-forming composition in a syringe, and pressing on the piston of this syringe so as to discharge the electrode-forming composition from a fine nozzle on the end of the syringe, coating the composition on the base material. The spin coating is a method which includes dropping the electrode-forming composition on a rotating base material, and allowing the dropped electrode-forming composition to spread towards the edges of the base material by a centrifugal force. The knife coating is a method which includes providing a base material at a prescribed gap from the edge of a knife so as to be able to move in the horizontal direction, supplying the electrode-forming composition on the base material on the upstream side of the knife, and then moving the base material horizontally in the downstream direction. The slit coating is a method which includes coating the electrode-forming composition on a base material by flowing the electrode-forming composition out from a narrow slit. The ink jet coating is a method which includes filling the electrode-forming composition into an ink cartridge of a commercially available ink jet printer, and then ink-jet printing the composition on the base material. The screen printing is a method in which sand is used as a pattern indicator, a fabricated print image is passed over the sand, and the electrode-forming composition is transferred to the base material. The offset printing is a printing method that utilizes the water repellency of an ink and includes temporarily transferring the electrode-forming composition affixed to a block to a rubber sheet without attaching directly to a base material, and then transferring from the rubber sheet to the base material. The die coating is a method which includes distributing the electrode-forming composition supplied into a die using a manifold, extruding on a base material through a slit, and coating on the surface of the moving base material. The examples of the die coating include slot coating, slide coating, and curtain coating methods.

Next, the base material having a film formed on the upper surface thereof is baked in air at a temperature of 130 to 400° C. and preferably 140 to 200° C. for 10 minutes to 1 hour and preferably for 15 to 40 minutes. Here, the reason for limiting the thickness of the coated film formed on the base material after baking to within a range from 0.1 to 2.0 μm is that if the film thickness is less than 0.1 μm, the surface resistance of the electrode required for use as a solar cell is inadequate, while if the film thickness exceeds 2.0 μm, there are no problems in terms of physical properties; however, the usage of materials becomes greater than what is necessary, thereby resulting in a waste of material. In addition, the reason for limiting the baking temperature of the coated film formed on the base material to within a range from 130 to 400° C. is that if the temperature is lower than 130° C., together with the sintering of the metal nanoparticles being inadequate, it becomes difficult to dissociate or decompose (separation/combustion) the protective agent by heat when baking the protective agent, thereby, a large amount of organic residue remains within the electrode after baking, and the residue metamorphoses or deteriorates which results in a decrease in the electrical conductivity or the reflectance, while if the temperature exceeds 400° C., the production advantage of being a low temperature process is lost, or in other words, the production costs increase and the productivity decreases. Moreover, the reason for limiting the baking time of the coated film formed on the base material to within a range from 10 minutes to 1 hour is that if the baking time is shorter than 10 minutes, together with the sintering of the metal nanoparticles being inadequate, it becomes difficult to dissociate or decompose (separation/combustion) the protective agent by heat when baking the protective agent, thereby, a large amount of organic residue remains within the electrode after baking and the residue metamorphoses or which results in a decrease in the electrical conductivity or the reflectance, while if the baking time is longer than 1 hour, there are no effects on physical properties; however, production costs increase beyond what is necessary and the productivity decreases.

In the aforementioned dispersion of metal nanoparticles which is the electrode-forming composition, since the dispersion contains comparatively large metal nanoparticles having a primary particle diameter of 10 to 50 nm at a large amount, the specific surface area of the metal nanoparticles decreases and the proportion of the protective agent becomes smaller. As a result, when a solar cell electrode is formed using this electrode-forming composition, organic molecules in the protective agent are dissociated, decomposed, or dissociated together with decomposed by heat during baking, thereby, an electrode can be obtained which includes silver for a main component thereof and is substantially free of organic substance. Thus, even when the solar cell in which this electrode is formed is used for many years, there is no deterioration or degradation of organic substance; thereby, the electrical conductivity and the reflectance of the electrode are maintained at a high level. As a result, an electrode can be obtained that has superior long-term stability. More specifically, even after housing the electrode for 1000 hours in a constant temperature and humidity chamber in which the temperature is held at 100° C. and the humidity is held at 50%, the electrode can reflect 80% or more of electromagnetic waves having a wavelength of 750 to 1500 nm, namely electromagnetic waves from the visible light region to the infrared region, and also the electrical conductivity of the electrode, namely the volume resistivity of the electrode, can be maintained at an extremely low value of less than $2 \times 10^{-5}$ $\Omega \cdot cm$ ($20 \times 10^{-6}$ $\Omega \cdot cm$). A solar cell using the electrode formed in this manner can maintain high levels of electrical conductivity and the reflectance even after being used for many years; therefore, superior long-term stability can be attained.

(Explanation of Embodiments According to [18] to [34])

The present embodiment of the method for producing a dispersion of metal nanoparticles includes: synthesizing metal nanoparticles by mixing in a liquid phase a metal salt in which the proportion of silver to metal elements is 75% by mass or more, a carboxylic acid, and a reducing agent; and dispersing the synthesized metal nanoparticles in a dispersion medium. The present embodiment is characterized in that the synthesizing of the metal nanoparticles is carried out by adding and mixing an additive containing one type or two or more types of anions selected from the group consisting of chlorine ions, sulfate ions, iodine ions, bromine ions, borate ions, and phosphate ions, together with the metal salt, the carboxylic acid, and the reducing agent in the liquid phase, and stirring the resulting suspension at a temperature of 25 to 95° C. The present embodiment is also characterized in that the concentration of the additive contained in the prepared dispersion is reduced to be within a range from 0.01 to 100 ppm after the synthesizing of the metal nanoparticles.

As shown in FIGS. 1 and 2, in the method for synthesizing metal nanoparticles, an aqueous metal salt solution A, an aqueous carboxylic acid solution B, an aqueous reducing agent solution C, and an aqueous additive solution D are respectively prepared.

<Aqueous Metal Salt Solution A Preparation Step>

Preparation of the aqueous metal salt solution A is carried out by dissolving a metal salt in water which is a solvent. It is preferable to dissolve the metal salt in deionized water to prepare a saturated aqueous solution at room temperature. Here, the metal salt to be dissolved contains at least silver salt. The aqueous metal salt solution A is prepared such that when the total amount of all metal elements contained in the metal salt is taken to be 100%, the silver accounts for 75% by mass or more. Here, the reason for limiting the proportion of silver to the metal elements contained in the metal salt to the range of 75% by mass or more is that, if the proportion of silver is less than 75% by mass, the reflectance of an electrode of a solar cell ends up decreasing in the case where the electrode of a solar cell is formed by using a produced dispersion of nanoparticles as an electrode-forming composition. The proportion of silver to the metal elements may be 100% by mass; however, in the case where the metal salt contains a salt of metal other than silver salt, residual metal elements in the metal salt other than silver preferably include one type or two or more types of metals selected from the group consisting of gold, platinum, palladium, and ruthenium. Metal nanoparticles other than silver nanoparticles contained in the synthesized metal nanoparticles are metal nanoparticles which has a composition, a mixed composition, or an alloy composition composed of one type or two or more types of metals selected from the group consisting of gold, platinum, palladium and ruthenium, and these metal nanoparticles other than silver nanoparticles are contained at a content within a range from 0.02% or more to less than 25% by mass, and preferably within a range from 0.03% to 20% by mass, based on a value of 100% by mass for all metal nanoparticles. Here, the reason for setting the content of the metal nanoparticles other than silver nanoparticles to be within a range from 0.02% by mass or more to less than 25% by mass based on a value of 100% by mass for all metal nanoparticles is that, although there is no particular problem with the content being less than 0.02% by mass, if the content is within a range from 0.02% or more to less than 25% by mass, the effect is attained that the electrical conductivity and the reflectance of an electrode after weather resistance testing (testing involving holding for 1000 hours in a constant temperature and humidity chamber at a temperature of 100° C. and a humidity of 50%) are not deteriorated as compared with those prior to the weather resistance testing, while if the content is 25% by mass or more, the electrical conductivity and the reflectance of an electrode immediately after baking decreases, and furthermore the electrical conductivity and the reflectance of the electrode after weather resistance testing are deteriorated as compared with those prior to weather resistance testing. As a result, the effect of controlling the reflectance and the volume resistivity is obtained as a result of synthesizing metal nanoparticles as a mixture of different metal nanoparticles, metal nanoparticles of an alloy, or metal nanoparticles having a so-called core-shell structure in which one of the elements forms a shell around a center portion formed of the other element.

<Aqueous Carboxylic Acid Solution B Preparation Step>

Preparation of the aqueous carboxylic acid solution B is carried out by dissolving a carboxylic acid in water which is a solvent. It is preferable to dissolve the carboxylic acid in deionized water to prepare a saturated aqueous solution at room temperature. Here, the carboxylic acid to be dissolved is one type or two or more types of compounds selected from the group consisting of glycolic acid, citric acid, malic acid, maleic acid, malonic acid, fumaric acid, succinic acid, tartaric acid, and salts thereof These carboxylic acids are preferable because they favorably function as protective materials that modify the surface of the metal nanoparticles, and furthermore, they do not contain corrosive substances such as thiols and the like. The aforementioned carboxylic acids can be partially or completely neutralized using a basic substance such as an alkali metal such as sodium, alkaline earth metal such as potassium or ammonia in order to adjust pH at the time of reaction. Moreover, the pH during the reaction can also be set to the basic side by adding an excess of basic substance.

<Aqueous Reducing Agent Solution C Preparation Step>

Preparation of the aqueous reducing agent solution C is carried out by dissolving a reducing agent in water which is a solvent. It is preferable to dissolve the reducing agent in deionized water to prepare a saturated aqueous solution at room temperature. Here, the reducing agent to be dissolved is one type or two or more types of compounds selected from the group consisting of hydrazine, sodium borohydride, ascorbic acid, oxalic acid, formic acid, salts thereof, and salts of Fe(II). An example of the salt of Fe(II) is ferrous sulfate. As a result, the effects can be attained in which no corrosive substance is contained and the compound can be easily decomposed by baking even when the compound remains within the product of a dispersion.

<Aqueous Additive Solution D Preparation Step>

Preparation of the aqueous additive solution is carried out by dissolving an additive in water which is a solvent. It is preferable to dissolve the additive in deionized water to prepare a saturated aqueous solution at room temperature. Here, the additive to be dissolved contains one type or two or more types of anions selected from the group consisting of chlorine ions, sulfate ions, iodine ions, bromine ions, borate ions, and phosphate ions. When synthesizing the metal nanoparticles, the shape and the particle diameter of the generating metal particles can be controlled by adding and mixing anions as the additive with the metal salt, the carboxylic acid, and the reducing agent. The aforementioned anions that compose the additive used for synthesis are thought to function as so-called habit modifiers. One of the functions thereof is to adhere to a specific surface of crystal seeds growing in a supersaturated solution; thereby, the effects are attained in which the growth of that surface is inhibited to affect the shape of the precipitated crystals, and the growth of the crystal seeds is suppressed to control the particle diameter. In addition, the controlling of the particle diameter by adding the anions as the additive has another effect where it hardly affects the specific resistance of the metal nanoparticles obtained by the synthesis.

Examples of the methods used in the synthesizing of the metal nanoparticles in the present embodiment include the following methods, but are not limited thereto. The first method is a so-called Carey-Lea sol method in which an aqueous silver nitrate solution is added to an aqueous solution of a ferrous salt and a citric acid salt. The second method involves the reduction of a carboxylic acid suspension with a reducing agent. In this embodiment, an explanation of the second method is provided in which a carboxylic acid suspension is reduced by a reducing agent.

In the method for synthesizing metal nanoparticles in the present embodiment, the aqueous metal salt solution A, the aqueous carboxylic acid solution B, and the aqueous reducing agent solution C which are obtained in the aforementioned steps are mixed; however, the order in which they are mixed is such that the aqueous carboxylic acid solution B is first mixed with either one of the aqueous metal salt solution A and the aqueous reducing agent solution C to form a mixed liquid, and then the other one of the aqueous metal salt solution A and the aqueous reducing agent C is added to the resulting mixed liquid and is further mixed therewith. The following provides an explanation of the case of first mixing the aqueous carboxylic acid solution B with the aqueous metal salt solution A with reference to FIG. 1.

<First Mixing Step>

The aqueous carboxylic acid solution B is first mixed with the aqueous metal salt solution A and the aqueous additive solution D. The mixing ratio is preferably such that the amount of carboxylic acid contained in the aqueous carboxylic acid solution B is within a range from 0.3 to 3.0 mol relative to 1 mol of the metal element contained in the aqueous metal salt solution A. In addition, the amount of the anion contained in the aqueous additive solution D is preferably within a range from 0.01 to 0.05 mol relative to 1 mol of the metal element contained in the aqueous metal salt solution A. In addition, the mixing is preferably carried out within a temperature range of 25 to 70° C. at atmospheric pressure. When the aqueous carboxylic acid solution is mixed with the aqueous metal salt solution and the aqueous additive solution, poorly-soluble carboxylic acid salt precipitates and a suspension of a carboxylic acid salt is obtained. Accordingly, the mixing of the aqueous carboxylic acid solution B with the aqueous metal salt solution A and the aqueous additive solution D is preferably carried out for an amount of time sufficient to obtain that suspension adequately. Furthermore, with regard to the case of using a carboxylic acid salt for the carboxylic acid, for example, the result obtained in the case of using sodium carbonate is as same as that obtained in the case of adding an aqueous sodium hydroxide solution after adding the aqueous carboxylic acid solution.

<Second Mixing Step>

After obtaining the suspension in which the carboxylic acid salt precipitates, the aqueous reducing agent solution C is added to that suspension in the form of a mixed liquid and then is further mixed therewith. The mixing ratio is preferably such that the amount of reducing agent contained in the aqueous reducing agent solution C is within a range from 0.2 to 3.0 mol relative to 1 mol of the metal element serving as the raw material of the suspension. In addition, the mixing is carried out within a temperature range of 25 to 95° C. at atmospheric pressure. When mixed at a temperature within this range, the mean particle diameter of the formed particles can be made to be 100 nm or less, and when a film is formed by using the resulting dispersion of metal nanoparticles as an electrode-forming composition, low volume resistivity can be achieved at low temperatures. As a result of mixing the aqueous reducing agent solution into the suspension and stirring within a prescribed temperature range in this manner, the metal salt is reduced and metal nanoparticles can be synthesized.

In the method for synthesizing metal nanoparticles of the present embodiment which includes these steps, metal nanoparticles can be produced from an insoluble metal salt. In the present embodiment, all of the raw materials are composed of C, H, N, and O, with the exception of the raw material metal, sodium, calcium, and the like which are used to cause the carboxylic acid and the like to form a salt, and boron contained in the case of using sodium borohydride and the like for the reducing agent, and corrosive substances are not contained. Consequently, metal nanoparticles can be obtained that are suitable for use as electrically conductive materials without containing a corrosive substance. In addition, the metal nanoparticles synthesized according to the method of the present embodiment can be sintered at low temperatures. For example, in the case of silver nanoparticles, an electrode having a volume resistivity on the order of $10^{-6}$ $\Omega \cdot$cm or an electrically conductive reflective film having high reflectance characteristic of silver can be formed at low temperatures. In addition, the reflectance and the electrical conductivity of an electrically conductive reflective film formed in this manner can be controlled depending on the purpose of use by controlling the particle size distribution and the shape of the metal nanoparticles to be coated.

Here, in the aforementioned embodiment, the case is explained in which the aqueous carboxylic acid solution B is first mixed with the aqueous metal salt solution A and the aqueous additive solution D; however, as shown in FIG. 2, the aqueous carboxylic acid solution B may first be mixed with the aqueous reducing agent solution C to form a mixed liquid of the carboxylic acid and the reducing agent, and then the aqueous salt solution A and the aqueous additive solution D may be added to the resulting mixed liquid and further mixed therewith. In this case, the reduction reaction proceeds simultaneously with the precipitation of poorly-soluble salt at the stage where the aqueous metal salt solution A and the aqueous additive solution D are added to the mixed aqueous solution of the carboxylic acid and the reducing agent, and ultimately a dispersion of metal nanoparticles can be obtained. In this case as well, all of the raw materials consist of C, H, N, and O with the exception of the raw material metal, and boron and the like that causes the carboxylic acid to form a salt, and corrosive substances are not contained. Consequently, metal nanoparticles can be obtained that are suitable for use as an electrically conductive material without containing a corrosive substance.

In the aforementioned embodiment, the case is explained in which each of the aqueous carboxylic acid solution B and the aqueous metal salt solution A is first prepared, and then they are mixed together; however, in the process of forming a mixed liquid by mixing the aqueous carboxylic acid solution B and the aqueous metal salt solution A, the case may also be included where the solute of the aqueous carboxylic acid solution B is preliminarily mixed with the solute of the aqueous metal salt A, and then the mixed solutes are dissolved by adding water thereto. Similarly, as shown in FIG. 2, in the process of first forming a mixed liquid of the carboxylic acid and the reducing agent by preliminarily mixing the aqueous carboxylic acid solution B and the aqueous reducing agent solution C, the case may also be included where the solute of the aqueous carboxylic acid solution B is preliminarily mixed with the solute of the aqueous reducing agent solution C, and then the mixed solutes are dissolved by adding water thereto.

As a result of going through the aforementioned steps, metal nanoparticles can be synthesized of which the shape and the particle diameter are controlled over a wide range.

<Additive Concentration Reduction Step>

By using various separation techniques, the concentration of the additive is reduced in the reaction liquid containing the metal nanoparticles after the reduction, and excess salts are removed from the reaction liquid. As a result, the dispersion stability can be increased. The concentration of the additive contained in the prepared dispersion is reduced to be within a range from 0.01 to 100 ppm. This is because if the concentration of the additive contained in the dispersion is 100 ppm or less, the dispersion stability of the resulting dispersion of metal nanoparticles is maintained for a fixed period of time. The reason for limiting the concentration of the additive in the dispersion to the aforementioned range is that, superior dispersion stability is maintained even when the proportion of the contained additive is less than the lower limit of the aforementioned range, it is not preferable to remove the additive from the dispersion until the concentration becomes less than 0.01 ppm from the viewpoint of cost. In addition, if the proportion of the contained additive exceeds the upper limit of the aforementioned range, the metal nanoparticles end up easily forming precipitates due to the coagulation action thereof. Examples of the methods for reducing the additive concentration or separating the excess salts include a centrifugal separation, an ultrafiltration, and the use of an ion exchange membrane or an ion exchange resin. The volume resistivity of an electrode obtained by coating and baking these metal nanoparticles generally demonstrates a tendency to be closer to that of a bulk metal, the more the amount of the excess salts are removed.

<Dispersion Step>

Next, the synthesized metal nanoparticles are added to a dispersion medium and are further mixed therewith; thereby, the particles are dispersed in the dispersion medium to prepare a dispersion of metal nanoparticles. The dispersion is prepared so that the content of metal nanoparticles including silver nanoparticles in the dispersion is within a range from 2.5 to 95.0% by mass and preferably within a range from 3.5 to 90.0% by mass based on a value of 100% by mass for the composition composed of the metal nanoparticles and the dispersion medium. The dispersion medium contains water at a content of 1% by mass or more and preferably 2% by mass or more and alcohol at a content of 2% by mass or more and preferably 3% by mass or more based on a value of 100% by mass for the total dispersion medium. For example, in the case where the dispersion medium is composed only of water and alcohol, when the dispersion medium contains 2% by mass of water, it contains 98% by mass of alcohol, and when the dispersion medium contains 2% by mass of alcohol, it contains 98% by mass of water. Here, the reason for limiting the content of metal nanoparticles including silver nanoparticles to within a range from 2.5 to 95.0% by mass based on a value of 100% by mass for the composition composed of the metal nanoparticles and the dispersion medium is that, if the content is less than 2.5% by mass, there are no particular effects on electrode properties after baking; however, it becomes difficult to obtain an electrode of a required thickness, while if the content exceeds 95.0% by mass, the required fluidity for use as an ink or a paste during wet coating of the composition ends up being lost. In addition, the reason for limiting the content of water to 1% by mass or more based on a value of 100% by mass for the total dispersion medium is that, if the water content is less than 1% by mass, it becomes difficult to sinter at low temperatures a film obtained by coating the composition by wet coating, and the electrical conductivity and the reflectance of the electrode end up decreasing after baking. The reason for limiting the content of alcohol to 2% by mass or more based on a value of 100% for the total dispersion medium is that, if the content of alcohol is less than 2% by mass, it also becomes difficult to sinter at low temperatures a film obtained by coating the composition by wet coating in the same manner as described above, and the electrical conductivity and the reflectance of the electrode end up decreasing after baking.

In addition, the aforementioned alcohol is preferably one type or two or more types selected from the group consisting of methanol, ethanol, propanol, butanol, ethylene glycol, propylene glycol, diethylene glycol, glycerol, isobornyl alcohol, and erythritol.

As a result of going through the aforementioned steps, a dispersion can be obtained in which metal nanoparticles are dispersed, and the shape and the particle diameter of the metal nanoparticles are controlled over a wide range.

The dispersion of metal nanoparticles of the present embodiment is a dispersion of metal nanoparticles obtained by the production method of the present embodiment as previously described, and is characterized in that the additive are contained in the dispersion at a concentration within a range from 0.01 to 100 ppm. If the additive is contained in the dispersion at a concentration of 100 ppm or less, the dispersion stability is maintained for a fixed period of time. The reason for defining the concentration of the additive in the dispersion to be within the aforementioned range is that, superior dispersion stability is maintained even when the proportion of the contained additive is less than the lower limit of the aforementioned range, it is not preferable to remove the additive from the dispersion until the concentration becomes less than 0.01 ppm from the viewpoint of cost. In addition, if the proportion of the contained additive exceeds the upper limit of the aforementioned range, the metal nanoparticles end up easily forming precipitates due to the coagulation action thereof.

The following provides an explanation of a method for forming an electrode using a dispersion of metal nanoparticles produced in this manner.

First, the aforementioned dispersion of metal nanoparticles is used as a solar cell electrode-forming composition and is coated on a base material by a wet coating process. The coating by this wet coating process involves forming a film such that the thickness of the film after baking will become within a range from 0.1 to 2.0 μm and preferably within a range from 0.3 to 1.5 μm. The aforementioned base material can be a substrate composed of either one of silicon, glass, ceramics containing a transparent electrically conductive material, polymer material, and metal, or can be a laminate of two or more types of materials selected from the group consisting of silicon, glass, ceramics containing a transparent electrically conductive material, polymer material, and metal. In addition, the base material is preferably either one of a solar cell element and a solar cell element having a transparent electrode. Examples of the transparent electrodes include indium tin oxide (ITO), antimony tin oxide (ATO), tin oxide ($SnO_2$: NESA), indium zinc oxide (IZO), and aluminum-doped zinc oxide (AZO). The aforementioned electrode-forming composition is coated on the surface of a photoelectric converting semiconductor layer of a solar cell element or on the surface of a transparent electrode of a solar cell element having a transparent electrode. Moreover, the wet coating process is particularly preferably any one of spray coating, dispenser coating, spin coating, knife coating, slit coating, ink jet coating, screen printing, offset printing, and die coating; however, the method to be used is not limited thereto, and any method can be used. The spray coating is a method which includes coating the electrode-forming composition in the form of a mist on the base material using compressed air, or coating the electrode-forming composition in the form of a mist on the base material by pressurizing the electrode-forming composition itself. The dispenser coating is a method which includes, for example, while placing the electrode-forming composition in a syringe, and pressing on the piston of this syringe so as to discharge the electrode-forming composition from a fine nozzle on the end of the syringe, coating the composition on the base material. The spin coating is a method which includes dropping the electrode-forming composition on a rotating base material, and allowing the dropped electrode-forming composition to spread towards the edges of the base material by a centrifugal force. The knife coating is a method which includes providing a base material at a prescribed gap from the edge of a knife so as to be able to move in the horizontal direction, supplying the electrode-forming composition on the base material on the upstream side of the knife, and then moving the base material horizontally in the downstream direction. The slit coating is a method which includes coating the electrode-forming composition on a base material by flowing the electrode-forming composition out from a narrow slit. The ink jet coating is a method which includes filling the electrode-forming composition into an ink cartridge of a commercially available ink jet printer, and then ink-jet printing the composition on the base material. The screen printing is a method in which sand is used as a pattern indicator, a fabricated print image is passed over the sand, and the electrode-forming composition is transferred to the base material. The offset printing is a printing method that utilizes the water repellency of an ink and includes temporarily transferring the electrode-forming composition affixed to a block to a rubber sheet without attaching directly to a base material, and then transferring from the rubber sheet to the base material. The die coating is a method which includes distributing the electrode-forming composition supplied into a die using a manifold, extruding on a base material through a slit, and coating on the surface of the moving base material. The examples of the die coating include slot coating, slide coating, and curtain coating methods.

Next, the base material having a film formed on the upper surface thereof is baked in air at a temperature of 130 to 400° C. and preferably 140 to 200° C. for 10 minutes to 1 hour and preferably for 15 to 40 minutes. Here, the reason for limiting the thickness of the coated film formed on the base material after baking to within a range from 0.1 to 2.0 μm is that if the film thickness is less than 0.1 μm, the surface resistance of the electrode required for use as a solar cell is inadequate, while if the film thickness exceeds 2.0 μm, there are no problems in terms of physical properties; however, the usage of materials becomes greater than what is necessary, thereby resulting in a waste of material. In addition, the reason for limiting the baking temperature of the coated film formed on the base material to within a range from 130 to 400° C. is that if the temperature is lower than 130° C., together with the sintering of the metal nanoparticles being inadequate, it becomes difficult to dissociate or decompose (separation/combustion) the protective agent by heat when baking the protective agent, thereby, a large amount of organic residue remains within the electrode after baking, and the residue metamorphoses or deteriorates which results in a decrease in the electrical conductivity or the reflectance, while if the temperature exceeds 400° C., the production advantage of being a low temperature process is lost, or in other words, the production costs increase and the productivity decreases. Moreover, the reason for limiting the baking time of the coated film formed on the base material to within a range from 10 minutes to 1 hour is that if the baking time is shorter than 10 minutes, together with the sintering of the metal nanoparticles being inadequate, it becomes difficult to dissociate or decompose (separation/combustion) the protective agent by heat when baking the protective agent, thereby, a large amount of organic residue remains within the electrode after baking and the residue metamorphoses or which results in a decrease in the electrical conductivity or the reflectance, while if the baking time is longer than 1 hour, there are no effects on physical properties; however, production costs increase beyond what is necessary and the productivity decreases.

In the aforementioned dispersion of metal nanoparticles which is the electrode-forming composition, since the dispersion contains comparatively large metal nanoparticles having a primary particle diameter of 10 to 50 nm at a large amount, the specific surface area of the metal nanoparticles decreases and the proportion of the protective agent becomes smaller. As a result, when a solar cell electrode is formed using this electrode-forming composition, organic molecules in the protective agent are dissociated, decomposed, or dissociated together with decomposed by heat during baking, thereby, an electrode can be obtained which includes silver for a main component thereof and is substantially free of organic substance. Thus, even when the solar cell in which this electrode is formed is used for many years, there is no deterioration or degradation of organic substance; thereby, the electrical conductivity and the reflectance of the electrode are maintained at a high level. As a result, an electrode can be obtained that has superior long-term stability. More specifically, even after housing the electrode for 1000 hours in a constant temperature and humidity chamber in which the temperature is held at 100° C. and the humidity is held at 50%, the electrode can reflect 80% or more of electromagnetic waves having a wavelength of 750 to 1500 nm, namely electromagnetic waves from the visible light region to the infrared region, and also the electrical conductivity of the electrode, namely the volume resistivity of the electrode, can be maintained at an extremely low value of less than $2 \times 10^{-5}$ $\Omega \cdot cm$ ($20 \times 10^{-6}$ $\Omega \cdot cm$). A solar cell using the electrode formed in this manner can maintain high levels of electrical conductivity and the reflectance even after being used for many years; therefore, superior long-term stability can be attained.

(Explanation of Embodiments According to [35] to [52])

The present embodiment of the method for producing a dispersion of metal nanoparticles includes: synthesizing metal nanoparticles by mixing in a liquid phase a metal salt in which the proportion of silver to metal elements is 75% by mass or more, a carboxylic acid, and a reducing agent; and dispersing the synthesized metal nanoparticles in a dispersion medium. The present embodiment is characterized in that the synthesizing of the metal nanoparticles is carried out by adding and mixing an additive containing one type or two or more types of organic compounds selected from the group consisting of polyvinyl pyrrolidone, polyvinyl pyrrolidone copolymer, cellulose ether, polyvinyl alcohol, and polyacrylic acid, together with the metal salt, the carboxylic acid and the reducing agent in the liquid phase, and stirring the resulting suspension at a temperature of 25 to 95° C. The present embodiment is also characterized in that the concentration of the additive contained in the prepared dispersion is reduced to be within a range from 0.5 to 5000 ppm after the synthesizing of the metal nanoparticles.

As shown in FIGS. 1 and 2, in the method for synthesizing metal nanoparticles, an aqueous metal salt solution A, an aqueous carboxylic acid solution B, an aqueous reducing agent solution C, and an aqueous additive solution D are respectively prepared.

<Aqueous Metal Salt Solution A Preparation Step>

Preparation of the aqueous metal salt solution A is carried out by dissolving a metal salt in water which is a solvent. It is preferable to dissolve the metal salt in deionized water to prepare a saturated aqueous solution at room temperature. Here, the metal salt to be dissolved contains at least silver salt. The aqueous metal salt solution A is prepared such that when the total amount of all metal elements contained in the metal salt is taken to be 100%, the silver accounts for 75% by mass or more. Here, the reason for limiting the proportion of silver to the metal elements contained in the metal salt to the range of 75% by mass or more is that, if the proportion of silver is less than 75% by mass, the reflectance of an electrode of a solar cell ends up decreasing in the case where the electrode of a solar cell is formed by using a produced dispersion of nanoparticles as an electrode-forming composition. The proportion of silver to the metal elements may be 100% by mass; however, in the case where the metal salt contains a salt of metal other than silver salt, residual metal elements in the metal salt other than silver preferably include one type or two or more types of metals selected from the group consisting of gold, platinum, palladium, ruthenium, nickel, copper, tin, indium, zinc, iron, chromium, manganese and molybdenum. Metal nanoparticles other than silver nanoparticles contained in the synthesized metal nanoparticles are metal nanoparticles which has a composition, a mixed composition, or an alloy composition composed of one type or two or more types of metals selected from the group consisting of gold, platinum, palladium, ruthenium, nickel, copper, tin, indium, zinc, iron, chromium, manganese and molybdenum, and these metal nanoparticles other than silver nanoparticles are contained at a content within a range from 0.02% or more to less than 25% by mass, and preferably within a range from 0.03% to 20% by mass, based on a value of 100% by mass for all metal nanoparticles. Here, the reason for setting the content of the metal nanoparticles other than silver nanoparticles to be within a range from 0.02% by mass or more to less than 25% by mass based on a value of 100% by mass for all metal nanoparticles is that, although there is no particular problem with the content being less than 0.02% by mass, if the content is within a range from 0.02% or more to less than 25% by mass, the effect is attained that the electrical conductivity and the reflectance of an electrode after weather resistance testing (testing involving holding for 1000 hours in a constant temperature and humidity chamber at a temperature of 100° C. and a humidity of 50%) are not deteriorated as compared with those prior to the weather resistance testing, while if the content is 25% by mass or more, the electrical conductivity and the reflectance of an electrode immediately after baking decreases, and furthermore the electrical conductivity and the reflectance of the electrode after weather resistance testing are deteriorated as compared with those prior to weather resistance testing. As a result, the effect of controlling the reflectance and the volume resistivity is obtained as a result of synthesizing metal nanoparticles as a mixture of different metal nanoparticles, metal nanoparticles of an alloy, or metal nanoparticles having a so-called core-shell structure in which one of the elements forms a shell around a center portion formed of the other element.

<Aqueous Carboxylic Acid Solution B Preparation Step>

Preparation of the aqueous carboxylic acid solution B is carried out by dissolving a carboxylic acid in water which is a solvent. It is preferable to dissolve the carboxylic acid in deionized water to prepare a saturated aqueous solution at room temperature. Here, the carboxylic acid to be dissolved is one type or two or more types of compounds selected from the group consisting of glycolic acid, citric acid, malic acid, maleic acid, malonic acid, fumaric acid, lactic acid, succinic acid, tartaric acid, and salts thereof These carboxylic acids are preferable because they favorably function as protective materials that modify the surface of the metal nanoparticles, and furthermore, they do not contain corrosive substances such as thiols and the like. The aforementioned carboxylic acids can be partially or completely neutralized using a basic substance such as an alkali metal such as sodium, alkaline earth metal such as potassium or ammonia in order to adjust pH at the time of reaction. Moreover, the pH during the reaction can also be set to the basic side by adding an excess of basic substance.

<Aqueous Reducing Agent Solution C Preparation Step>

Preparation of the aqueous reducing agent solution C is carried out by dissolving a reducing agent in water which is a solvent. It is preferable to dissolve the reducing agent in deionized water to prepare a saturated aqueous solution at room temperature. Here, the reducing agent to be dissolved is one type or two or more types of compounds selected from the group consisting of hydrazine, sodium borohydride, ascorbic acid, oxalic acid, formic acid, salts thereof, glucose, and salts of Fe(II). An example of the salt of Fe(II) is ferrous sulfate. As a result, the effects can be attained in which no corrosive substance is contained and the compound can be easily decomposed by baking even when the compound remains within the product of a dispersion.

<Aqueous Additive Solution D Preparation Step>

Preparation of the aqueous additive solution is carried out by dissolving an additive in water which is a solvent. It is preferable to dissolve the in deionized water to prepare a saturated aqueous solution at room temperature. Here, it is necessary to use, as the additive, a substance which is water-soluble and also has the action of modifying the surface of the formed metal nanoparticles. The additive to be dissolved contains one type or two or more types of organic compounds selected from the group consisting of polyvinyl pyrrolidone (PVP), PVP copolymer, cellulose ether, polyvinyl alcohol (PVA), and polyacrylic acid. The additive may be composed of only the aforementioned organic compounds. More specifically, examples of PVP copolymers include PVP-methacrylate copolymer, PVP-styrene copolymer, PVP-vinyl acetate copolymer. Examples of cellulose ethers include hydroxypropyl methylcellulose, methylcellulose, and hydroxyethyl methylcellulose. The mass-average molecular weight of the organic compound contained in the additive is preferably within a range from 10000 to 100000. When synthesizing the metal nanoparticles, the shape and the particle diameter of the generating metal particles can be controlled by adding and mixing the aforementioned organic compounds as the additive with the metal salt, the carboxylic acid, and the reducing agent.

The reason for this is thought to be that, by adding and mixing the aforementioned types of additives during the synthesizing of the metal nanoparticles, the surfaces of crystal seeds growing in the supersaturated solution are modified, and the growth of those surfaces is inhibited; thereby, the growth of the metal nanoparticles is suppressed.

Examples of the methods used in the synthesizing of the metal nanoparticles in the present embodiment include the following methods, but are not limited thereto. The first method is a so-called Carey-Lea sol method in which an aqueous silver nitrate solution is added to an aqueous solution of a ferrous salt and a citric acid salt. The second method involves the reduction of a carboxylic acid suspension with a reducing agent. In this embodiment, an explanation of the second method is provided in which a carboxylic acid suspension is reduced by a reducing agent.

In the method for synthesizing metal nanoparticles in the present embodiment, the aqueous metal salt solution A, the aqueous carboxylic acid solution B, and the aqueous reducing agent solution C which are obtained in the aforementioned steps are mixed; however, the order in which they are mixed is such that the aqueous carboxylic acid solution B is first mixed with either one of the aqueous metal salt solution A and the aqueous reducing agent solution C to form a mixed liquid, and then the other one of the aqueous metal salt solution A and the aqueous reducing agent C is added to the resulting mixed liquid and is further mixed therewith. The following provides an explanation of the case of first mixing the aqueous carboxylic acid solution B with the aqueous metal salt solution A with reference to FIG. 1.

<First Mixing Step>

The aqueous carboxylic acid solution B is first mixed with the aqueous metal salt solution A and the aqueous additive solution D. The mixing ratio is preferably such that the molar ratio of the carboxylic acid contained in the aqueous carboxylic acid solution B to all raw material metal ions is within a range from 0.3 to 3.0. In addition, the mass ratio of the organic compound contained in the aqueous additive solution D to all the raw material metal ions is preferably within a range from 0.05 to 0.1. The mixing is preferably carried out within a temperature range of 25 to 70° C. at atmospheric pressure. When the aqueous carboxylic acid solution is mixed with the aqueous metal salt solution and the aqueous additive solution, poorly-soluble carboxylic acid salt precipitates and a suspension of a carboxylic acid salt is obtained. Accordingly, the mixing of the aqueous carboxylic acid solution B with the aqueous metal salt solution A and the aqueous additive solution D is preferably carried out for an amount of time sufficient to obtain that suspension adequately. Furthermore, with regard to the case of using a carboxylic acid salt for the carboxylic acid, for example, the result obtained in the case of using sodium carbonate is as same as that obtained in the case of adding an aqueous sodium hydroxide solution after adding the aqueous carboxylic acid solution.

<Second Mixing Step>

After obtaining the suspension in which the carboxylic acid salt precipitates, the aqueous reducing agent solution C is added to that suspension in the form of a mixed liquid and then is further mixed therewith. The mixing ratio is preferably such that the molar ratio of the reducing agent contained in the aqueous reducing agent solution C to all the raw material metal ions is within a range from 0.2 to 3.0. In addition, the mixing is carried out within a temperature range of 25 to 95° C. at atmospheric pressure. When mixed at a temperature within this range, the mean particle diameter of the formed particles can be made to be 100 nm or less, and when a film is formed by using the resulting dispersion of metal nanoparticles as an electrode-forming composition, low volume resistivity can be achieved at low temperatures.

As a result of mixing the aqueous reducing agent solution into the suspension and stirring within a prescribed temperature range in this manner, the metal salt is reduced and metal nanoparticles can be synthesized.

In the method for synthesizing metal nanoparticles of the present embodiment which includes these steps, metal nanoparticles can be produced from an insoluble metal salt. In the present embodiment, all of the raw materials are composed of C, H, N, and O, with the exception of the raw material metal, sodium, calcium, and the like which are used to cause the carboxylic acid and the like to form a salt, and boron contained in the case of using sodium borohydride and the like for the reducing agent, and corrosive substances are not contained. Consequently, metal nanoparticles can be obtained that are suitable for use as electrically conductive materials without containing a corrosive substance. In addition, the metal nanoparticles synthesized according to the method of the present embodiment can be sintered at low temperatures. For example, in the case of silver nanoparticles, an electrode having a volume resistivity on the order of $10^{-6}$ $\Omega \cdot cm$ or an electrically conductive reflective film having high reflectance characteristic of silver can be formed at low temperatures. In addition, the reflectance and the electrical conductivity of an electrically conductive reflective film formed in this manner can be controlled depending on the purpose of use by controlling the particle size distribution and the shape of the metal nanoparticles to be coated.

Here, in the aforementioned embodiment, the case is explained in which the aqueous carboxylic acid solution B is first mixed with the aqueous metal salt solution A and the aqueous additive solution D; however, as shown in FIG. 2, the aqueous carboxylic acid solution B may first be mixed with the aqueous reducing agent solution C to form a mixed liquid of the carboxylic acid and the reducing agent, and then the aqueous salt solution A and the aqueous additive solution D may be added to the resulting mixed liquid and further mixed therewith. In this case, the reduction reaction proceeds simultaneously with the precipitation of poorly-soluble salt at the stage where the aqueous metal salt solution A and the aqueous additive solution D are added to the mixed aqueous solution of the carboxylic acid and the reducing agent, and ultimately a dispersion of metal nanoparticles can be obtained. In this case as well, all of the raw materials consist of C, H, N, and O with the exception of the raw material metal, and boron and the like that causes the carboxylic acid to form a salt, and corrosive substances are not contained. Consequently, metal nanoparticles can be obtained that are suitable for use as an electrically conductive material without containing a corrosive substance.

In the aforementioned embodiment, the case is explained in which each of the aqueous carboxylic acid solution B and the aqueous metal salt solution A is first prepared, and then they are mixed together; however, in the process of forming a mixed liquid by mixing the aqueous carboxylic acid solution B and the aqueous metal salt solution A, the case may also be included where the solute of the aqueous carboxylic acid solution B is preliminarily mixed with the solute of the aqueous metal salt A, and then the mixed solutes are dissolved by adding water thereto. Similarly, as shown in FIG. 2, in the process of first forming a mixed liquid of the carboxylic acid and the reducing agent by preliminarily mixing the aqueous carboxylic acid solution B and the aqueous reducing agent solution C, the case may also be included where the solute of the aqueous carboxylic acid solution B is preliminarily mixed with the solute of the aqueous reducing agent solution C, and then the mixed solutes are dissolved by adding water thereto.

As a result of going through the aforementioned steps, metal nanoparticles can be synthesized of which the shape and the particle diameter are controlled over a wide range.

<Additive Concentration Reduction Step>

By using various separation techniques, the concentration of the additive is reduced in the reaction liquid containing the metal nanoparticles after the reduction, and excess salts are removed from the reaction liquid. As a result, the dispersion stability can be increased. The concentration of the additive contained in the prepared dispersion is reduced to be within a range from 0.5 to 5000 ppm. This is because if the concentration of the additive contained in the dispersion is 5000 ppm or less, the dispersion stability of the resulting dispersion of metal nanoparticles is maintained for a fixed period of time. The reason for limiting the concentration of the additive in the dispersion to the aforementioned range is that, superior dispersion stability is maintained even when the proportion of the contained additive is less than the lower limit of the aforementioned range, it is not preferable to remove the additive from the dispersion until the concentration becomes less than 0.5 ppm from the viewpoint of cost. In addition, if the proportion of the contained additive exceeds the upper limit of the aforementioned range, the metal nanoparticles end up easily forming precipitates due to the coagulation action thereof. Examples of the methods for reducing the additive concentration or separating the excess salts include a centrifugal separation, an ultrafiltration, and the use of an ion exchange membrane or an ion exchange resin. The volume resistivity of an electrode obtained by coating and baking these metal nanoparticles generally demonstrates a tendency to be closer to that of a bulk metal, the more the amount of the excess salts are removed.

<Dispersion Step>

Next, the synthesized metal nanoparticles are added to a dispersion medium and are further mixed therewith; thereby, the particles are dispersed in the dispersion medium to prepare a dispersion of metal nanoparticles. The dispersion is prepared so that the content of metal nanoparticles including silver nanoparticles in the dispersion is within a range from 2.5 to 95.0% by mass and preferably within a range from 3.5 to 90.0% by mass based on a value of 100% by mass for the composition composed of the metal nanoparticles and the dispersion medium. The dispersion medium contains water at a content of 1% by mass or more and preferably 2% by mass or more and alcohol at a content of 2% by mass or more and preferably 3% by mass or more based on a value of 100% by mass for the total dispersion medium. For example, in the case where the dispersion medium is composed only of water and alcohol, when the dispersion medium contains 2% by mass of water, it contains 98% by mass of alcohol, and when the dispersion medium contains 2% by mass of alcohol, it contains 98% by mass of water. Here, the reason for limiting the content of metal nanoparticles including silver nanoparticles to within a range from 2.5 to 95.0% by mass based on a value of 100% by mass for the composition composed of the metal nanoparticles and the dispersion medium is that, if the content is less than 2.5% by mass, there are no particular effects on electrode properties after baking; however, it becomes difficult to obtain an electrode of a required thickness, while if the content exceeds 95.0% by mass, the required fluidity for use as an ink or a paste during wet coating of the composition ends up being lost. In addition, the reason for limiting the content of water to 1% by mass or more based on a value of 100% by mass for the total dispersion medium is that, if the water content is less than 1% by mass, it becomes difficult to sinter at low temperatures a film obtained by coating the composition by wet coating, and the electrical conductivity and the reflectance of the electrode end up decreasing after baking. The reason for limiting the content of alcohol to 2% by mass or more based on a value of 100% for the total dispersion medium is that, if the content of alcohol is less than 2% by mass, it also becomes difficult to sinter at low temperatures a film obtained by coating the composition by wet coating in the same manner as described above, and the electrical conductivity and the reflectance of the electrode end up decreasing after baking.

In addition, the aforementioned alcohol is preferably one type or two or more types selected from the group consisting of methanol, ethanol, propanol, butanol, ethylene glycol, propylene glycol, diethylene glycol, glycerol, isobornyl alcohol, and erythritol.

As a result of going through the aforementioned steps, a dispersion can be obtained in which metal nanoparticles are dispersed, and the shape and the particle diameter of the metal nanoparticles are controlled over a wide range.

The dispersion of metal nanoparticles of the present embodiment is a dispersion of metal nanoparticles obtained by the production method of the present embodiment as previously described, and is characterized in that the additive are contained in the dispersion at a concentration within a range from 0.5 to 5000 ppm. If the additive is contained in the dispersion at a concentration of 5000 ppm or less, the dispersion stability is maintained for a fixed period of time. The reason for defining the concentration of the additive in the dispersion to be within the aforementioned range is that, superior dispersion stability is maintained even when the proportion of the contained additive is less than the lower limit of the aforementioned range, it is not preferable to remove the additive from the dispersion until the concentration becomes less than 0.5 ppm from the viewpoint of cost. In addition, if the proportion of the contained additive exceeds the upper limit of the aforementioned range, the metal nanoparticles end up easily forming precipitates due to the coagulation action thereof.

The following provides an explanation of a method for forming an electrode using a dispersion of metal nanoparticles produced in this manner.

First, the aforementioned dispersion of metal nanoparticles is used as a solar cell electrode-forming composition and is coated on a base material by a wet coating process. The coating by this wet coating process involves forming a film such that the thickness of the film after baking will become within a range from 0.1 to 2.0 μm and preferably within a range from 0.3 to 1.5 μm. The aforementioned base material can be a substrate composed of either one of silicon, glass, ceramics containing a transparent electrically conductive material, polymer material, and metal, or can be a laminate of two or more types of materials selected from the group consisting of silicon, glass, ceramics containing a transparent electrically conductive material, polymer material, and metal. In addition, the base material is preferably either one of a solar cell element and a solar cell element having a transparent electrode. Examples of the transparent electrodes include indium tin oxide (ITO), antimony tin oxide (ATO), tin oxide ($SnO_2$: NESA), indium zinc oxide (IZO), and aluminum-doped zinc oxide (AZO). The aforementioned electrode-forming composition is coated on the surface of a photoelectric converting semiconductor layer of a solar cell element or on the surface of a transparent electrode of a solar cell element having a transparent electrode. Moreover, the wet coating process is particularly preferably any one of spray coating, dispenser coating, spin coating, knife coating, slit coating, ink jet coating, screen printing, offset printing, and die coating; however, the method to be used is not limited thereto, and any method can be used. The spray coating is a method which includes coating the electrode-forming composition in the form of a mist on the base material using compressed air, or coating the electrode-forming composition in the form of a mist on the base material by pressurizing the electrode-forming composition itself. The dispenser coating is a method which includes, for example, while placing the electrode-forming composition in a syringe, and pressing on the piston of this syringe so as to discharge the electrode-forming composition from a fine nozzle on the end of the syringe, coating the composition on the base material. The spin coating is a method which includes dropping the electrode-forming composition on a rotating base material, and allowing the dropped electrode-forming composition to spread towards the edges of the base material by a centrifugal force. The knife coating is a method which includes providing a base material at a prescribed gap from the edge of a knife so as to be able to move in the horizontal direction, supplying the electrode-forming composition on the base material on the upstream side of the knife, and then moving the base material horizontally in the downstream direction. The slit coating is a method which includes coating the electrode-forming composition on a base material by flowing the electrode-forming composition out from a narrow slit. The ink jet coating is a method which includes filling the electrode-forming composition into an ink cartridge of a commercially available ink jet printer, and then ink-jet printing the composition on the base material. The screen printing is a method in which sand is used as a pattern indicator, a fabricated print image is passed over the sand, and the electrode-forming composition is transferred to the base material. The offset printing is a printing method that utilizes the water repellency of an ink and includes temporarily transferring the electrode-forming composition affixed to a block to a rubber sheet without attaching directly to a base material, and then transferring from the rubber sheet to the base material. The die coating is a method which includes distributing the electrode-forming composition supplied into a die using a manifold, extruding on a base material through a slit, and coating on the surface of the moving base material. The examples of the die coating include slot coating, slide coating, and curtain coating methods.

Next, the base material having a film formed on the upper surface thereof is baked in air at a temperature of 130 to 400° C. and preferably 140 to 200° C. for 10 minutes to 1 hour and preferably for 15 to 40 minutes. Here, the reason for limiting the thickness of the coated film formed on the base material after baking to within a range from 0.1 to 2.0 μm is that if the film thickness is less than 0.1 μm, the surface resistance of the electrode required for use as a solar cell is inadequate, while if the film thickness exceeds 2.0 μm, there are no problems in terms of physical properties; however, the usage of materials becomes greater than what is necessary, thereby resulting in a waste of material. In addition, the reason for limiting the baking temperature of the coated film formed on the base material to within a range from 130 to 400° C. is that if the temperature is lower than 130° C., together with the sintering of the metal nanoparticles being inadequate, it becomes difficult to dissociate or decompose (separation/combustion) the protective agent by heat when baking the protective agent, thereby, a large amount of organic residue remains within the electrode after baking, and the residue metamorphoses or deteriorates which results in a decrease in the electrical conductivity or the reflectance, while if the temperature exceeds 400° C., the production advantage of being a low temperature process is lost, or in other words, the production costs increase and the productivity decreases. Moreover, the reason for limiting the baking time of the coated film formed on the base material to within a range from 10 minutes to 1 hour is that if the baking time is shorter than 10 minutes, together with the sintering of the metal nanoparticles being inadequate, it becomes difficult to dissociate or decompose (separation/combustion) the protective agent by heat when baking the protective agent, thereby, a large amount of organic residue remains within the electrode after baking and the residue metamorphoses or which results in a decrease in the electrical conductivity or the reflectance, while if the baking time is longer than 1 hour, there are no effects on physical properties; however, production costs increase beyond what is necessary and the productivity decreases.

In the aforementioned dispersion of metal nanoparticles which is the electrode-forming composition, since the dispersion contains comparatively large metal nanoparticles having a primary particle diameter of 10 to 50 nm at a large amount, the specific surface area of the metal nanoparticles decreases and the proportion of the protective agent becomes smaller. As a result, when a solar cell electrode is formed using this electrode-forming composition, organic molecules in the protective agent are dissociated, decomposed, or dissociated together with decomposed by heat during baking, thereby, an electrode can be obtained which includes silver for a main component thereof and is substantially free of organic substance. Thus, even when the solar cell in which this electrode is formed is used for many years, there is no deterioration or degradation of organic substance; thereby, the electrical conductivity and the reflectance of the electrode are maintained at a high level. As a result, an electrode can be obtained that has superior long-term stability. More specifically, even after housing the electrode for 1000 hours in a constant temperature and humidity chamber in which the temperature is held at 100° C. and the humidity is held at 50%, the electrode can reflect 80% or more of electromagnetic waves having a wavelength of 750 to 1500 nm, namely electromagnetic waves from the visible light region to the infrared region, and also the electrical conductivity of the electrode, namely the volume resistivity of the electrode, can be maintained at an extremely low value of less than $2\times10^{-5}$ Ω·cm ($20\times10^{-6}$ Ω·cm). A solar cell using the electrode formed in this manner can maintain high levels of electrical conductivity and the reflectance even after being used for many years; therefore, superior long-term stability can be attained.

(Explanation of Embodiments According to [53] to [57])

Figure 3:
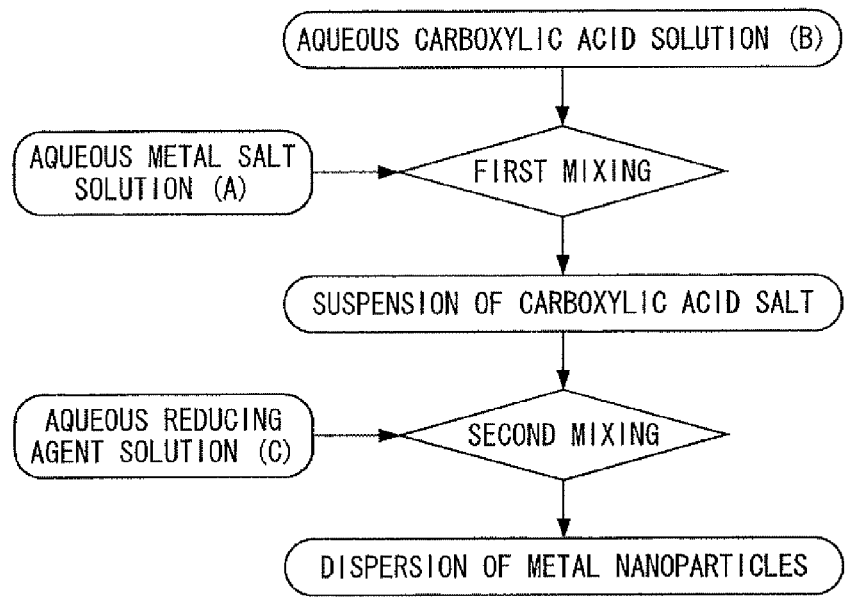
FIG. 3 is a drawing showing the flow of a production method according to other embodiment of the present invention.
Figure 4:
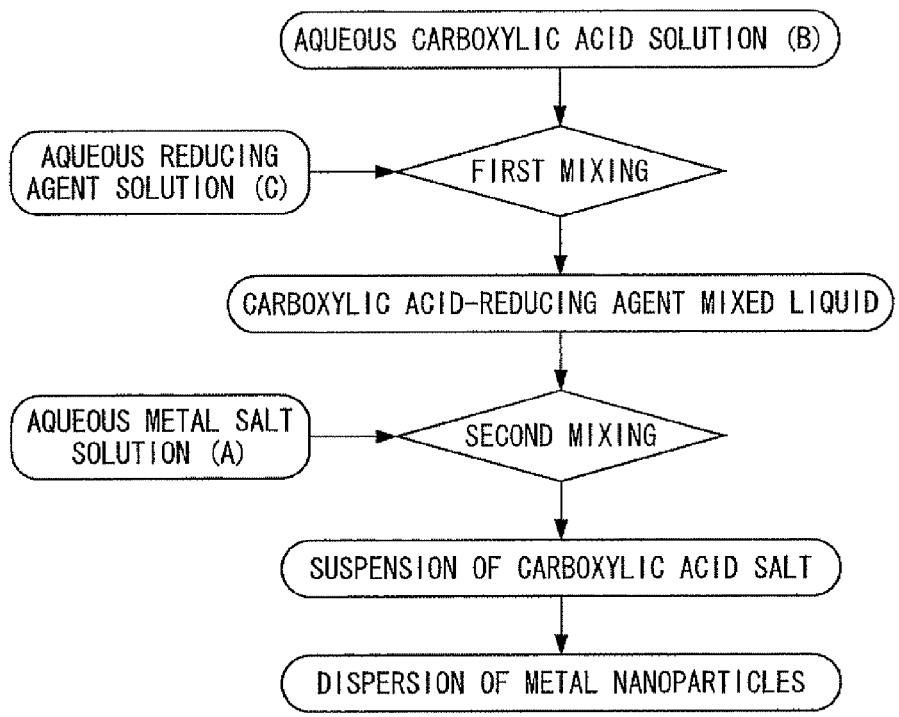
FIG. 4 is a drawing showing the flow of a production method according to other embodiment of the present invention.

As indicated in FIGS. 3 and 4, the embodiment of the synthesis method includes: preparing an aqueous metal salt solution A; preparing an aqueous carboxylic acid solution B; and preparing an aqueous reducing agent solution C.

<Aqueous Metal Salt Solution A Preparation Step>

Preparation of the aqueous metal salt solution A is carried out by dissolving a metal salt in water which is a solvent. Here, the metal salt to be dissolved contains at least silver salt. The aqueous metal salt solution A is prepared such that when the total amount of all metal elements contained in the metal salt is taken to be 100%, the silver accounts for 75% by mass or more. Accordingly, the proportion of silver to the metal elements may be 100% by mass; however, in the case where the metal salt contains a salt of metal other than silver salt, residual metal elements in the metal salt other than silver preferably include one type or two or more types of metals selected from the group consisting of gold, platinum, palladium, and ruthenium. As a result, the effect of controlling the reflectance and the volume resistivity is obtained as a result of synthesizing metal nanoparticles as a mixture of different metal nanoparticles, metal nanoparticles of an alloy, or metal nanoparticles having a so-called core-shell structure in which one of the elements forms a shell around a center portion formed of the other element.

<Aqueous Carboxylic Acid Solution B Preparation Step>

Preparation of the aqueous carboxylic acid solution B is carried out by dissolving a carboxylic acid in water which is a solvent. Here, the carboxylic acid to be dissolved is one type or two or more types of compounds selected from the group consisting of glycolic acid, citric acid, malic acid, maleic acid, malonic acid, fumaric acid, succinic acid, tartaric acid, and salts thereof The reason for limiting the carboxylic acid thereto is because these carboxylic acids favorably function as protective materials that modify the surface of the metal nanoparticles. Furthermore, they do not contain corrosive substances such as thiols and the like. Moreover, the pH during synthesis can be set to the basic side by converting these carboxylic acids to salts such as those of sodium, copper or ammonia.

<Aqueous Reducing Agent Solution C Preparation Step>

Preparation of the aqueous reducing agent solution C is carried out by dissolving a reducing agent in water which is a solvent. Here, the reducing agent to be dissolved is one type or two or more types of compounds selected from the group consisting of hydrazine, ascorbic acid, oxalic acid, formic acid, and salts thereof. As a result, the effects can be attained in which no corrosive substance is contained and the compound can be easily decomposed by baking even when the compound remains within the product of a paste.

On the other hand, the reducing agent to be dissolved in water which is the solvent may also be one type or two or more types of compounds selected from the group consisting of sodium borohydride, potassium borohydride, and glucose. In this case as well, the effects can also be attained in which no corrosive substance is contained and the compound can be easily decomposed by baking even when the compound remains within the product of a paste.

In the method for synthesizing metal nanoparticles in the present embodiment, the aqueous metal salt solution A, the aqueous carboxylic acid solution B, and the aqueous reducing agent solution C which are obtained in the aforementioned steps are mixed; however, the order in which they are mixed is such that the aqueous carboxylic acid solution B is first mixed with either one of the aqueous metal salt solution A and the aqueous reducing agent solution C to form a mixed liquid, and then the other one of the aqueous metal salt solution A and the aqueous reducing agent C is added to the resulting mixed liquid and is further mixed therewith. The following provides an explanation of the case of first mixing the aqueous carboxylic acid solution B with the aqueous metal salt solution A with reference to FIG. 3.

<First Mixing Step>

The aqueous carboxylic acid solution B is first mixed with the aqueous metal salt solution A. The mixing ratio is preferably such that the amount of carboxylic acid, the amount of carboxylic acid salt, or total amount of carboxylic acid and carboxylic acid salt contained in the aqueous carboxylic acid solution B is within a range from 0.3 to 3.0 mol relative to 1 mol of the metal element contained in the aqueous metal salt solution A. In addition, the mixing is preferably carried out within a temperature range of 25 to 95° C. at atmospheric pressure. When the aqueous carboxylic acid solution is mixed with the aqueous metal salt solution, poorly-soluble carboxylic acid salt precipitates and a suspension of a carboxylic acid salt is obtained. Accordingly, the mixing of the aqueous carboxylic acid solution B with the aqueous metal salt solution A is preferably carried out for an amount of time sufficient to obtain that suspension adequately.

<Second Mixing Step>

After obtaining the suspension in which the carboxylic acid salt precipitates, the aqueous reducing agent solution C is added to that suspension in the form of a mixed liquid and then is further mixed therewith. The mixing ratio is preferably such that the amount of reducing agent contained in the aqueous reducing agent solution C is within a range from 0.1 to 3.0 mol relative to 1 mol of the metal element serving as the raw material of the suspension. In addition, the mixing is preferably carried out within a temperature range of 25 to 95° C. at atmospheric pressure. When mixed at a temperature within this range, the mean particle diameter of the formed particles can be made to be 100 nm or less, which is preferable for achieving low volume resistivity at low temperatures. When the aqueous reducing agent solution is mixed into the suspension in this manner, which the metal salt is reduced, and metal nanoparticles are formed; thereby, a dispersion of metal nanoparticles is obtained.

The dispersion stability of a dispersion of silver nanoparticle after the reduction can be increased by removing excess salts using various separation techniques. Examples of excess salt separation techniques include a centrifugal separation, an ultrafiltration, and the use of an ion exchange membrane or an ion exchange resin. The volume resistivity of an electrode obtained by coating and baking these metal nanoparticles generally demonstrates a tendency to be closer to that of a bulk metal, the more the amount of the excess salts are removed.

In the method for synthesizing metal nanoparticles of the present embodiment which includes these steps, metal nanoparticles can be produced from an insoluble metal salt. In the present embodiment, all of the raw materials are composed of C, H, N, and O, with the exception of the raw material metal, sodium, calcium, and the like which are used to cause the carboxylic acid and the like to form a salt, and boron contained in the case of using sodium borohydride and the like for the reducing agent, and corrosive substances are not contained. Consequently, metal nanoparticles can be obtained that are suitable for use as electrically conductive materials without containing a corrosive substance. In addition, the metal nanoparticles synthesized according to the method of the present embodiment can be sintered at low temperatures. For example, in the case of silver nanoparticles, an electrode having a volume resistivity on the order of $10^{-6}$ Ω·cm or an electrically conductive reflective film having high reflectance characteristic of silver can be formed at low temperatures.

Here, in the aforementioned embodiment, the case is explained in which the aqueous carboxylic acid solution B is first mixed with the aqueous metal salt solution A; however, as shown in FIG. 4, the aqueous carboxylic acid solution B may first be mixed with the aqueous reducing agent solution C to form a mixed liquid of the carboxylic acid and the reducing agent, and then the aqueous salt solution A may be added to the resulting mixed liquid and further mixed therewith. In this case, the reduction reaction proceeds simultaneously with the precipitation of poorly-soluble salt at the stage where the aqueous metal salt solution is added to the mixed aqueous solution of the carboxylic acid and the reducing agent, and ultimately a dispersion of metal nanoparticles can be obtained. In this case as well, all of the raw materials consist of C, H, N, and O with the exception of the raw material metal, sodium, calcium, and the like which are used to cause the carboxylic acid and the like to form a salt, and boron contained in the case of using sodium borohydride and the like for the reducing agent, and corrosive substances are not contained. Consequently, metal nanoparticles can be obtained that are suitable for use as an electrically conductive material without containing a corrosive substance.

In the aforementioned embodiment, the case is explained in which each of the aqueous carboxylic acid solution B and the aqueous metal salt solution A is first prepared, and then they are mixed together; however, in the process of forming a mixed liquid by mixing the aqueous carboxylic acid solution B and the aqueous metal salt solution A, the case may also be included where the solute of the aqueous carboxylic acid solution B is preliminarily mixed with the solute of the aqueous metal salt A, and then the mixed solutes are dissolved by adding water thereto. Similarly, as shown in FIG. 4, in the process of first forming a mixed liquid of the carboxylic acid and the reducing agent by preliminarily mixing the aqueous carboxylic acid solution B and the aqueous reducing agent solution C, the case may also be included where the solute of the aqueous carboxylic acid solution B is preliminarily mixed with the solute of the aqueous reducing agent solution C, and then the mixed solutes are dissolved by adding water thereto.

Next, an explanation is provided for a method for producing a metal film using metal nanoparticles obtained according to the method for synthesizing metal nanoparticles described above. More specifically, this method for producing a metal film includes: a dispersion step in which metal nanoparticles obtained according to the synthesis method are dispersed in a dispersion medium to obtain a dispersion of metal nanoparticles; and a metal film formation step in which the dispersion of metal nanoparticles is used as a metal-film-producing composition and is coated on a base material by a wet coating process to form a metal film. These steps are explained below in detail.

<Dispersion Step>

In this step, the metal nanoparticles obtained according to the method described above are added to a dispersion medium and are further mixed therewith; thereby, the particles are dispersed in the dispersion medium to prepare a dispersion of metal nanoparticles. The dispersion is prepared so that the content of metal nanoparticles including silver nanoparticles in the dispersion is within a range from 2.5 to 95.0% by mass and preferably within a range from 3.5 to 90.0% by mass based on a value of 100% by mass for the composition composed of the metal nanoparticles and the dispersion medium. The dispersion medium contains water at a content of 1% by mass or more and preferably 2% by mass or more and alcohol at a content of 2% by mass or more and preferably 3% by mass or more based on a value of 100% by mass for the total dispersion medium. For example, in the case where the dispersion medium is composed only of water and alcohol, when the dispersion medium contains 2% by mass of water, it contains 98% by mass of alcohol, and when the dispersion medium contains 2% by mass of alcohol, it contains 98% by mass of water. Here, the reason for limiting the content of metal nanoparticles including silver nanoparticles to within a range from 2.5 to 95.0% by mass based on a value of 100% by mass for the composition composed of the metal nanoparticles and the dispersion medium is that, if the content is less than 2.5% by mass, there are no particular effects on properties of a metal film after baking; however, it becomes difficult to obtain a metal film having a required thickness, while if the content exceeds 95.0% by mass, the required fluidity for use as an ink or a paste during wet coating of the composition ends up being lost. In addition, the reason for limiting the content of water to 1% by mass or more based on a value of 100% by mass for the total dispersion medium is that, if the water content is less than 1% by mass, it becomes difficult to sinter at low temperatures a film obtained by coating the composition by wet coating, and the electrical conductivity and the reflectance of the metal film end up decreasing after baking. The reason for limiting the content of alcohol to 2% by mass or more based on a value of 100% for the total dispersion medium is that, if the content of alcohol is less than 2% by mass, it also becomes difficult to sinter at low temperatures a film obtained by coating the composition by wet coating in the same manner as described above, and the electrical conductivity and the reflectance of the metal film end up decreasing after baking.

In addition, the aforementioned alcohol is preferably one type or two or more types selected from the group consisting of methanol, ethanol, propanol, butanol, ethylene glycol, propylene glycol, diethylene glycol, glycerol, isobornyl alcohol, and erythritol.

As a result of going through the aforementioned steps, a dispersion can be obtained in which metal nanoparticles are dispersed, and the shape and the particle diameter of the metal nanoparticles are controlled over a wide range.

<Metal Film Formation Step>

In this step, a metal film is formed using the dispersion of metal nanoparticles described above. First, the aforementioned dispersion of metal nanoparticles is used as a metal-film-forming composition and is coated on a base material by a wet coating process. The coating by this wet coating process involves forming a film such that the thickness of the film after baking will become within a range from 0.1 to 2.0 μm and preferably within a range from 0.3 to 1.5 μm. The aforementioned base material can be a substrate composed of either one of silicon, glass, ceramics containing a transparent electrically conductive material, polymer material, and metal, or can be a laminate of two or more types of materials selected from the group consisting of silicon, glass, ceramics containing a transparent electrically conductive material, polymer material, and metal. In addition, the base material is preferably either one of a solar cell element and a solar cell element having a transparent metal film. Examples of the transparent metal films include indium tin oxide (ITO), antimony tin oxide (ATO), tin oxide ($SnO_2$: NESA), indium zinc oxide (IZO), and aluminum-doped zinc oxide (AZO). The aforementioned metal-film-forming composition is preferably coated on the surface of a photoelectric converting semiconductor layer of a solar cell element or on the surface of a transparent metal film of a solar cell element having a transparent metal film. Moreover, the wet coating process is particularly preferably any one of spray coating, dispenser coating, spin coating, knife coating, slit coating, ink jet coating, screen printing, offset printing, and die coating; however, the method to be used is not limited thereto, and any method can be used. The spray coating is a method which includes coating the metal-film-forming composition in the form of a mist on the base material using compressed air, or coating the metal-film-forming composition in the form of a mist on the base material by pressurizing the metal-film-forming composition itself. The dispenser coating is a method which includes, for example, while placing the metal-film-forming composition in a syringe, and pressing on the piston of this syringe so as to discharge the metal-film-forming composition from a fine nozzle on the end of the syringe, coating the composition on the base material. The spin coating is a method which includes dropping the metal-film-forming composition on a rotating base material, and allowing the dropped metal-film-forming composition to spread towards the edges of the base material by a centrifugal force. The knife coating is a method which includes providing a base material at a prescribed gap from the edge of a knife so as to be able to move in the horizontal direction, supplying the metal-film-forming composition on the base material on the upstream side of the knife, and then moving the base material horizontally in the downstream direction. The slit coating is a method which includes coating the metal-film-forming composition on a base material by flowing the metal-film-forming composition out from a narrow slit. The ink jet coating is a method which includes filling the metal-film-forming composition into an ink cartridge of a commercially available ink jet printer, and then ink-jet printing the composition on the base material. The screen printing is a method in which sand is used as a pattern indicator, a fabricated print image is passed over the sand, and the metal-film-forming composition is transferred to the base material. The offset printing is a printing method that utilizes the water repellency of an ink and includes temporarily transferring the metal-film-forming composition affixed to a block to a rubber sheet without attaching directly to a base material, and then transferring from the rubber sheet to the base material. The die coating is a method which includes distributing the metal-film-forming composition supplied into a die using a manifold, extruding on a base material through a slit, and coating on the surface of a moving base material. The examples of the die coating include slot coating, slide coating, and curtain coating methods.

Next, the base material having a film formed on the upper surface thereof is baked in air at a temperature of 130 to 400° C. and preferably 140 to 200° C. for 10 minutes to 1 hour and preferably for 15 to 40 minutes. Here, the reason for limiting the thickness of the coated film formed on the base material after baking to within a range from 0.1 to 2.0 μm is that if the film thickness is less than 0.1 μm, the surface resistance of the metal film required for use as a solar cell is inadequate, while if the film thickness exceeds 2.0 μm, there are no problems in terms of physical properties; however, the usage of materials becomes greater than what is necessary, thereby resulting in a waste of material. In addition, the reason for limiting the baking temperature of the coated film formed on the base material to within a range from 130 to 400° C. is that if the temperature is lower than 130° C., the sintering of the metal nanoparticles is inadequate, while if the temperature exceeds 400° C., the production advantage of being a low temperature process is lost, or in other words, the production costs increase and the productivity decreases. Moreover, the reason for limiting the baking time of the coated film formed on the base material to within a range from 10 minutes to 1 hour is that if the baking time is shorter than 10 minutes, the sintering of the metal nanoparticles is inadequate, while if the baking time is longer than 1 hour, there are no effects on physical properties; however, production costs increase beyond what is necessary and the productivity decreases.

In the aforementioned dispersion of metal nanoparticles which is the metal-film-forming composition, since the dispersion contains comparatively large metal nanoparticles having a primary particle diameter of 10 to 50 nm at a large amount, the specific surface area of the metal nanoparticles decreases. As a result, when a metal film of a solar cell is formed using this metal-film-forming composition, a metal film can be obtained which includes silver for a main component thereof and is substantially free of organic substance. Thus, even when the solar cell in which this metal film is formed is used for many years, there is no deterioration or degradation of organic substance; thereby, the electrical conductivity and the reflectance of the metal film are maintained at a high level. As a result, an metal film can be obtained that has superior long-term stability. More specifically, even after housing the metal film for 1000 hours in a constant temperature and humidity chamber in which the temperature is held at 100° C. and the humidity is held at 50%, the metal film can reflect 80% or more of electromagnetic waves having a wavelength of 750 to 1500 nm, namely electromagnetic waves from the visible light region to the infrared region, and also the electrical conductivity of the metal film, namely the volume resistivity of the metal film, can be maintained at an extremely low value of less than $2 \times 10^{-5}$ Ω·cm ($20 \times 10^{-6}$ Ω·cm). A solar cell using the metal film formed in this manner can maintain high levels of electrical conductivity and the reflectance even after being used for many years; therefore, superior long-term stability can be attained.

(Explanation of Embodiments According to [58] to [62])

Figure 5:
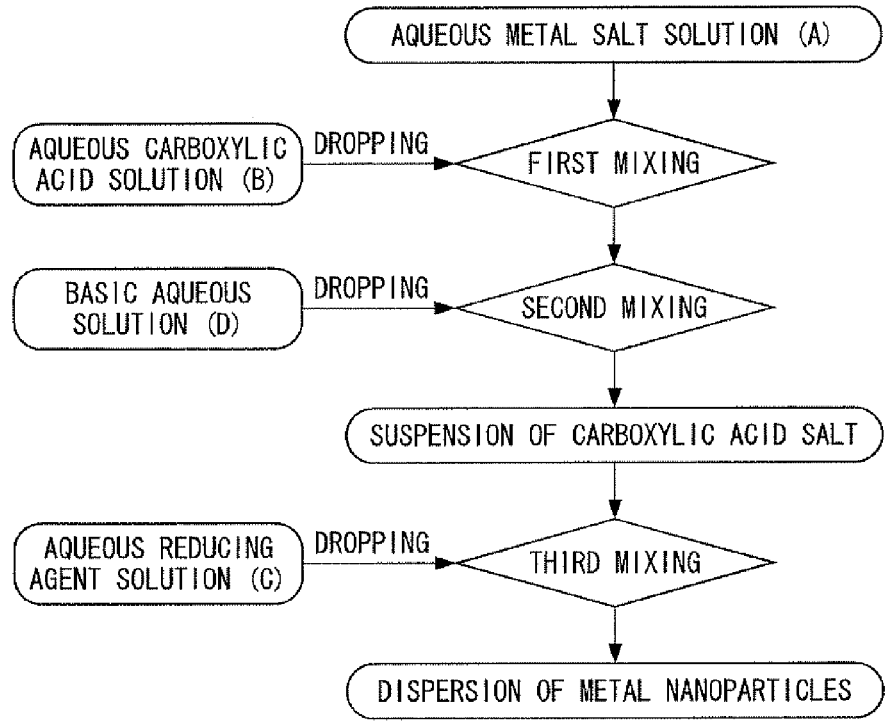
FIG. 5 is a drawing showing the flow of a production method according to other embodiment of the present invention.

As indicated in FIG. 5, the embodiment of the synthesis method includes: preparing an aqueous metal salt solution A; preparing an aqueous carboxylic acid solution B; preparing an aqueous reducing agent solution C; and preparing a basic aqueous solution D.

<Aqueous Metal Salt Solution A Preparation Step>

Preparation of the aqueous metal salt solution A is carried out by dissolving a metal salt in water which is a solvent. It is preferable to dissolve the metal salt in deionized water to prepare a saturated aqueous solution at room temperature. Here, the metal salt to be dissolved contains at least silver salt. The aqueous metal salt solution A is prepared such that when the total amount of all metal elements contained in the metal salt is taken to be 100%, the silver accounts for 75% by mass or more. Accordingly, the proportion of silver to the metal elements may be 100% by mass; however, in the case where the metal salt contains a salt of metal other than silver salt, residual metal elements in the metal salt other than silver preferably include one type or two or more types of metals selected from the group consisting of gold, platinum, palladium, and ruthenium. As a result, the effect of controlling the reflectance and the volume resistivity is obtained as a result of synthesizing metal nanoparticles as a mixture of different metal nanoparticles, metal nanoparticles of an alloy, or metal nanoparticles having a so-called core-shell structure in which one of the elements forms a shell around a center portion formed of the other element.

<Aqueous Carboxylic Acid Solution B Preparation Step>

Preparation of the aqueous carboxylic acid solution B is carried out by dissolving a carboxylic acid in water which is a solvent. It is preferable to dissolve the carboxylic acid in deionized water to prepare a saturated aqueous solution at room temperature. Here, the carboxylic acid to be dissolved is one type or two or more types of compounds selected from the group consisting of glycolic acid, citric acid, malic acid, maleic acid, malonic acid, fumaric acid, succinic acid, tartaric acid, and salts thereof The reason for limiting the carboxylic acid thereto is because these carboxylic acids favorably function as protective materials that modify the surface of the metal nanoparticles. Furthermore, they do not contain corrosive substances such as thiols and the like.

Moreover, the pH during synthesis can be set to the basic side by converting these carboxylic acids to salts such as those of sodium, copper or ammonia.

<Aqueous Reducing Agent Solution C Preparation Step>

Preparation of the aqueous reducing agent solution C is carried out by dissolving a reducing agent in water which is a solvent. It is preferable to dissolve the reducing agent in deionized water to prepare a saturated aqueous solution at room temperature. Here, the reducing agent to be dissolved is one type or two or more types of compounds selected from the group consisting of hydrazine, ascorbic acid, oxalic acid, formic acid, and salts thereof As a result, the effects can be attained in which no corrosive substance is contained and the compound can be easily decomposed by baking even when the compound remains within the product of a paste.

On the other hand, the reducing agent dissolved in the solvent in the form of water may also be one type or two or more types of compounds selected from the group consisting of sodium borohydride, potassium borohydride and glucose. In this case as well, the effects can be attained in which no corrosive substance is contained and the compound can be easily decomposed by baking even when the compound remains within the product of a paste.

<Basic Aqueous Solution D Preparation Step>

Preparation of the basic aqueous solution D is carried out by dissolving a basic compound in water which is a solvent. The solution is prepared such that the concentration of the basic compound is adjusted to within a range from 1 to 5 M, for main reasons of the ease of handling and preparation; however, the concentration is not particularly limited to this range. Here, examples of the basic compound to be dissolved include sodium hydroxide, potassium hydroxide, ammonia, and the like.

<First Mixing Step>

The aqueous carboxylic acid solution B is first dropped into the aqueous metal salt solution A while stirring to form a mixed liquid. Metal ions form carboxylic acid complexes in the formed mixed liquid as a result of dropping the aqueous carboxylic acid solution B into the aqueous metal salt solution A while stirring. The dropping and mixing ratio is preferably such that the amount of carboxylic acid, the amount of carboxylic acid salt, or the total amount of carboxylic acid and carboxylic acid salt contained in the aqueous carboxylic acid solution B is within a range from 0.3 to 3 mol relative to 1 mol of the metal element contained in the aqueous metal salt solution A. If the proportion of the dropped amount is less than the lower limit of the above-described range, the particle diameter of the formed nanoparticles increases; thereby, the problem of increased specific resistance is caused. If the proportion of the dropped amount exceeds the upper limit of the above-described range, unnecessary amount of the aqueous carboxylic acid solution B is excessively dropped in, resulting in the problem of increased costs. In addition, it is preferable to drop the aqueous carboxylic acid solution B into the aqueous metal salt solution A and to stir them within a temperature range of 25 to 95° C. at atmospheric pressure.

<Second Mixing Step>

The basic aqueous solution D is dropped into the mixed liquid while stirring to form a suspension of carboxylic acid salt. As a result of dropping the basic aqueous solution D into the mixed liquid while stirring, the solubility of the metal complexes in the formed suspension of a carboxylic acid salt decreases, and the majority of the metal complexes precipitate in the form of carboxylic acid salt. The dropping and mixing ratio is preferably such that the amount of the basic compound contained in the basic aqueous solution D is within a range from 0.3 to 3.0 mol relative to 1 mol of the metal elements serving as raw material of the mixed liquid. If the proportion of the dropped amount is less than the lower limit of the above-described range, the particle diameter of the formed nanoparticles increases; thereby, the problem of increased specific resistance is caused. If the proportion of the dropped amount exceeds the upper limit of the above-described range, unnecessary amount of the basic aqueous solution D is excessively dropped in, resulting in the problem of increased costs. In addition, it is preferable to drop the basic aqueous solution D into the mixed liquid and to stir them within a temperature range of 25 to 95° C. at atmospheric pressure. When the basic aqueous solution D is dropped into the mixed liquid while stirring, poorly-soluble carboxylic acid salt precipitates and a suspension of a carboxylic acid salt is obtained. Accordingly, the stirring after dropping the aqueous basic solution D into the mixed liquid is preferably carried out for an amount of time sufficient to obtain that suspension adequately.

<Third Mixing Step>

After obtaining the suspension in which the carboxylic acid salt precipitates, the aqueous reducing agent solution C is dropped into the suspension while stirring to form metal nanoparticles. Namely, as a result of dropping the aqueous reducing agent solution C into the suspension of carboxylic acid salt while stirring, the precipitated carboxylic acid salt is reduced; thereby, the technical effect of forming metal nanoparticles can be realized. The dropping and mixing ratio is preferably such that the amount of the reducing agent contained in the aqueous reducing agent solution C is within a range from 0.1 to 3.0 mol relative to 1 mol of the metal element serving as the raw material of the suspension. If the proportion of the dropped amount is less than the lower limit of the above-described range, the problem of decreased yield occurs. If the proportion of the dropped amount exceeds the upper limit of the above-described range, unnecessary amount of the aqueous reducing agent solution C is excessively dropped in, resulting in the problem of increased costs. In addition, the dropping of the aqueous reducing solution C into the suspension of a carboxylic acid salt and the stirring are carried out within a temperature range of 25 to 95° C. at atmospheric pressure. When stirring within this temperature range, the mean particle diameter of the formed particles can be made to be 100 nm or less. When using a dispersion containing the resulting metal nanoparticles having the mean particle diameter within that range as an electrode-forming composition and forming a film, low volume resistivity can be achieved at low temperatures. In addition, it is preferable to drop the aqueous reducing agent solution C into the suspension of a carboxylic acid salt within 10 minutes. If the rate of dropping is slow such that the dropping time exceeds the upper limit of the above-described range, the particle diameter of the formed nanoparticles increases; thereby, the problem of increased specific resistance is caused. As a result of dropping the aqueous reducing agent solution C into this suspension while stirring within a prescribed temperature range in this manner, the metal salt is reduced and metal nanoparticles can be formed.

The dispersion stability can be increased by removing excess salts from the reaction liquid containing metal nanoparticles after the reduction using various separation techniques. Examples of excess salt separation techniques include a centrifugal separation, an ultrafiltration, and the use of an ion exchange membrane or an ion exchange resin. The volume resistivity of an electrode obtained by coating and baking these metal nanoparticles generally demonstrates a tendency to be closer to that of a bulk metal, the more the amount of the excess salts are removed.

In the method for synthesizing metal nanoparticles of the present embodiment which includes these steps, metal nanoparticles can be produced from an insoluble metal salt. In the present embodiment, all of the raw materials are composed of C, H, N, and O, with the exception of the raw material metal, sodium, calcium, and the like which are used to cause the carboxylic acid and the like to form a salt or to serve as a basic compound in the basic aqueous solution, and boron contained in the case of using sodium borohydride and the like for the reducing agent, and corrosive substances are not contained. Consequently, metal nanoparticles can be obtained that are suitable for use as electrically conductive materials without containing a corrosive substance. In addition, the metal nanoparticles synthesized according to the method of the present embodiment can be sintered at low temperatures. For example, in the case of silver nanoparticles, an electrode having a volume resistivity on the order of $10^{-6}$ Ω·cm or an electrically conductive reflective film having high reflectance characteristic of silver can be formed at low temperatures.

In the aforementioned embodiment, the case is explained in which each of the aqueous carboxylic acid solution B and the aqueous metal salt solution A is first prepared, and then they are mixed together; however, in the process of forming a mixed liquid by mixing the aqueous metal salt solution A and the aqueous carboxylic acid solution B, the case may also be included where the solute of the aqueous metal salt A is preliminarily mixed with the solute of the aqueous carboxylic acid solution B, and then the mixed solutes are dissolved by adding water thereto.

Next, an explanation is provided for a method for producing a metal film using metal nanoparticles obtained according to the method for synthesizing metal nanoparticles described above. More specifically, this method for producing a metal film includes: a dispersion step in which metal nanoparticles obtained according to the synthesis method are dispersed in a dispersion medium to obtain a dispersion of metal nanoparticles; and a metal film formation step in which the dispersion of metal nanoparticles is used as a metal-film-producing composition and is coated on a base material by a wet coating process to form a metal film. These steps are explained below in detail.

<Dispersion Step>

In this step, the metal nanoparticles obtained according to the method described above are added to a dispersion medium and are further mixed therewith; thereby, the particles are dispersed in the dispersion medium to prepare a dispersion of metal nanoparticles. The dispersion is prepared so that the content of metal nanoparticles including silver nanoparticles in the dispersion is within a range from 2.5 to 95.0% by mass and preferably within a range from 3.5 to 90.0% by mass based on a value of 100% by mass for the composition composed of the metal nanoparticles and the dispersion medium. The dispersion medium contains water at a content of 1% by mass or more and preferably 2% by mass or more and alcohol at a content of 2% by mass or more and preferably 3% by mass or more based on a value of 100% by mass for the total dispersion medium. For example, in the case where the dispersion medium is composed only of water and alcohol, when the dispersion medium contains 2% by mass of water, it contains 98% by mass of alcohol, and when the dispersion medium contains 2% by mass of alcohol, it contains 98% by mass of water. Here, the reason for limiting the content of metal nanoparticles including silver nanoparticles to within a range from 2.5 to 95.0% by mass based on a value of 100% by mass for the composition composed of the metal nanoparticles and the dispersion medium is that, if the content is less than 2.5% by mass, there are no particular effects on properties of a metal film after baking; however, it becomes difficult to obtain a metal film having a required thickness, while if the content exceeds 95.0% by mass, the required fluidity for use as an ink or a paste during wet coating of the composition ends up being lost. In addition, the reason for limiting the content of water to 1% by mass or more based on a value of 100% by mass for the total dispersion medium is that, if the water content is less than 1% by mass, it becomes difficult to sinter at low temperatures a film obtained by coating the composition by wet coating, and the electrical conductivity and the reflectance of the metal film end up decreasing after baking. The reason for limiting the content of alcohol to 2% by mass or more based on a value of 100% for the total dispersion medium is that, if the content of alcohol is less than 2% by mass, it also becomes difficult to sinter at low temperatures a film obtained by coating the composition by wet coating in the same manner as described above, and the electrical conductivity and the reflectance of the metal film end up decreasing after baking.

In addition, the aforementioned alcohol is preferably one type or two or more types selected from the group consisting of methanol, ethanol, propanol, butanol, ethylene glycol, propylene glycol, diethylene glycol, glycerol, isobornyl alcohol, and erythritol.

As a result of going through the aforementioned steps, a dispersion can be obtained in which metal nanoparticles are dispersed, and the shape and the particle diameter of the metal nanoparticles are controlled over a wide range.

<Metal Film Formation Step>

In this step, a metal film is formed using the dispersion of metal nanoparticles described above. First, the aforementioned dispersion of metal nanoparticles is used as a metal-film-forming composition and is coated on a base material by a wet coating process. The coating by this wet coating process involves forming a film such that the thickness of the film after baking will become within a range from 0.1 to 2.0 μm and preferably within a range from 0.3 to 1.5 μm. The aforementioned base material can be a substrate composed of either one of silicon, glass, ceramics containing a transparent electrically conductive material, polymer material, and metal, or can be a laminate of two or more types of materials selected from the group consisting of silicon, glass, ceramics containing a transparent electrically conductive material, polymer material, and metal. In addition, the base material is preferably either one of a solar cell element and a solar cell element having a transparent metal film. Examples of the transparent metal films include indium tin oxide (ITO), antimony tin oxide (ATO), tin oxide ($SnO_2$: NESA), indium zinc oxide (IZO), and aluminum-doped zinc oxide (AZO). The aforementioned metal-film-forming composition is preferably coated on the surface of a photoelectric converting semiconductor layer of a solar cell element or on the surface of a transparent metal film of a solar cell element having a transparent metal film. Moreover, the wet coating process is particularly preferably any one of spray coating, dispenser coating, spin coating, knife coating, slit coating, ink jet coating, screen printing, offset printing, and die coating; however, the method to be used is not limited thereto, and any method can be used. The spray coating is a method which includes coating the metal-film-forming composition in the form of a mist on the base material using compressed air, or coating the metal-film-forming composition in the form of a mist on the base material by pressurizing the metal-film-forming composition itself. The dispenser coating is a method which includes, for example, while placing the metal-film-forming composition in a syringe, and pressing on the piston of this syringe so as to discharge the metal-film-forming composition from a fine nozzle on the end of the syringe, coating the composition on the base material. The spin coating is a method which includes dropping the metal-film-forming composition on a rotating base material, and allowing the dropped metal-film-forming composition to spread towards the edges of the base material by a centrifugal force. The knife coating is a method which includes providing a base material at a prescribed gap from the edge of a knife so as to be able to move in the horizontal direction, supplying the metal-film-forming composition on the base material on the upstream side of the knife, and then moving the base material horizontally in the downstream direction. The slit coating is a method which includes coating the metal-film-forming composition on a base material by flowing the metal-film-forming composition out from a narrow slit. The ink jet coating is a method which includes filling the metal-film-forming composition into an ink cartridge of a commercially available ink jet printer, and then ink-jet printing the composition on the base material. The screen printing is a method in which sand is used as a pattern indicator, a fabricated print image is passed over the sand, and the metal-film-forming composition is transferred to the base material. The offset printing is a printing method that utilizes the water repellency of an ink and includes temporarily transferring the metal-film-forming composition affixed to a block to a rubber sheet without attaching directly to a base material, and then transferring from the rubber sheet to the base material. The die coating is a method which includes distributing the metal-film-forming composition supplied into a die using a manifold, extruding on a base material through a slit, and coating on the surface of a moving base material. The examples of the die coating include slot coating, slide coating, and curtain coating methods.

Next, the base material having a film formed on the upper surface thereof is baked in air at a temperature of 130 to 400° C. and preferably 140 to 200° C. for 10 minutes to 1 hour and preferably for 15 to 40 minutes. Here, the reason for limiting the thickness of the coated film formed on the base material after baking to within a range from 0.1 to 2.0 μm is that if the film thickness is less than 0.1 μm, the surface resistance of the metal film required for use as a solar cell is inadequate, while if the film thickness exceeds 2.0 μm, there are no problems in terms of physical properties; however, the usage of materials becomes greater than what is necessary, thereby resulting in a waste of material. In addition, the reason for limiting the baking temperature of the coated film formed on the base material to within a range from 130 to 400° C. is that if the temperature is lower than 130° C., the sintering of the metal nanoparticles is inadequate, while if the temperature exceeds 400° C., the production advantage of being a low temperature process is lost, or in other words, the production costs increase and the productivity decreases. Moreover, the reason for limiting the baking time of the coated film formed on the base material to within a range from 10 minutes to 1 hour is that if the baking time is shorter than 10 minutes, the sintering of the metal nanoparticles is inadequate, while if the baking time is longer than 1 hour, there are no effects on physical properties; however, production costs increase beyond what is necessary and the productivity decreases.

In the aforementioned dispersion of metal nanoparticles which is the metal-film-forming composition, since the dispersion contains comparatively large metal nanoparticles having a primary particle diameter of 10 to 50 nm at a large amount, the specific surface area of the metal nanoparticles decreases. As a result, when a metal film of a solar cell is formed using this metal-film-forming composition, a metal film can be obtained which includes silver for a main component thereof and is substantially free of organic substance. Thus, even when the solar cell in which this metal film is formed is used for many years, there is no deterioration or degradation of organic substance; thereby, the electrical conductivity and the reflectance of the metal film are maintained at a high level. As a result, an metal film can be obtained that has superior long-term stability. More specifically, even after housing the metal film for 1000 hours in a constant temperature and humidity chamber in which the temperature is held at 100° C. and the humidity is held at 50%, the metal film can reflect 80% or more of electromagnetic waves having a wavelength of 750 to 1500 nm, namely electromagnetic waves from the visible light region to the infrared region, and also the electrical conductivity of the metal film, namely the volume resistivity of the metal film, can be maintained at an extremely low value of less than $2 \times 10^{-5}$ Ω·cm ($20 \times 10^{-6}$ Ω·cm). A solar cell using the metal film formed in this manner can maintain high levels of electrical conductivity and the reflectance even after being used for many years; therefore, superior long-term stability can be attained.

(Explanation of Embodiments According to [63] to [67])

Figure 6:
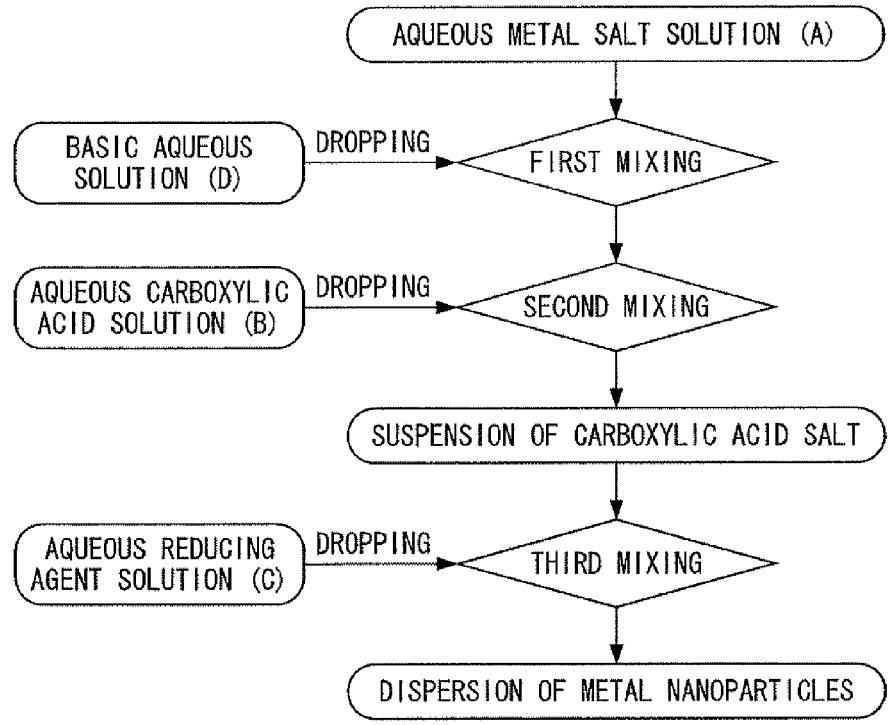
FIG. 6 is a drawing showing the flow of a production method according to other embodiment of the present invention.

As indicated in FIG. 6, the embodiment of the synthesis method includes: preparing an aqueous metal salt solution A; preparing an aqueous carboxylic acid solution B; preparing an aqueous reducing agent solution C; and preparing a basic aqueous solution D.

<Aqueous Metal Salt Solution A Preparation Step>

Preparation of the aqueous metal salt solution A is carried out by dissolving a metal salt in water which is a solvent. It is preferable to dissolve the metal salt in deionized water to prepare a saturated aqueous solution at room temperature. Here, the metal salt to be dissolved contains at least silver salt. The aqueous metal salt solution A is prepared such that when the total amount of all metal elements contained in the metal salt is taken to be 100%, the silver accounts for 75% by mass or more. Accordingly, the proportion of silver to the metal elements may be 100% by mass; however, in the case where the metal salt contains a salt of metal other than silver salt, residual metal elements in the metal salt other than silver preferably include one type or two or more types of metals selected from the group consisting of gold, platinum, palladium, and ruthenium. As a result, the effect of controlling the reflectance and the volume resistivity is obtained as a result of synthesizing metal nanoparticles as a mixture of different metal nanoparticles, metal nanoparticles of an alloy, or metal nanoparticles having a so-called core-shell structure in which one of the elements forms a shell around a center portion formed of the other element.

<Aqueous Carboxylic Acid Solution B Preparation Step>

Preparation of the aqueous carboxylic acid solution B is carried out by dissolving a carboxylic acid in water which is a solvent. It is preferable to dissolve the carboxylic acid in deionized water to prepare a saturated aqueous solution at room temperature. Here, the carboxylic acid to be dissolved is one type or two or more types of compounds selected from the group consisting of glycolic acid, citric acid, malic acid, maleic acid, malonic acid, fumaric acid, succinic acid, tartaric acid, and salts thereof. The reason for limiting the carboxylic acid thereto is because these carboxylic acids favorably function as protective materials that modify the surface of the metal nanoparticles. Furthermore, they do not contain corrosive substances such as thiols and the like. Moreover, the pH during synthesis can be set to the basic side by converting these carboxylic acids to salts such as those of sodium, copper or ammonia.

<Aqueous Reducing Agent Solution C Preparation Step>

Preparation of the aqueous reducing agent solution C is carried out by dissolving a reducing agent in water which is a solvent. It is preferable to dissolve the reducing agent in deionized water to prepare a saturated aqueous solution at room temperature. Here, the reducing agent to be dissolved is one type or two or more types of compounds selected from the group consisting of hydrazine, ascorbic acid, oxalic acid, formic acid, and salts thereof As a result, the effects can be attained in which no corrosive substance is contained and the compound can be easily decomposed by baking even when the compound remains within the product of a dispersion.

On the other hand, the reducing agent dissolved in the solvent in the form of water may also be one type or two or more types of compounds selected from the group consisting of sodium borohydride, potassium borohydride and glucose. In this case as well, the effects can be attained in which no corrosive substance is contained and the compound can be easily decomposed by baking even when the compound remains within the product of a dispersion.

<Basic Aqueous Solution D Preparation Step>

Preparation of the basic aqueous solution D is carried out by dissolving a basic compound in water which is a solvent. The solution is prepared such that the concentration of the basic compound is adjusted to within a range from 1 to 5 M, for main reasons of the ease of handling and preparation; however, the concentration is not particularly limited to this range. Here, examples of the basic compound to be dissolved include sodium hydroxide, potassium hydroxide, ammonia, and the like.

<First Mixing Step>

The basic aqueous solution D is first dropped into the aqueous metal salt solution A while stirring to form a mixed liquid. As a result of dropping the basic aqueous solution D into the aqueous metal salt solution A while stirring, the mixed liquid is prepared of which the pH is adjusted so as to improve the yield of the carboxylic acid salt precipitated in the next step. The dropping and mixing ratio is preferably such that the amount of the basic compound contained in the basic aqueous solution D is within a range from 0.3 to 3 mol relative to 1 mol of the metal element contained in the aqueous metal salt solution A. If the proportion of the dropped amount is less than the lower limit of the above-described range, the particle diameter of the formed nanoparticles increases; thereby, the problem of specific resistance is caused. If the proportion of the dropped amount exceeds the upper limit of the above-described range, unnecessary amount of the aqueous carboxylic acid solution B is excessively dropped in, resulting in the problem of increased costs. In addition, it is preferable to drop the basic aqueous solution D into the aqueous metal salt solution A and and to stir them within a temperature range of 25 to 95° C. at atmospheric pressure.

<Second Mixing Step>

The aqueous carboxylic acid solution B is dropped into the mixed liquid while stirring to form a suspension of carboxylic acid salt. As a result of dropping the aqueous carboxylic acid solution B into the mixed liquid while stirring, a suspension of a carboxylic acid salt is formed in which carboxylic acid salt is precipitated at high yield. The dropping and mixing ratio is preferably such that the amount of carboxylic acid, the amount of carboxylic acid salt, or the total amount of carboxylic acid and carboxylic acid salt contained in the aqueous carboxylic acid solution B is within a range from 0.3 to 3.0 mol relative to 1 mol of the metal elements serving as raw material of the mixed liquid. If the proportion of the dropped amount is less than the lower limit of the above-described range, the particle diameter of the formed nanoparticles increases; thereby, the problem of increased specific resistance is caused. If the proportion of the dropped amount exceeds the upper limit of the above-described range, unnecessary amount of the basic aqueous solution D is excessively dropped in, resulting in the problem of increased costs. In addition, it is preferable to drop the aqueous carboxylic acid solution B into the mixed liquid and to stir them within a temperature range of 25 to 95° C. at atmospheric pressure. When the aqueous carboxylic acid solution B is dropped into the mixed liquid while stirring, poorly-soluble carboxylic acid salt precipitates and a suspension of a carboxylic acid salt is obtained. Accordingly, the stirring after dropping the aqueous carboxylic acid solution B into the mixed liquid is preferably carried out for an amount of time sufficient to obtain that suspension adequately.

<Third Mixing Step>

After obtaining the suspension in which the carboxylic acid salt precipitates, the aqueous reducing agent solution C is dropped into the suspension while stirring to form metal nanoparticles. Namely, as a result of dropping the aqueous reducing agent solution C into the suspension of carboxylic acid salt while stirring, the precipitated carboxylic acid salt is reduced; thereby, the technical effect of forming metal nanoparticles can be realized. The dropping and mixing ratio is preferably such that the amount of the reducing agent contained in the aqueous reducing agent solution C is within a range from 0.1 to 3.0 mol relative to 1 mol of the metal element serving as the raw material of the suspension. If the proportion of the dropped amount is less than the lower limit of the above-described range, the problem of decreased yield occurs. If the proportion of the dropped amount exceeds the upper limit of the above-described range, unnecessary amount of the aqueous reducing agent solution C is excessively dropped in, resulting in the problem of increased costs. In addition, the dropping of the aqueous reducing solution C into the suspension of a carboxylic acid salt and the stirring are carried out within a temperature range of 25 to 95° C. at atmospheric pressure. When stirring within this temperature range, the mean particle diameter of the formed particles can be made to be 100 nm or less. When using a dispersion containing the resulting metal nanoparticles having the mean particle diameter within that range as an electrode-forming composition and forming a film, low volume resistivity can be achieved at low temperatures. In addition, it is preferable to drop the aqueous reducing agent solution C into the suspension of a carboxylic acid salt within 10 minutes. If the rate of dropping is slow such that the dropping time exceeds the upper limit of the above-described range, the particle diameter of the formed nanoparticles increases; thereby, the problem of increased specific resistance is caused. As a result of dropping the aqueous reducing agent solution C into this suspension while stirring within a prescribed temperature range in this manner, the metal salt is reduced and metal nanoparticles can be formed.

The dispersion stability can be increased by removing excess salts from the reaction liquid containing metal nanoparticles after the reduction using various separation techniques. Examples of excess salt separation techniques include a centrifugal separation, an ultrafiltration, and the use of an ion exchange membrane or an ion exchange resin. The volume resistivity of an electrode obtained by coating and baking these metal nanoparticles generally demonstrates a tendency to be closer to that of a bulk metal, the more the amount of the excess salts are removed.

In the method for synthesizing metal nanoparticles of the present embodiment which includes these steps, metal nanoparticles can be produced from an insoluble metal salt. In the present embodiment, all of the raw materials are composed of C, H, N, and O, with the exception of the raw material metal, sodium, calcium, and the like which are used to cause the carboxylic acid and the like to form a salt or to serve as a basic compound in the basic aqueous solution, and boron contained in the case of using sodium borohydride and the like for the reducing agent, and corrosive substances are not contained. Consequently, metal nanoparticles can be obtained that are suitable for use as electrically conductive materials without containing a corrosive substance. In addition, the metal nanoparticles synthesized according to the method of the present embodiment can be sintered at low temperatures. For example, in the case of silver nanoparticles, an electrode having a volume resistivity on the order of $10^{-6}$ Ω·cm or an electrically conductive reflective film having high reflectance characteristic of silver can be formed at low temperatures.

In the aforementioned embodiment, the case is explained in which each of the aqueous carboxylic acid solution B and the aqueous metal salt solution A is first prepared, and then they are mixed together; however, in the process of forming a mixed liquid by mixing the aqueous carboxylic acid solution B and the aqueous metal salt solution A, the case may also be included where the solute of the aqueous carboxylic acid solution B is preliminarily mixed with the solute of the aqueous metal salt A, and then the mixed solutes are dissolved by adding water thereto.

Next, an explanation is provided for a method for producing a metal film using metal nanoparticles obtained according to the method for synthesizing metal nanoparticles described above. More specifically, this method for producing a metal film includes: a dispersion step in which metal nanoparticles obtained according to the synthesis method are dispersed in a dispersion medium to obtain a dispersion of metal nanoparticles; and a metal film formation step in which the dispersion of metal nanoparticles is used as a metal-film-producing composition and is coated on a base material by a wet coating process to form a metal film. These steps are explained below in detail.

<Dispersion Step>

In this step, the metal nanoparticles obtained according to the method described above are added to a dispersion medium and are further mixed therewith; thereby, the particles are dispersed in the dispersion medium to prepare a dispersion of metal nanoparticles. The dispersion is prepared so that the content of metal nanoparticles including silver nanoparticles in the dispersion is within a range from 2.5 to 95.0% by mass and preferably within a range from 3.5 to 90.0% by mass based on a value of 100% by mass for the composition composed of the metal nanoparticles and the dispersion medium. The dispersion medium contains water at a content of 1% by mass or more and preferably 2% by mass or more and alcohol at a content of 2% by mass or more and preferably 3% by mass or more based on a value of 100% by mass for the total dispersion medium. For example, in the case where the dispersion medium is composed only of water and alcohol, when the dispersion medium contains 2% by mass of water, it contains 98% by mass of alcohol, and when the dispersion medium contains 2% by mass of alcohol, it contains 98% by mass of water.

Here, the reason for limiting the content of metal nanoparticles including silver nanoparticles to within a range from 2.5 to 95.0% by mass based on a value of 100% by mass for the composition composed of the metal nanoparticles and the dispersion medium is that, if the content is less than 2.5% by mass, there are no particular effects on properties of a metal film after baking; however, it becomes difficult to obtain a metal film having a required thickness, while if the content exceeds 95.0% by mass, the required fluidity for use as an ink or a paste during wet coating of the composition ends up being lost. In addition, the reason for limiting the content of water to 1% by mass or more based on a value of 100% by mass for the total dispersion medium is that, if the water content is less than 1% by mass, it becomes difficult to sinter at low temperatures a film obtained by coating the composition by wet coating, and the electrical conductivity and the reflectance of the metal film end up decreasing after baking. The reason for limiting the content of alcohol to 2% by mass or more based on a value of 100% for the total dispersion medium is that, if the content of alcohol is less than 2% by mass, it also becomes difficult to sinter at low temperatures a film obtained by coating the composition by wet coating in the same manner as described above, and the electrical conductivity and the reflectance of the metal film end up decreasing after baking.

In addition, the aforementioned alcohol is preferably one type or two or more types selected from the group consisting of methanol, ethanol, propanol, butanol, ethylene glycol, propylene glycol, diethylene glycol, glycerol, isobornyl alcohol, and erythritol.

As a result of going through the aforementioned steps, a dispersion can be obtained in which metal nanoparticles are dispersed, and the shape and the particle diameter of the metal nanoparticles are controlled over a wide range.

<Metal Film Formation Step>

In this step, a metal film is formed using the dispersion of metal nanoparticles described above. First, the aforementioned dispersion of metal nanoparticles is used as a metal-film-forming composition and is coated on a base material by a wet coating process. The coating by this wet coating process involves forming a film such that the thickness of the film after baking will become within a range from 0.1 to 2.0 μm and preferably within a range from 0.3 to 1.5 μm. The aforementioned base material can be a substrate composed of either one of silicon, glass, ceramics containing a transparent electrically conductive material, polymer material, and metal, or can be a laminate of two or more types of materials selected from the group consisting of silicon, glass, ceramics containing a transparent electrically conductive material, polymer material, and metal. In addition, the base material is preferably either one of a solar cell element and a solar cell element having a transparent metal film. Examples of the transparent metal films include indium tin oxide (ITO), antimony tin oxide (ATO), tin oxide ($SnO_2$: NESA), indium zinc oxide (IZO), and aluminum-doped zinc oxide (AZO). The aforementioned metal-film-forming composition is preferably coated on the surface of a photoelectric converting semiconductor layer of a solar cell element or on the surface of a transparent metal film of a solar cell element having a transparent metal film. Moreover, the wet coating process is particularly preferably any one of spray coating, dispenser coating, spin coating, knife coating, slit coating, ink jet coating, screen printing, offset printing, and die coating; however, the method to be used is not limited thereto, and any method can be used. The spray coating is a method which includes coating the metal-film-forming composition in the form of a mist on the base material using compressed air, or coating the metal-film-forming composition in the form of a mist on the base material by pressurizing the metal-film-forming composition itself. The dispenser coating is a method which includes, for example, while placing the metal-film-forming composition in a syringe, and pressing on the piston of this syringe so as to discharge the metal-film-forming composition from a fine nozzle on the end of the syringe, coating the composition on the base material. The spin coating is a method which includes dropping the metal-film-forming composition on a rotating base material, and allowing the dropped metal-film-forming composition to spread towards the edges of the base material by a centrifugal force. The knife coating is a method which includes providing a base material at a prescribed gap from the edge of a knife so as to be able to move in the horizontal direction, supplying the metal-film-forming composition on the base material on the upstream side of the knife, and then moving the base material horizontally in the downstream direction. The slit coating is a method which includes coating the metal-film-forming composition on a base material by flowing the metal-film-forming composition out from a narrow slit. The ink jet coating is a method which includes filling the metal-film-forming composition into an ink cartridge of a commercially available ink jet printer, and then ink-jet printing the composition on the base material. The screen printing is a method in which sand is used as a pattern indicator, a fabricated print image is passed over the sand, and the metal-film-forming composition is transferred to the base material. The offset printing is a printing method that utilizes the water repellency of an ink and includes temporarily transferring the metal-film-forming composition affixed to a block to a rubber sheet without attaching directly to a base material, and then transferring from the rubber sheet to the base material. The die coating is a method which includes distributing the metal-film-forming composition supplied into a die using a manifold, extruding on a base material through a slit, and coating on the surface of a moving base material. The examples of the die coating include slot coating, slide coating, and curtain coating methods.

Next, the base material having a film formed on the upper surface thereof is baked in air at a temperature of 130 to 400° C. and preferably 140 to 200° C. for 10 minutes to 1 hour and preferably for 15 to 40 minutes. Here, the reason for limiting the thickness of the coated film formed on the base material after baking to within a range from 0.1 to 2.0 μm is that if the film thickness is less than 0.1 μm, the surface resistance of the metal film required for use as a solar cell is inadequate, while if the film thickness exceeds 2.0 μm, there are no problems in terms of physical properties; however, the usage of materials becomes greater than what is necessary, thereby resulting in a waste of material. In addition, the reason for limiting the baking temperature of the coated film formed on the base material to within a range from 130 to 400° C. is that if the temperature is lower than 130° C., the sintering of the metal nanoparticles is inadequate, while if the temperature exceeds 400° C., the production advantage of being a low temperature process is lost, or in other words, the production costs increase and the productivity decreases. Moreover, the reason for limiting the baking time of the coated film formed on the base material to within a range from 10 minutes to 1 hour is that if the baking time is shorter than 10 minutes, the sintering of the metal nanoparticles is inadequate, while if the baking time is longer than 1 hour, there are no effects on physical properties; however, production costs increase beyond what is necessary and the productivity decreases.

In the aforementioned dispersion of metal nanoparticles which is the metal-film-forming composition, since the dispersion contains comparatively large metal nanoparticles having a primary particle diameter of 10 to 50 nm at a large amount, the specific surface area of the metal nanoparticles decreases. As a result, when a metal film of a solar cell is formed using this metal-film-forming composition, a metal film can be obtained which includes silver for a main component thereof and is substantially free of organic substance. Thus, even when the solar cell in which this metal film is formed is used for many years, there is no deterioration or degradation of organic substance; thereby, the electrical conductivity and the reflectance of the metal film are maintained at a high level. As a result, an metal film can be obtained that has superior long-term stability. More specifically, even after housing the metal film for 1000 hours in a constant temperature and humidity chamber in which the temperature is held at 100° C. and the humidity is held at 50%, the metal film can reflect 80% or more of electromagnetic waves having a wavelength of 750 to 1500 nm, namely electromagnetic waves from the visible light region to the infrared region, and also the electrical conductivity of the metal film, namely the volume resistivity of the metal film, can be maintained at an extremely low value of less than $2 \times 10^{-5}$ Ω·cm ($20 \times 10^{-6}$ Ω·cm). A solar cell using the metal film formed in this manner can maintain high levels of electrical conductivity and the reflectance even after being used for many years; therefore, superior long-term stability can be attained.

(Explanation of Embodiments According to [68] to [72])

Figure 7:
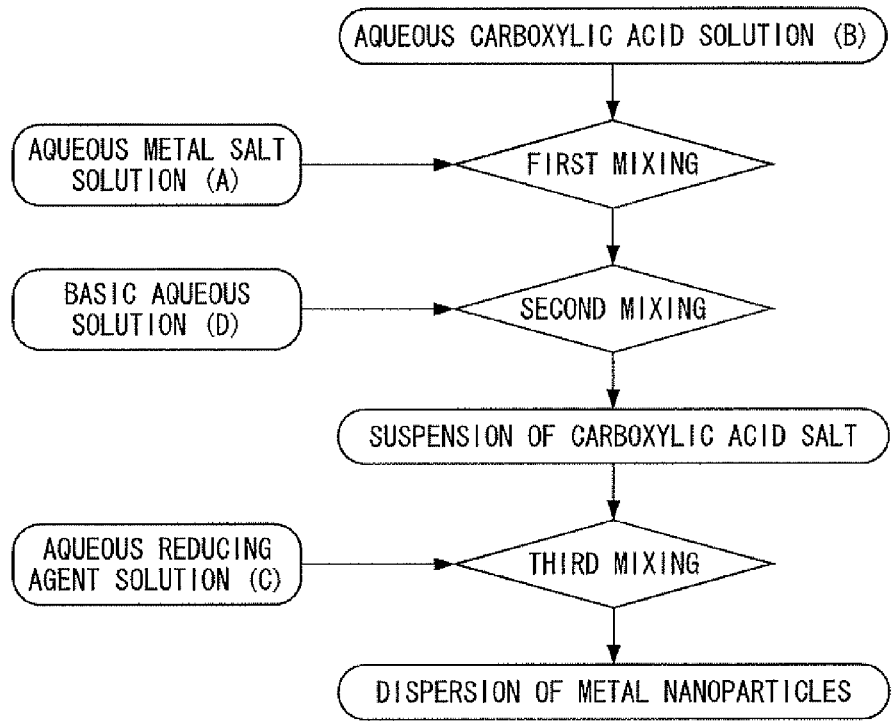
FIG. 7 is a drawing showing the flow of a production method according to other embodiment of the present invention.

As indicated in FIG. 7, the embodiment of the synthesis method includes: preparing an aqueous metal salt solution A; preparing an aqueous carboxylic acid solution B; preparing an aqueous reducing agent solution C; and preparing a basic aqueous solution D.

<Aqueous Metal Salt Solution A Preparation Step>

Preparation of the aqueous metal salt solution A is carried out by dissolving a metal salt in water which is a solvent. It is preferable to dissolve the metal salt in deionized water to prepare a saturated aqueous solution at room temperature. Here, the metal salt to be dissolved contains at least silver salt. The aqueous metal salt solution A is prepared such that when the total amount of all metal elements contained in the metal salt is taken to be 100%, the silver accounts for 75% by mass or more. Accordingly, the proportion of silver to the metal elements may be 100% by mass; however, in the case where the metal salt contains a salt of metal other than silver salt, residual metal elements in the metal salt other than silver preferably include one type or two or more types of metals selected from the group consisting of gold, platinum, palladium, and ruthenium. As a result, the effect of controlling the reflectance and the volume resistivity is obtained as a result of synthesizing metal nanoparticles as a mixture of different metal nanoparticles, metal nanoparticles of an alloy, or metal nanoparticles having a so-called core-shell structure in which one of the elements forms a shell around a center portion formed of the other element.

<Aqueous Carboxylic Acid Solution B Preparation Step>

Preparation of the aqueous carboxylic acid solution B is carried out by dissolving a carboxylic acid in water which is a solvent. It is preferable to dissolve the carboxylic acid in deionized water to prepare a saturated aqueous solution at room temperature. Here, the carboxylic acid to be dissolved is one type or two or more types of compounds selected from the group consisting of glycolic acid, citric acid, malic acid, maleic acid, malonic acid, fumaric acid, succinic acid, tartaric acid, and salts thereof The reason for limiting the carboxylic acid thereto is because these carboxylic acids favorably function as protective materials that modify the surface of the metal nanoparticles. Furthermore, they do not contain corrosive substances such as thiols and the like. Moreover, the pH during synthesis can be set to the basic side by converting these carboxylic acids to salts such as those of sodium, copper or ammonia.

<Aqueous Reducing Agent Solution C Preparation Step>

Preparation of the aqueous reducing agent solution C is carried out by dissolving a reducing agent in water which is a solvent. It is preferable to dissolve the reducing agent in deionized water to prepare a saturated aqueous solution at room temperature. Here, the reducing agent to be dissolved is one type or two or more types of compounds selected from the group consisting of hydrazine, ascorbic acid, oxalic acid, formic acid, and salts thereof As a result, the effects can be attained in which no corrosive substance is contained and the compound can be easily decomposed by baking even when the compound remains within the product of a paste.

On the other hand, the reducing agent dissolved in the solvent in the form of water may also be one type or two or more types of compounds selected from the group consisting of sodium borohydride, potassium borohydride and glucose. In this case as well, the effects can be attained in which no corrosive substance is contained and the compound can be easily decomposed by baking even when the compound remains within the product of a paste.

<Basic Aqueous Solution D Preparation Step>

Preparation of the basic aqueous solution D is carried out by dissolving a basic compound in water which is a solvent. The solution is prepared such that the concentration of the basic compound is adjusted to within a range from 1 to 5 M, for main reasons of the ease of handling and preparation; however, the concentration is not particularly limited to this range. Here, examples of the basic compound to be dissolved include sodium hydroxide, potassium hydroxide, ammonia, and the like.

<First Mixing Step>

The aqueous metal salt solution A is first dropped into the aqueous carboxylic acid solution B while stirring to form a mixed liquid. Metal ions form carboxylic acid complexes in the formed mixed liquid as a result of dropping the aqueous metal salt solution A into the aqueous carboxylic acid solution B while stirring. The dropping and mixing ratio is preferably such that the amount of the metal element contained in the aqueous metal salt solution A is within a range from 0.3 to 3 mol relative to 1 mol of the amount of carboxylic acid, the amount of carboxylic acid salt, or the total amount of carboxylic acid and carboxylic acid salt contained in the aqueous carboxylic acid solution B. If the proportion of the dropped amount is less than the lower limit of the above-described range, the particle diameter of the formed nanoparticles increases; thereby, the problem of increased specific resistance is caused. If the proportion of the dropped amount exceeds the upper limit of the above-described range, unnecessary amount of the aqueous metal salt solution A is excessively dropped in, resulting in the problem of increased costs. In addition, it is preferable to drop the aqueous metal salt solution A into the aqueous carboxylic acid solution B and to stir them within a temperature range of 25 to 95° C. at atmospheric pressure.

<Second Mixing Step>

The basic aqueous solution D is dropped into the mixed liquid while stirring to form a suspension of carboxylic acid salt. As a result of dropping the basic aqueous solution D into the mixed liquid while stirring, the solubility of the metal complexes in the formed suspension of a carboxylic acid salt decreases, and the majority of the metal complexes precipitate in the form of carboxylic acid salt. The dropping and mixing ratio is preferably such that the amount of the basic compound contained in the basic aqueous solution D is within a range from 0.3 to 3.0 mol relative to 1 mol of the metal elements serving as raw material of the mixed liquid. If the proportion of the dropped amount is less than the lower limit of the above-described range, the particle diameter of the formed nanoparticles increases; thereby, the problem of increased specific resistance is caused. If the proportion of the dropped amount exceeds the upper limit of the above-described range, unnecessary amount of the basic aqueous solution D is excessively dropped in, resulting in the problem of increased costs. In addition, it is preferable to drop the basic aqueous solution D into the mixed liquid and to stir them within a temperature range of 25 to 95° C. at atmospheric pressure. When the basic aqueous solution D is dropped into the mixed liquid while stirring, poorly-soluble carboxylic acid salt precipitates and a suspension of a carboxylic acid salt is obtained. Accordingly, the stirring after dropping the aqueous basic solution D into the mixed liquid is preferably carried out for an amount of time sufficient to obtain that suspension adequately.

<Third Mixing Step>

After obtaining the suspension in which the carboxylic acid salt precipitates, the aqueous reducing agent solution C is dropped into the suspension while stirring to form metal nanoparticles. Namely, as a result of dropping the aqueous reducing agent solution C into the suspension of carboxylic acid salt while stirring, the precipitated carboxylic acid salt is reduced; thereby, the technical effect of forming metal nanoparticles can be realized. The dropping and mixing ratio is preferably such that the amount of the reducing agent contained in the aqueous reducing agent solution C is within a range from 0.1 to 3.0 mol relative to 1 mol of the metal element serving as the raw material of the suspension. If the proportion of the dropped amount is less than the lower limit of the above-described range, the problem of decreased yield occurs. If the proportion of the dropped amount exceeds the upper limit of the above-described range, unnecessary amount of the aqueous reducing agent solution C is excessively dropped in, resulting in the problem of increased costs. In addition, the dropping of the aqueous reducing solution C into the suspension of a carboxylic acid salt and the stirring are carried out within a temperature range of 25 to 95° C. at atmospheric pressure. When stirring within this temperature range, the mean particle diameter of the formed particles can be made to be 100 nm or less. When using a dispersion containing the resulting metal nanoparticles having the mean particle diameter within that range as an electrode-forming composition and forming a film, low volume resistivity can be achieved at low temperatures. In addition, it is preferable to drop the aqueous reducing agent solution C into the suspension of a carboxylic acid salt within 10 minutes. If the rate of dropping is slow such that the dropping time exceeds the upper limit of the above-described range, the particle diameter of the formed nanoparticles increases; thereby, the problem of increased specific resistance is caused. As a result of dropping the aqueous reducing agent solution C into this suspension while stirring within a prescribed temperature range in this manner, the metal salt is reduced and metal nanoparticles can be formed.

The dispersion stability can be increased by removing excess salts from the reaction liquid containing metal nanoparticles after the reduction using various separation techniques. Examples of excess salt separation techniques include a centrifugal separation, an ultrafiltration, and the use of an ion exchange membrane or an ion exchange resin. The volume resistivity of an electrode obtained by coating and baking these metal nanoparticles generally demonstrates a tendency to be closer to that of a bulk metal, the more the amount of the excess salts are removed.

In the method for synthesizing metal nanoparticles of the present embodiment which includes these steps, metal nanoparticles can be produced from an insoluble metal salt. In the present embodiment, all of the raw materials are composed of C, H, N, and O, with the exception of the raw material metal, sodium, calcium, and the like which are used to cause the carboxylic acid and the like to form a salt or to serve as a basic compound in the basic aqueous solution, and boron contained in the case of using sodium borohydride and the like for the reducing agent, and corrosive substances are not contained. Consequently, metal nanoparticles can be obtained that are suitable for use as electrically conductive materials without containing a corrosive substance. In addition, the metal nanoparticles synthesized according to the method of the present embodiment can be sintered at low temperatures. For example, in the case of silver nanoparticles, an electrode having a volume resistivity on the order of $10^{-6}$ Ω·cm or an electrically conductive reflective film having high reflectance characteristic of silver can be formed at low temperatures.

In the aforementioned embodiment, the case is explained in which each of the aqueous carboxylic acid solution B and the aqueous metal salt solution A is first prepared, and then they are mixed together; however, in the process of forming a mixed liquid by mixing the aqueous metal salt solution A and the aqueous carboxylic acid solution B, the case may also be included where the solute of the aqueous metal salt A is preliminarily mixed with the solute of the aqueous carboxylic acid solution B, and then the mixed solutes are dissolved by adding water thereto.

Next, an explanation is provided for a method for producing a metal film using metal nanoparticles obtained according to the method for synthesizing metal nanoparticles described above. More specifically, this method for producing a metal film includes: a dispersion step in which metal nanoparticles obtained according to the synthesis method are dispersed in a dispersion medium to obtain a dispersion of metal nanoparticles; and a metal film formation step in which the dispersion of metal nanoparticles is used as a metal-film-producing composition and is coated on a base material by a wet coating process to form a metal film. These steps are explained below in detail.

<Dispersion Step>

In this step, the metal nanoparticles obtained according to the method described above are added to a dispersion medium and are further mixed therewith; thereby, the particles are dispersed in the dispersion medium to prepare a dispersion of metal nanoparticles. The dispersion is prepared so that the content of metal nanoparticles including silver nanoparticles in the dispersion is within a range from 2.5 to 95.0% by mass and preferably within a range from 3.5 to 90.0% by mass based on a value of 100% by mass for the composition composed of the metal nanoparticles and the dispersion medium. The dispersion medium contains water at a content of 1% by mass or more and preferably 2% by mass or more and alcohol at a content of 2% by mass or more and preferably 3% by mass or more based on a value of 100% by mass for the total dispersion medium. For example, in the case where the dispersion medium is composed only of water and alcohol, when the dispersion medium contains 2% by mass of water, it contains 98% by mass of alcohol, and when the dispersion medium contains 2% by mass of alcohol, it contains 98% by mass of water. Here, the reason for limiting the content of metal nanoparticles including silver nanoparticles to within a range from 2.5 to 95.0% by mass based on a value of 100% by mass for the composition composed of the metal nanoparticles and the dispersion medium is that, if the content is less than 2.5% by mass, there are no particular effects on properties of a metal film after baking; however, it becomes difficult to obtain a metal film having a required thickness, while if the content exceeds 95.0% by mass, the required fluidity for use as an ink or a paste during wet coating of the composition ends up being lost. In addition, the reason for limiting the content of water to 1% by mass or more based on a value of 100% by mass for the total dispersion medium is that, if the water content is less than 1% by mass, it becomes difficult to sinter at low temperatures a film obtained by coating the composition by wet coating, and the electrical conductivity and the reflectance of the metal film end up decreasing after baking. The reason for limiting the content of alcohol to 2% by mass or more based on a value of 100% for the total dispersion medium is that, if the content of alcohol is less than 2% by mass, it also becomes difficult to sinter at low temperatures a film obtained by coating the composition by wet coating in the same manner as described above, and the electrical conductivity and the reflectance of the metal film end up decreasing after baking.

In addition, the aforementioned alcohol is preferably one type or two or more types selected from the group consisting of methanol, ethanol, propanol, butanol, ethylene glycol, propylene glycol, diethylene glycol, glycerol, isobornyl alcohol, and erythritol.

As a result of going through the aforementioned steps, a dispersion can be obtained in which metal nanoparticles are dispersed, and the shape and the particle diameter of the metal nanoparticles are controlled over a wide range.

<Metal Film Formation Step>

In this step, a metal film is formed using the dispersion of metal nanoparticles described above. First, the aforementioned dispersion of metal nanoparticles is used as a metal-film-forming composition and is coated on a base material by a wet coating process.

The coating by this wet coating process involves forming a film such that the thickness of the film after baking will become within a range from 0.1 to 2.0 μm and preferably within a range from 0.3 to 1.5 μm. The aforementioned base material can be a substrate composed of either one of silicon, glass, ceramics containing a transparent electrically conductive material, polymer material, and metal, or can be a laminate of two or more types of materials selected from the group consisting of silicon, glass, ceramics containing a transparent electrically conductive material, polymer material, and metal. In addition, the base material is preferably either one of a solar cell element and a solar cell element having a transparent metal film. Examples of the transparent metal films include indium tin oxide (ITO), antimony tin oxide (ATO), tin oxide ($SnO_2$: NESA), indium zinc oxide (IZO), and aluminum-doped zinc oxide (AZO). The aforementioned metal-film-forming composition is preferably coated on the surface of a photoelectric converting semiconductor layer of a solar cell element or on the surface of a transparent metal film of a solar cell element having a transparent metal film. Moreover, the wet coating process is particularly preferably any one of spray coating, dispenser coating, spin coating, knife coating, slit coating, ink jet coating, screen printing, offset printing, and die coating; however, the method to be used is not limited thereto, and any method can be used. The spray coating is a method which includes coating the metal-film-forming composition in the form of a mist on the base material using compressed air, or coating the metal-film-forming composition in the form of a mist on the base material by pressurizing the metal-film-forming composition itself. The dispenser coating is a method which includes, for example, while placing the metal-film-forming composition in a syringe, and pressing on the piston of this syringe so as to discharge the metal-film-forming composition from a fine nozzle on the end of the syringe, coating the composition on the base material. The spin coating is a method which includes dropping the metal-film-forming composition on a rotating base material, and allowing the dropped metal-film-forming composition to spread towards the edges of the base material by a centrifugal force. The knife coating is a method which includes providing a base material at a prescribed gap from the edge of a knife so as to be able to move in the horizontal direction, supplying the metal-film-forming composition on the base material on the upstream side of the knife, and then moving the base material horizontally in the downstream direction. The slit coating is a method which includes coating the metal-film-forming composition on a base material by flowing the metal-film-forming composition out from a narrow slit. The ink jet coating is a method which includes filling the metal-film-forming composition into an ink cartridge of a commercially available ink jet printer, and then ink-jet printing the composition on the base material. The screen printing is a method in which sand is used as a pattern indicator, a fabricated print image is passed over the sand, and the metal-film-forming composition is transferred to the base material. The offset printing is a printing method that utilizes the water repellency of an ink and includes temporarily transferring the metal-film-forming composition affixed to a block to a rubber sheet without attaching directly to a base material, and then transferring from the rubber sheet to the base material. The die coating is a method which includes distributing the metal-film-forming composition supplied into a die using a manifold, extruding on a base material through a slit, and coating on the surface of a moving base material. The examples of the die coating include slot coating, slide coating, and curtain coating methods.

Next, the base material having a film formed on the upper surface thereof is baked in air at a temperature of 130 to 400° C. and preferably 140 to 200° C. for 10 minutes to 1 hour and preferably for 15 to 40 minutes. Here, the reason for limiting the thickness of the coated film formed on the base material after baking to within a range from 0.1 to 2.0 μm is that if the film thickness is less than 0.1 μm, the surface resistance of the metal film required for use as a solar cell is inadequate, while if the film thickness exceeds 2.0 μm, there are no problems in terms of physical properties; however, the usage of materials becomes greater than what is necessary, thereby resulting in a waste of material. In addition, the reason for limiting the baking temperature of the coated film formed on the base material to within a range from 130 to 400° C. is that if the temperature is lower than 130° C., the sintering of the metal nanoparticles is inadequate, while if the temperature exceeds 400° C., the production advantage of being a low temperature process is lost, or in other words, the production costs increase and the productivity decreases. Moreover, the reason for limiting the baking time of the coated film formed on the base material to within a range from 10 minutes to 1 hour is that if the baking time is shorter than 10 minutes, the sintering of the metal nanoparticles is inadequate, while if the baking time is longer than 1 hour, there are no effects on physical properties; however, production costs increase beyond what is necessary and the productivity decreases.

In the aforementioned dispersion of metal nanoparticles which is the metal-film-forming composition, since the dispersion contains comparatively large metal nanoparticles having a primary particle diameter of 10 to 50 nm at a large amount, the specific surface area of the metal nanoparticles decreases. As a result, when a metal film of a solar cell is formed using this metal-film-forming composition, a metal film can be obtained which includes silver for a main component thereof and is substantially free of organic substance. Thus, even when the solar cell in which this metal film is formed is used for many years, there is no deterioration or degradation of organic substance; thereby, the electrical conductivity and the reflectance of the metal film are maintained at a high level. As a result, an metal film can be obtained that has superior long-term stability. More specifically, even after housing the metal film for 1000 hours in a constant temperature and humidity chamber in which the temperature is held at 100° C. and the humidity is held at 50%, the metal film can reflect 80% or more of electromagnetic waves having a wavelength of 750 to 1500 nm, namely electromagnetic waves from the visible light region to the infrared region, and also the electrical conductivity of the metal film, namely the volume resistivity of the metal film, can be maintained at an extremely low value of less than $2 \times 10^{-5}$ Ω·cm ($20 \times 10^{-6}$ Ω·cm). A solar cell using the metal film formed in this manner can maintain high levels of electrical conductivity and the reflectance even after being used for many years; therefore, superior long-term stability can be attained.

(Explanation of Embodiments According to [73] to [77])

Figure 8:
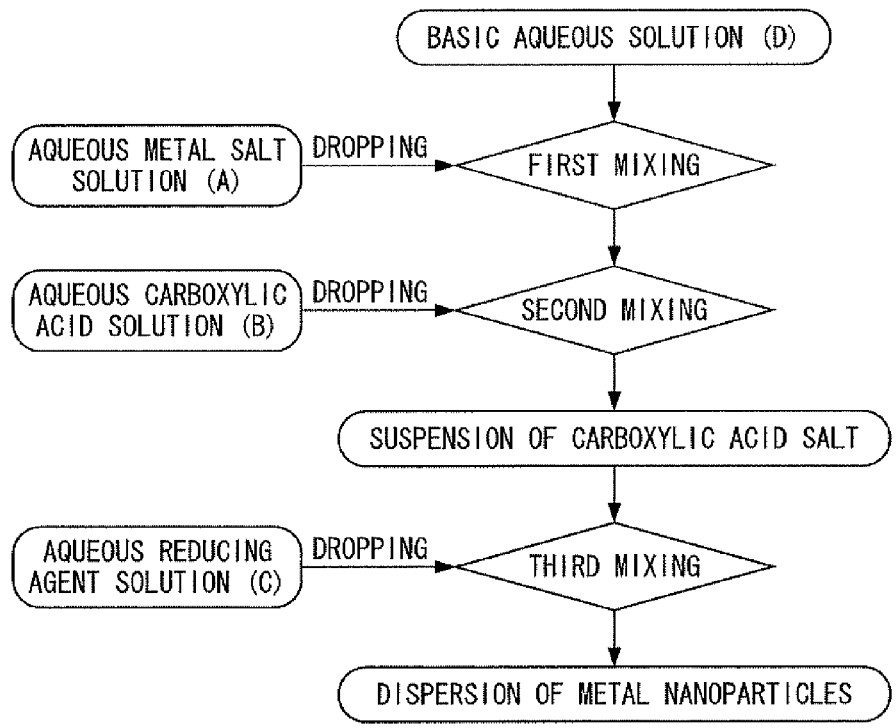
FIG. 8 is a drawing showing the flow of a production method according to other embodiment of the present invention.

As indicated in FIG. 8, the embodiment of the synthesis method includes: preparing an aqueous metal salt solution A; preparing an aqueous carboxylic acid solution B; preparing an aqueous reducing agent solution C; and preparing a basic aqueous solution D.

<Aqueous Metal Salt Solution A Preparation Step>

Preparation of the aqueous metal salt solution A is carried out by dissolving a metal salt in water which is a solvent. It is preferable to dissolve the metal salt in deionized water to prepare a saturated aqueous solution at room temperature. Here, the metal salt to be dissolved contains at least silver salt. The aqueous metal salt solution A is prepared such that when the total amount of all metal elements contained in the metal salt is taken to be 100%, the silver accounts for 75% by mass or more. Accordingly, the proportion of silver to the metal elements may be 100% by mass; however, in the case where the metal salt contains a salt of metal other than silver salt, residual metal elements in the metal salt other than silver preferably include one type or two or more types of metals selected from the group consisting of gold, platinum, palladium, and ruthenium. As a result, the effect of controlling the reflectance and the volume resistivity is obtained as a result of synthesizing metal nanoparticles as a mixture of different metal nanoparticles, metal nanoparticles of an alloy, or metal nanoparticles having a so-called core-shell structure in which one of the elements forms a shell around a center portion formed of the other element.

<Aqueous Carboxylic Acid Solution B Preparation Step>

Preparation of the aqueous carboxylic acid solution B is carried out by dissolving a carboxylic acid in water which is a solvent. It is preferable to dissolve the carboxylic acid in deionized water to prepare a saturated aqueous solution at room temperature.

Here, the carboxylic acid to be dissolved is one type or two or more types of compounds selected from the group consisting of glycolic acid, citric acid, malic acid, maleic acid, malonic acid, fumaric acid, succinic acid, tartaric acid, and salts thereof The reason for limiting the carboxylic acid thereto is because these carboxylic acids favorably function as protective materials that modify the surface of the metal nanoparticles. Furthermore, they do not contain corrosive substances such as thiols and the like. Moreover, the pH during synthesis can be set to the basic side by converting these carboxylic acids to salts such as those of sodium, copper or ammonia.

<Aqueous Reducing Agent Solution C Preparation Step>

Preparation of the aqueous reducing agent solution C is carried out by dissolving a reducing agent in water which is a solvent. It is preferable to dissolve the reducing agent in deionized water to prepare a saturated aqueous solution at room temperature. Here, the reducing agent to be dissolved is one type or two or more types of compounds selected from the group consisting of hydrazine, ascorbic acid, oxalic acid, formic acid, and salts thereof As a result, the effects can be attained in which no corrosive substance is contained and the compound can be easily decomposed by baking even when the compound remains within the product of a dispersion.

On the other hand, the reducing agent dissolved in the solvent in the form of water may also be one type or two or more types of compounds selected from the group consisting of sodium borohydride, potassium borohydride and glucose. In this case as well, the effects can be attained in which no corrosive substance is contained and the compound can be easily decomposed by baking even when the compound remains within the product of a dispersion.

<Basic Aqueous Solution D Preparation Step>

Preparation of the basic aqueous solution D is carried out by dissolving a basic compound in water which is a solvent. The solution is prepared such that the concentration of the basic compound is adjusted to within a range from 1 to 5 M, for main reasons of the ease of handling and preparation; however, the concentration is not particularly limited to this range. Here, examples of the basic compound to be dissolved include sodium hydroxide, potassium hydroxide, ammonia, and the like.

<First Mixing Step>

The aqueous metal salt solution A is first dropped into the basic aqueous solution D while stirring to form a mixed liquid. As a result of dropping the aqueous metal salt solution A into the basic aqueous solution D while stirring, the mixed liquid is prepared of which the pH is adjusted so as to improve the yield of the carboxylic acid salt precipitated in the next step. The dropping and mixing ratio is preferably such that the amount of the basic compound contained in the basic aqueous solution D is within a range from 0.3 to 3 mol relative to 1 mol of the metal element contained in the aqueous metal salt solution A. If the proportion is less than the lower limit of the above-described range, the particle diameter of the formed nanoparticles increases; thereby, the problem of specific resistance is caused. If the proportion exceeds the upper limit of the above-described range, unnecessary amount of the aqueous carboxylic acid solution B is excessively dropped in, resulting in the problem of increased costs. In addition, it is preferable to drop the aqueous metal salt solution A into the basic aqueous solution D and to stir them within a temperature range of 25 to 95° C. at atmospheric pressure.

<Second Mixing Step>

The aqueous carboxylic acid solution B is dropped into the mixed liquid while stirring to form a suspension of carboxylic acid salt. As a result of dropping the aqueous carboxylic acid solution B into the mixed liquid while stirring, a suspension of a carboxylic acid salt is formed in which carboxylic acid salt is precipitated at high yield. The dropping and mixing ratio is preferably such that the amount of carboxylic acid, the amount of carboxylic acid salt, or the total amount of carboxylic acid and carboxylic acid salt contained in the aqueous carboxylic acid solution B is within a range from 0.3 to 3.0 mol relative to 1 mol of the metal elements serving as raw material of the mixed liquid. If the proportion of the dropped amount is less than the lower limit of the above-described range, the particle diameter of the formed nanoparticles increases; thereby, the problem of increased specific resistance is caused. If the proportion of the dropped amount exceeds the upper limit of the above-described range, unnecessary amount of the basic aqueous solution D is excessively dropped in, resulting in the problem of increased costs. In addition, it is preferable to drop the aqueous carboxylic acid solution B into the mixed liquid and to stir them within a temperature range of 25 to 95° C. at atmospheric pressure. When the aqueous carboxylic acid solution B is dropped into the mixed liquid while stirring, poorly-soluble carboxylic acid salt precipitates and a suspension of a carboxylic acid salt is obtained. Accordingly, the stirring after dropping the aqueous carboxylic acid solution B into the mixed liquid is preferably carried out for an amount of time sufficient to obtain that suspension adequately.

<Third Mixing Step>

After obtaining the suspension in which the carboxylic acid salt precipitates, the aqueous reducing agent solution C is dropped into the suspension while stirring to form metal nanoparticles. Namely, as a result of dropping the aqueous reducing agent solution C into the suspension of carboxylic acid salt while stirring, the precipitated carboxylic acid salt is reduced; thereby, the technical effect of forming metal nanoparticles can be realized. The dropping and mixing ratio is preferably such that the amount of the reducing agent contained in the aqueous reducing agent solution C is within a range from 0.1 to 3.0 mol relative to 1 mol of the metal element serving as the raw material of the suspension. If the proportion of the dropped amount is less than the lower limit of the above-described range, the problem of decreased yield occurs. If the proportion of the dropped amount exceeds the upper limit of the above-described range, unnecessary amount of the aqueous reducing agent solution C is excessively dropped in, resulting in the problem of increased costs. In addition, the dropping of the aqueous reducing solution C into the suspension of a carboxylic acid salt and the stirring are carried out within a temperature range of 25 to 95° C. at atmospheric pressure. When stirring within this temperature range, the mean particle diameter of the formed particles can be made to be 100 nm or less. When using a dispersion containing the resulting metal nanoparticles having the mean particle diameter within that range as an electrode-forming composition and forming a film, low volume resistivity can be achieved at low temperatures. In addition, it is preferable to drop the aqueous reducing agent solution C into the suspension of a carboxylic acid salt within 10 minutes. If the rate of dropping is slow such that the dropping time exceeds the upper limit of the above-described range, the particle diameter of the formed nanoparticles increases; thereby, the problem of increased specific resistance is caused. As a result of dropping the aqueous reducing agent solution C into this suspension while stirring within a prescribed temperature range in this manner, the metal salt is reduced and metal nanoparticles can be formed.

The dispersion stability can be increased by removing excess salts from the reaction liquid containing metal nanoparticles after the reduction using various separation techniques. Examples of excess salt separation techniques include a centrifugal separation, an ultrafiltration, and the use of an ion exchange membrane or an ion exchange resin. The volume resistivity of an electrode obtained by coating and baking these metal nanoparticles generally demonstrates a tendency to be closer to that of a bulk metal, the more the amount of the excess salts are removed.

In the method for synthesizing metal nanoparticles of the present embodiment which includes these steps, metal nanoparticles can be produced from an insoluble metal salt. In the present embodiment, all of the raw materials are composed of C, H, N, and O, with the exception of the raw material metal, sodium, calcium, and the like which are used to cause the carboxylic acid and the like to form a salt or to serve as a basic compound in the basic aqueous solution, and boron contained in the case of using sodium borohydride and the like for the reducing agent, and corrosive substances are not contained. Consequently, metal nanoparticles can be obtained that are suitable for use as electrically conductive materials without containing a corrosive substance. In addition, the metal nanoparticles synthesized according to the method of the present embodiment can be sintered at low temperatures. For example, in the case of silver nanoparticles, an electrode having a volume resistivity on the order of $10^{-6}$ Ω·cm or an electrically conductive reflective film having high reflectance characteristic of silver can be formed at low temperatures.

In the aforementioned embodiment, the case is explained in which each of the aqueous carboxylic acid solution B and the aqueous metal salt solution A is first prepared, and then they are mixed together; however, in the process of forming a mixed liquid by mixing the aqueous carboxylic acid solution B and the aqueous metal salt solution A, the case may also be included where the solute of the aqueous carboxylic acid solution B is preliminarily mixed with the solute of the aqueous metal salt A, and then the mixed solutes are dissolved by adding water thereto.

Next, an explanation is provided for a method for producing a metal film using metal nanoparticles obtained according to the method for synthesizing metal nanoparticles described above. More specifically, this method for producing a metal film includes: a dispersion step in which metal nanoparticles obtained according to the synthesis method are dispersed in a dispersion medium to obtain a dispersion of metal nanoparticles; and a metal film formation step in which the dispersion of metal nanoparticles is used as a metal-film-producing composition and is coated on a base material by a wet coating process to form a metal film. These steps are explained below in detail.

<Dispersion Step>

In this step, the metal nanoparticles obtained according to the method described above are added to a dispersion medium and are further mixed therewith; thereby, the particles are dispersed in the dispersion medium to prepare a dispersion of metal nanoparticles. The dispersion is prepared so that the content of metal nanoparticles including silver nanoparticles in the dispersion is within a range from 2.5 to 95.0% by mass and preferably within a range from 3.5 to 90.0% by mass based on a value of 100% by mass for the composition composed of the metal nanoparticles and the dispersion medium. The dispersion medium contains water at a content of 1% by mass or more and preferably 2% by mass or more and alcohol at a content of 2% by mass or more and preferably 3% by mass or more based on a value of 100% by mass for the total dispersion medium. For example, in the case where the dispersion medium is composed only of water and alcohol, when the dispersion medium contains 2% by mass of water, it contains 98% by mass of alcohol, and when the dispersion medium contains 2% by mass of alcohol, it contains 98% by mass of water. Here, the reason for limiting the content of metal nanoparticles including silver nanoparticles to within a range from 2.5 to 95.0% by mass based on a value of 100% by mass for the composition composed of the metal nanoparticles and the dispersion medium is that, if the content is less than 2.5% by mass, there are no particular effects on properties of a metal film after baking; however, it becomes difficult to obtain a metal film having a required thickness, while if the content exceeds 95.0% by mass, the required fluidity for use as an ink or a paste during wet coating of the composition ends up being lost. In addition, the reason for limiting the content of water to 1% by mass or more based on a value of 100% by mass for the total dispersion medium is that, if the water content is less than 1% by mass, it becomes difficult to sinter at low temperatures a film obtained by coating the composition by wet coating, and the electrical conductivity and the reflectance of the metal film end up decreasing after baking. The reason for limiting the content of alcohol to 2% by mass or more based on a value of 100% for the total dispersion medium is that, if the content of alcohol is less than 2% by mass, it also becomes difficult to sinter at low temperatures a film obtained by coating the composition by wet coating in the same manner as described above, and the electrical conductivity and the reflectance of the metal film end up decreasing after baking.

In addition, the aforementioned alcohol is preferably one type or two or more types selected from the group consisting of methanol, ethanol, propanol, butanol, ethylene glycol, propylene glycol, diethylene glycol, glycerol, isobornyl alcohol, and erythritol.

As a result of going through the aforementioned steps, a dispersion can be obtained in which metal nanoparticles are dispersed, and the shape and the particle diameter of the metal nanoparticles are controlled over a wide range.

<Metal Film Formation Step>

In this step, a metal film is formed using the dispersion of metal nanoparticles described above. First, the aforementioned dispersion of metal nanoparticles is used as a metal-film-forming composition and is coated on a base material by a wet coating process. The coating by this wet coating process involves forming a film such that the thickness of the film after baking will become within a range from 0.1 to 2.0 μm and preferably within a range from 0.3 to 1.5 μm. The aforementioned base material can be a substrate composed of either one of silicon, glass, ceramics containing a transparent electrically conductive material, polymer material, and metal, or can be a laminate of two or more types of materials selected from the group consisting of silicon, glass, ceramics containing a transparent electrically conductive material, polymer material, and metal. In addition, the base material is preferably either one of a solar cell element and a solar cell element having a transparent metal film. Examples of the transparent metal films include indium tin oxide (ITO), antimony tin oxide (ATO), tin oxide ($SnO_2$: NESA), indium zinc oxide (IZO), and aluminum-doped zinc oxide (AZO). The aforementioned metal-film-forming composition is preferably coated on the surface of a photoelectric converting semiconductor layer of a solar cell element or on the surface of a transparent metal film of a solar cell element having a transparent metal film. Moreover, the wet coating process is particularly preferably any one of spray coating, dispenser coating, spin coating, knife coating, slit coating, ink jet coating, screen printing, offset printing, and die coating; however, the method to be used is not limited thereto, and any method can be used. The spray coating is a method which includes coating the metal-film-forming composition in the form of a mist on the base material using compressed air, or coating the metal-film-forming composition in the form of a mist on the base material by pressurizing the metal-film-forming composition itself. The dispenser coating is a method which includes, for example, while placing the metal-film-forming composition in a syringe, and pressing on the piston of this syringe so as to discharge the metal-film-forming composition from a fine nozzle on the end of the syringe, coating the composition on the base material. The spin coating is a method which includes dropping the metal-film-forming composition on a rotating base material, and allowing the dropped metal-film-forming composition to spread towards the edges of the base material by a centrifugal force. The knife coating is a method which includes providing a base material at a prescribed gap from the edge of a knife so as to be able to move in the horizontal direction, supplying the metal-film-forming composition on the base material on the upstream side of the knife, and then moving the base material horizontally in the downstream direction. The slit coating is a method which includes coating the metal-film-forming composition on a base material by flowing the metal-film-forming composition out from a narrow slit. The ink jet coating is a method which includes filling the metal-film-forming composition into an ink cartridge of a commercially available ink jet printer, and then ink-jet printing the composition on the base material. The screen printing is a method in which sand is used as a pattern indicator, a fabricated print image is passed over the sand, and the metal-film-forming composition is transferred to the base material. The offset printing is a printing method that utilizes the water repellency of an ink and includes temporarily transferring the metal-film-forming composition affixed to a block to a rubber sheet without attaching directly to a base material, and then transferring from the rubber sheet to the base material. The die coating is a method which includes distributing the metal-film-forming composition supplied into a die using a manifold, extruding on a base material through a slit, and coating on the surface of a moving base material. The examples of the die coating include slot coating, slide coating, and curtain coating methods.

Next, the base material having a film formed on the upper surface thereof is baked in air at a temperature of 130 to 400° C. and preferably 140 to 200° C. for 10 minutes to 1 hour and preferably for 15 to 40 minutes. Here, the reason for limiting the thickness of the coated film formed on the base material after baking to within a range from 0.1 to 2.0 μm is that if the film thickness is less than 0.1 μm, the surface resistance of the metal film required for use as a solar cell is inadequate, while if the film thickness exceeds 2.0 μm, there are no problems in terms of physical properties; however, the usage of materials becomes greater than what is necessary, thereby resulting in a waste of material. In addition, the reason for limiting the baking temperature of the coated film formed on the base material to within a range from 130 to 400° C. is that if the temperature is lower than 130° C., the sintering of the metal nanoparticles is inadequate, while if the temperature exceeds 400° C., the production advantage of being a low temperature process is lost, or in other words, the production costs increase and the productivity decreases. Moreover, the reason for limiting the baking time of the coated film formed on the base material to within a range from 10 minutes to 1 hour is that if the baking time is shorter than 10 minutes, the sintering of the metal nanoparticles is inadequate, while if the baking time is longer than 1 hour, there are no effects on physical properties; however, production costs increase beyond what is necessary and the productivity decreases.

In the aforementioned dispersion of metal nanoparticles which is the metal-film-forming composition, since the dispersion contains comparatively large metal nanoparticles having a primary particle diameter of 10 to 50 nm at a large amount, the specific surface area of the metal nanoparticles decreases. As a result, when a metal film of a solar cell is formed using this metal-film-forming composition, a metal film can be obtained which includes silver for a main component thereof and is substantially free of organic substance. Thus, even when the solar cell in which this metal film is formed is used for many years, there is no deterioration or degradation of organic substance; thereby, the electrical conductivity and the reflectance of the metal film are maintained at a high level. As a result, an metal film can be obtained that has superior long-term stability. More specifically, even after housing the metal film for 1000 hours in a constant temperature and humidity chamber in which the temperature is held at 100° C. and the humidity is held at 50%, the metal film can reflect 80% or more of electromagnetic waves having a wavelength of 750 to 1500 nm, namely electromagnetic waves from the visible light region to the infrared region, and also the electrical conductivity of the metal film, namely the volume resistivity of the metal film, can be maintained at an extremely low value of less than $2 \times 10^{-5}$ Ω·cm ($20 \times 10^{-6}$ Ω·cm). A solar cell using the metal film formed in this manner can maintain high levels of electrical conductivity and the reflectance even after being used for many years; therefore, superior long-term stability can be attained.

EXAMPLES

The following provides a detailed explanation of examples of the present embodiments together with comparative examples thereof (Examples Relating to Embodiments According to [1] to [17])

Examples 1 to 20 and Comparative Examples 1 to 3

First, metal salts containing metal elements, carboxylic acids, reducing agents, and additives which are shown in the following Tables 1 and 2 were respectively dissolved in deionized water to respectively prepare saturated aqueous solutions at room temperature. Here, nitrates were used for the metal salts, with the exception that chlorine compounds were used only for Au and Pt.

Next, the resulting aqueous carboxylic acid solution B was mixed with either one of the aqueous metal salt solution A and the aqueous reducing agent solution C to form a mixed liquid, and the other one of the aqueous metal salt solution A and the aqueous reducing agent solution C was added to the mixed liquid and further mixed therewith. The order of mixing was either one of the case shown in FIG. 1 where the aqueous carboxylic acid solution B was first mixed with the aqueous metal salt solution A, and then the aqueous reducing agent solution C was added to the mixed liquid, and the case shown in FIG. 2 where the aqueous carboxylic acid solution B was first mixed with the aqueous reducing agent solution C, and then the aqueous metal salt solution A was added to the mixed liquid.

Here, in the second mixing step in which all of the aqueous carboxylic acid solution B, the aqueous metal salt solution A, and the aqueous reducing agent solution C were added and mixed, the mixtures were heated to the reaction temperatures listed in the column entitled "reaction temperature" in Tables 1 and 2 using a water bath, and after reaching the reaction temperatures, the mixtures were continued to be stirred with a magnetic stirrer at a rotating speed of 400 ppm for 4 hours while refluxing. The resulting reaction liquids were used as the reaction liquids of Examples 1 to 20 and Comparative Examples 1 to 3, and information about the aqueous carboxylic acid solution B, the aqueous metal salt solution A, and the aqueous reducing agent solution C which were used to obtain the reaction liquids are shown in Tables 1 and 2.

Here, with regard to the reaction liquids of Examples 1 to 20, after reacting for 4 hours, dry substances of the reaction liquids were evaluated by X-ray analysis. As a result, carboxylic acid salts of the added metals were not detected.

After the completion of the reaction, the reaction liquids were centrifuged for 3 minutes at 1000 G to separate the precipitates from the reaction liquids. Moreover, 0.1 M of aqueous ammonia was added to the separated precipitate at an amount of 50 times more than the mass of the precipitate, and stirred for 10 minutes. Thereafter, the resulting dispersion was again centrifuged for 3 minutes at 1000 G to separate the precipitate from the dispersion. Water was added to the precipitate, and after desalting by ultrafiltration, solvents of which the types and the proportions are shown in following Tables 3 and 4 were added and stirred to obtain the dispersions of metal nanoparticles of Examples 1 to 20 and Comparative Examples 1 to 3. The types and mixing ratios of raw materials used to obtain the dispersions of Examples 1 to 20 and Comparative Examples 1 to 3, together with the reaction temperatures and the synthesis flows, are shown in Tables 1 and 2. Here, the value described in the columns entitled "molar ratio" in Tables 1 and 2 indicates the molar ratio to the total amount of all raw material metal ions. In addition, in the columns entitled "synthesis flow" in Tables 1 and 2, the number "(1)" indicates that the dispersion was synthesized according to the flow shown in FIG. 1, while the number "(2)" indicates that the dispersion was synthesized according to the flow shown in FIG. 2.

TABLE 1

| | Metal salt | | Carboxylic acid | | Reducing agent | | Additive | | Reaction temp. (° C.) | Synthesis flow |
|---|---|---|---|---|---|---|---|---|---|---|
| | Type | Mass % | Name | Molar ratio | Name | Molar ratio | Name | Molar ratio | | |
| Ex. 1 | Ag | 100 | Glycolic acid | 1 | Hydrazine | 1 | Na nitrate | 0.05 | 25 | (1) |
| Ex. 2 | Ag | 95 | Citric acid | 1 | Hydrazine acetate | 2 | Mg nitrate | 0.02 | 40 | (1) |
| | Au | 5 | | | | | | | | |

TABLE 1-continued

| | Metal salt | | Carboxylic acid | | Reducing agent | | Additive | | Reaction temp. (° C.) | Synthesis flow |
|---|---|---|---|---|---|---|---|---|---|---|
| | Type | Mass % | Name | Molar ratio | Name | Molar ratio | Name | Molar ratio | | |
| Ex. 3 | Ag Pt | 75 25 | Triammonium citrate | 1 | Ammonium formate | 1 | K nitrate | 0.02 | 60 | (2) |
| Ex. 4 | Ag Pd | 80 20 | Diammonium malate | 1 | Na formate | 1 | Ca nitrate | 0.01 | 60 | (2) |
| Ex. 5 | Ag Ru | 99.98 0.02 | Maleic acid | 0.5 | Na formate | 1 | Al nitrate | 0.02 | 60 | (2) |
| Ex. 6 | Ag | 100 | Disodium maleate | 3 | Na oxalate | 1 | Cr nitrate | 0.02 | 80 | (1) |
| Ex. 7 | Ag | 100 | Disodium malonate | 2 | Na ascorbate | 0.5 | Mn nitrate | 0.03 | 60 | (2) |
| Ex. 8 | Ag | 100 | Malonic acid | 0.5 | Na ascorbate | 2 | Fe nitrate | 0.02 | 30 | (2) |
| Ex. 9 | Ag | 100 | Fumaric acid | 1 | Na borohydride | 0.5 | Co nitrate | 0.02 | 40 | (1) |
| Ex. 10 | Ag | 100 | Disodium fumarate | 0.5 | Na borohydride | 0.5 | Ni nitrate | 0.03 | 40 | (1) |
| Ex. 11 | Ag | 100 | Succinic acid | 0.5 | K borohydride | 0.5 | Cu nitrate | 0.01 | 40 | (1) |
| Ex. 12 | Ag | 100 | Tartaric acid | 1 | Glucose | 3 | Zn nitrate | 0.01 | 95 | (2) |

TABLE 2

| | Metal salt | | Carboxylic acid | | Reducing agent | | Additive | | Reaction temp. (° C.) | Synthesis flow |
|---|---|---|---|---|---|---|---|---|---|---|
| | Type | Mass % | Name | Molar ratio | Name | Molar ratio | Name | Molar ratio | | |
| Ex. 13 | Ag | 100 | Diammonium tartrate | 1 | Glucose Na ascorbate | 0.5 0.1 | Zr nitrate | 0.01 | 95 | (2) |
| Ex. 14 | Ag | 100 | Diammonium tartrate | 1 | Na borohydride | 0.5 | Hexa-ammonium hepta-molybdate | 0.02 | 40 | (2) |
| Ex. 15 | Ag | 100 | Disodium malonate | 0.5 | Na formate | 1 | In nitrate | 0.02 | 40 | (1) |
| Ex. 16 | Ag | 100 | Disodium fumarate | 2 | Na oxalate | 1 | Sn nitrate | 0.05 | 40 | (1) |
| Ex. 17 | Ag | 100 | Trisodium citrate | 2 | Ascorbic acid | 0.5 | Ba nitrate | 0.02 | 40 | (1) |
| Ex. 18 | Ag | 100 | Diammonium malate | 0.5 | Na ascorbate | 2 | Pb nitrate | 0.02 | 40 | (1) |
| Ex. 19 | Ag | 100 | Diammonium succinate | 2 | Formic acid | 1 | Bi nitrate | 0.05 | 40 | (1) |
| Ex. 20 | Ag | 100 | Disodium succinate | 2 | Na formate | 1 | Ce nitrate | 0.02 | 40 | (2) |
| Comp. Ex. 1 | Ag | 100 | Disodium fumarate | 2 | Na oxalate | 1 | — | — | 40 | (1) |
| Comp. Ex. 2 | Ag Pt | 60 40 | Triammonium citrate | 1 | Ammonium formate | 1 | K nitrate | 0.02 | 60 | (2) |
| Comp. Ex. 3 | Ag | 100 | Disodium maleate | 2 | Na oxalate | 1 | Cr nitrate | 0.02 | 100 | (1) |

<Comparative Test 1 and Evaluation>

The dispersions of metal nanoparticles obtained in Examples 1 to 20 and Comparative Examples 1 to 3 were used as electrode-forming compositions, and the electrode-forming compositions were coated on base materials such that the film thicknesses after baking became the values as shown in the following Tables 3 and 4, and then the base materials having the films were baked for 30 minutes at the temperatures shown in Tables 3 and 4 to form electrodes on the base materials. Either one of a solar cell with an ITO film, a solar cell without an ITO film, a silicon substrate, a glass plate, a polyimide plate, a PET film, a glass plate with an ITO film, an aluminum plate, and a copper plate was used as the base material. Then the electrical conductivity of the base materials on which these electrodes were formed was measured. The results are shown in Tables 3 and 4.

Here, the electrical conductivity was evaluated using the volume resistivity (Ω·cm) measured and calculated according to the four terminal method. More specifically, at first, the thickness of the electrode after baking was directly measured from a cross-section of the electrode using a scanning electron microscope (SEM, Model 5800, Hitachi Ltd.), and then the measured thickness of the electrode was input into a specific resistance meter (Loresta, Mitsubishi Chemical Corp.). Thereafter, by using this specific resistance meter, the volume resistivity of the electrode was measured according to the four terminal method.

Tables 3 and 4 show the mean particle diameter of metal nanoparticles in the dispersion, the shape of the particles, the blending ratios of components that compose the electrode-forming composition, the coating method, the type of base material, the film thickness after baking, and the baking temperature, together with the electrical conductivity (volume resistivity). The mean particle diameter of the metal nanoparticles in the dispersions of metal nanoparticles was measured using a field-emission transmission electron microscope (FE-TEM, JEOL Ltd.).

In the columns entitled "Alcohol" in Tables 3 and 4, ME indicates methanol, ET indicates ethanol, EG indicates ethylene glycol, BU indicates butanol, PG indicates propylene glycol, DEG indicates diethylene glycol, GL indicates glycerol, ER indicates erythritol, IH indicates isobornyl hexanol, and PR indicates propanol.

In addition, in the columns entitled "Other solvent" in Tables 3 and 4, "A" indicates a mixed liquid of acetone and isopropyl glycol mixed at a mass ratio of 1:1, "B" indicates a mixed liquid of cyclohexane and methyl ethyl ketone mixed at a mass ratio of 1:1, and "C" indicates a mixed liquid of toluene and hexane mixed at a mass ratio of 1:1.

TABLE 3

| | Mean particle diameter (nm) | Particle shape | Dispersion (composition) (mass %) | | | | Additive in dispersion (metal ion conc. (ppm)) | Coating method | Base material | Film thickness after baking (μm) | Baking temp. (° C.) | Volume resistivity (Ω·cm) |
|---|---|---|---|---|---|---|---|---|---|---|---|---|
| | | | Metal | Water | Alcohol | Other solvent | | | | | | |
| Ex. 1 | 30 | Spheres | 10 | 10 | ME: 80 | None | 70 | Dispenser | Glass | 2.0 | 200 | $2.5 \times 10^{-6}$ |
| Ex. 2 | 20 | Plates | 10 | 10 | ME: 80 | None | 20 | Spray | Glass | 0.5 | 200 | $3.7 \times 10^{-6}$ |
| Ex. 3 | 30 | Spheres | 10 | 10 | ME: 60 ET: 20 | None | 10 | Spin | Silicon substrate | 0.1 | 200 | $3.5 \times 10^{-6}$ |
| Ex. 4 | 20 | Spheres | 10 | 10 | EG: 80 | None | 10 | Spin | Glass w/ ITO film | 0.5 | 300 | $3.2 \times 10^{-6}$ |
| Ex. 5 | 30 | Spheres | 10 | 10 | ET: 20 BU: 60 | None | 10 | Knife | Polyimide | 2.0 | 130 | $3.2 \times 10^{-6}$ |
| Ex. 6 | 20 | Spheres | 10 | 10 | PG: 80 | None | 20 | Slit | Glass | 0.5 | 300 | $3.1 \times 10^{-6}$ |
| Ex. 7 | 10 | Polyhedrons | 50 | 10 | DEG: 40 | None | 20 | Screen printing | Glass | 2.0 | 400 | $3.2 \times 10^{-6}$ |
| Ex. 8 | 30 | Spheres | 10 | 10 | ET: 20 GL: 60 | None | 10 | Screen printing | PET film | 2.0 | 150 | $3.7 \times 10^{-6}$ |
| Ex. 9 | 30 | Polyhedrons | 50 | 10 | EG: 10 ER: 30 | None | 30 | Offset printing | Solar cell w/ITO film | 2.0 | 150 | $3.1 \times 10^{-6}$ |
| Ex. 10 | 20 | Spheres | 10 | 10 | IH: 70 | C: 10 | 30 | Die coating | Solar cell w/o ITO film | 0.3 | 180 | $3.3 \times 10^{-6}$ |
| Ex. 11 | 30 | Spheres | 10 | 10 | ET: 50 EG: 20 | A: 10 | 20 | Knife | Glass | 0.2 | 300 | $3.5 \times 10^{-6}$ |
| Ex. 12 | 20 | Polyhedrons | 50 | 10 | ET: 50 EG: 20 | B: 10 | 10 | Spray | Aluminum | 1.0 | 200 | $3.8 \times 10^{-6}$ |

TABLE 4

| | Mean particle diameter (nm) | Particle shape | Dispersion (composition) (mass %) | | | | Additive in dispersion (metal ion conc. (ppm)) | Coating method | Base material | Film thickness after baking (μm) | Baking temp. (° C.) | Volume resistivity (Ω·cm) |
|---|---|---|---|---|---|---|---|---|---|---|---|---|
| | | | Metal | Water | Alcohol | Other solvent | | | | | | |
| Ex. 13 | 30 | Spheres | 10 | 10 | PR: 80 | None | 2 | Spray | Aluminum | 1.0 | 180 | $3.6 \times 10^{-6}$ |
| Ex. 14 | 30 | Plates | 30 | 10 | ET: 10 GL: 50 | None | 5 | Screen printing | Copper | 2.0 | 400 | $2.7 \times 10^{-6}$ |
| Ex. 15 | 20 | Spheres | 10 | 10 | ET: 20 BU: 60 | None | 10 | Spray | Silicon substrate | 1.5 | 330 | $3.8 \times 10^{-6}$ |
| Ex. 16 | 15 | Spheres | 10 | 10 | ET: 80 | None | 20 | Inkjet | Silicon substrate | 1.0 | 250 | $3.2 \times 10^{-6}$ |
| Ex. 17 | 10 | Spheres | 10 | 10 | ET: 70 | B: 10 | 5 | Spin | Silicon substrate | 0.3 | 200 | $3.6 \times 10^{-6}$ |
| Ex. 18 | 20 | Spheres | 10 | 10 | ME: 60 ET: 20 | None | 1 | Spin | Silicon substrate | 0.3 | 250 | $3.2 \times 10^{-6}$ |
| Ex. 19 | 30 | Spheres | 10 | 10 | ME: 60 EG: 20 | None | 30 | Spin | Solar cell w/ITO film | 0.3 | 200 | $3.4 \times 10^{-6}$ |
| Ex. 20 | 20 | Plates | 30 | 10 | None | C: 60 | 10 | Screen printing | Solar cell w/ITO film | 2.0 | 200 | $3.2 \times 10^{-6}$ |
| Comp. Ex. 1 | 50 | Spheres | 10 | 10 | ET: 80 | None | — | Inkjet | Silicon substrate | 1.0 | 250 | $7.2 \times 10^{-6}$ |
| Comp. Ex. 2 | 40 | Spheres | 10 | 10 | ME: 60 ET: 20 | None | 20 | Spin | Silicon substrate | 0.1 | 200 | $10 \times 10^{-6}$ |
| Comp. Ex. 3 | 80 | Spheres | 10 | 10 | PG: 80 | None | 20 | Slit | Glass | 0.5 | 300 | $12 \times 10^{-6}$ |

As is clear from Tables 3 and 4, in Examples 1 to 20, the volume resistivities of the formed electrodes were on the order of $2 \times 10^{-6}$ to $3 \times 10^{-6}$ Ω·cm in all cases, and these were preferable values for using the electrode as an electrically conductive material. In addition, the mean particle diameters of the metal particles contained in the dispersions were within a range from 10 to 30 nm, and therefore, it was cofirmed that so-called metal nanoparticles were formed.

On the other hand, in Comparative Examples 1 to 3, the volume resistivities of the coated films demonstrated higher values than those of Examples 1 to 20, and the mean particle diameters of the metal particles in the dispersions were larger than 30 nm. Therefore, the results show that these dispersions were inferior to those of Examples 1 to 20 in terms of properties necessary for using as electrically conductive materials.

In Comparative Example 1, since an additive was not used during the synthesis of the metal nanoparticles, the particle diameter of the particles increased. As a result, a dense coated film was not formed when coating the dispersion containing metal nanoparticles having a large particle diameter, and an adequately dense film was not formed during sintering; thereby, it is presumed that this caused an increase in volume resistivity.

In Comparative Example 2, since the proportion of metal component other than silver was high, this caused a detrimental effect during sintering; thereby, it is presumed that this caused an increase in volume resistivity.

Moreover, in Comparative Example 3, since the temperature during the dispersion synthesis was high, the growth of particles progressed remarkably. As a result, the particle diameter of the particles increased; thereby, it is presumed that this caused an increase in volume resistivity for the same reason as in the case of Comparative Example 1.

Example 21

First, silver nitrate was dissolved in deionized water to prepare an aqueous metal salt solution. In addition, chromium nitrate was dissolved in deionized water to prepare an aqueous additive solution. On the other hand, trisodium citrate was dissolved in deionized water, and particulate ferrous sulfate was added directly to the resulting aqueous trisodium citrate solution having a concentration of 26% in the presence of flowing nitrogen gas at a temperature of 35° C. and was dissolved to prepare a carboxylic acid-reducing agent mixed liquid containing citrate ions and ferrous ions at a molar ratio of 3:2. Next, under conditions where the nitrogen gas flow was maintained at a temperature of 35° C., while stirring the carboxylic acid-reducing agent mixed liquid by rotating a magnetic stirrer at a rotating speed of 100 rpm, the above-mentioned aqueous metal salt solution and the aqueous additive solution were dropped into the carboxylic acid-reducing agent mixed liquid and mixed therewith. Here, as a result of adjusting the concentration of each solution such that the added amount of the aqueous metal salt solution was 1/10 or less the amount of the carboxylic acid-reducing agent mixed liquid, the reaction temperature was maintained at 40° C. even when the aqueous metal salt solution of which the temperature was about room temperature was dropped in. In addition, the mixing ratio of the carboxylic acid-reducing agent mixed liquid to the aqueous metal salt solution was adjusted to be such that the molar ratios of citrate ions and ferrous ions in the carboxylic acid-reducing agent mixed liquid to the total atomic valence of the metal ions in the aqueous metal salt solution were 1.5 and 1, respectively, as shown in Table 5. The mixing ratio of the aqueous additive solution to the aqueous metal salt solution was adjusted to be such that the molar ratio of chromium ions in the aqueous additive solution to the total atomic valence of the metal ions in the aqueous metal salt solution was 0.02. After the completion of dropping the aqueous metal salt solution, the mixed liquid was further continued to be stirred for 15 minutes to obtain a dispersion including a metal colloid. The pH of this dispersion was 5.5, and the stoichiometric amount of metal particles formed in the dispersion was 5 g/liter. The resulting dispersion was left at room temperature, and the aggregates of metal nanoparticles that settled were separated by decantation. Then deionized water was added to this separated product to form a dispersion, and after desalinating by ultrafiltration, the dispersion was further subjected to replacement washing with methanol, and the content of metal (silver) was adjusted to 50% by mass. This dispersion was designated as Example 21. The final mixed amounts of metal (silver), water, methanol, and solvent A relative to 100% by mass of the dispersion were adjusted to 50.0% by mass, 2.5% by mass, 5.0% by mass, and 42.5% by mass, respectively. Here, the solvent A was a mixed liquid in which acetone and isopropyl glycol were mixed at a mass ratio of 1:1. Furthermore, iron in the ferrous sulfate was removed during the replacement washing with methanol, and the like.

Example 22

A dispersion was obtained in the same manner as Example 21 with the exception of using tin nitrate instead of the chromium nitrate of Example 21. The dispersion was left at room temperature, and the aggregates of metal nanoparticles that settled were separated by decantation. Then deionized water was added to this separated product to form a dispersion, and after desalinating by ultrafiltration, the dispersion was further subjected to replacement washing with ethanol, and the content of the metal was adjusted to 50% by mass. This dispersion was designated as a first dispersion.

On the other hand, a dispersion was obtained in the same manner as Example 21, with the exception of using palladium nitrate instead of the silver nitrate of Example 21 and using tin nitrate instead of the chromium nitrate of Example 21. The dispersion was left at room temperature, and the aggregates of metal nanoparticles that settled were separated by decantation. Then deionized water was added to this separated product to form a dispersion, and after desalinating by ultrafiltration, the dispersion was further subjected to replacement washing with ethanol, and the content of the metal was adjusted to 50% by mass. This dispersion was designated as a second dispersion. Next, 77% by mass of the first dispersion and 23% by mass of the second dispersion were mixed. This dispersion was designated as Example 22. Here, the final mixed amounts of metal (total of silver and palladium), water, methanol, and solvent A relative to 100% by mass of the dispersion were adjusted to 50.0% by mass, 1.5% by mass, 2.5% by mass, and 46.0% by mass, respectively.

Comparative Examples 4 and 5

Dispersions were prepared in the same manner as Examples 21 and 22 with the exception of not using the additives.

TABLE 5

| | Metal salt | | Carboxylic acid | | Reducing agent | | Additive | | Reaction temp. (° C.) |
|---|---|---|---|---|---|---|---|---|---|
| | Type | Mass % | Name | Molar ratio | Name | Molar ratio | Name | Molar ratio | |
| Ex. 21 | Ag | 100 | Trisodium citrate | 1.5 | Ferrous sulfate | 1 | Cr nitrate | 0.02 | 40 |
| Ex. 22 | Ag | 77 | Trisodium citrate | 1.5 | Ferrous sulfate | 1 | Sn nitrate | 0.20 | 40 |
| | Au | 23 | | | | | | | |

TABLE 5-continued

| | Metal salt | | Carboxylic acid | | Reducing agent | | Additive | | Reaction temp. (° C.) |
|---|---|---|---|---|---|---|---|---|---|
| | Type | Mass % | Name | Molar ratio | Name | Molar ratio | Name | Molar ratio | |
| Comp. Ex. 4 | Ag | 100 | Trisodium citrate | 1.5 | Ferrous sulfate | 1 | — | — | 40 |
| Comp. Ex. 5 | Ag<br>Au | 77<br>23 | Trisodium citrate | 1.5 | Ferrous sulfate | 1 | — | — | 40 |

<Comparative Test 2 and Evaluation>

The dispersions of metal nanoparticles obtained in Examples 21 and 22 and Comparative Examples 4 and 5 were used as electrode-forming compositions, and the electrode-forming compositions were coated on silicon substrates such that the film thicknesses after baking became 0.1 µm, and then the silicon substrates having the films were baked at 200° C. in air for 30 minutes to form electrodes on the silicon substrates. The electrical conductivity of the silicon substrates on which the electrodes were formed was measured. The results are shown in Table 6.

TABLE 6

| | Mean particle diameter (nm) | Particle shape | Concentration of additive (metal ions) in dispersion (ppm) | Volume resistivity ($\Omega \cdot cm$) |
|---|---|---|---|---|
| Example 21 | 10 | Spheres | 30 | $2.3 \times 10^{-6}$ |
| Example 22 | 30 | Spheres | 50 | $2.9 \times 10^{-6}$ |
| Comp. Ex. 4 | 40 | Spheres | — | $3.2 \times 10^{-6}$ |
| Comp. Ex. 5 | 50 | Spheres | — | $4.4 \times 10^{-6}$ |

As is clear from Table 6, in Examples 21 and 22, the volume resistivities of the coated films were on the order of $2 \times 10^{-6}$ $\Omega \cdot cm$ in both cases, and these were preferable values for using the coated film as an electrically conductive material. In addition, the mean particle diameters were within a range from 10 to 30 nm, and therefore, it was cofirmed that so-called metal nanoparticles were formed.

On the other hand, in Comparative Examples 4 and 5, the volume resistivities of the coated films were higher than those of Examples 21 and 22 that were synthesized by adding an additive, and the mean particle diameters were larger than 30 nm. Therefore, the results show that these dispersions were inferior to those of Examples 21 and 22 in terms of properties necessary for using as electrically conductive materials. Since an additive was not used during the synthesis of the metal nanoparticles, the particle diameter of the particles increased. As a result, a dense coated film was not formed when coating the dispersion containing metal nanoparticles having a large particle diameter, and an adequately dense film was not formed during sintering; thereby, it is presumed that this caused an increase in volume resistivity.

Example 23

A reaction liquid was obtained in the same manner as Example 16. The reaction liquid was left at room temperature, and the aggregates of metal nanoparticles that settled were separated by decantation. Then deionized water was added to this separated precipitate at an amount of 50 times more than the mass of the precipitate to form a dispersion, and after desalinating by ultrafiltration, the dispersion was further subjected to replacement washing with methanol, and the metal content was adjusted to 50% by mass. Thereafter, the composition of the dispersion was adjusted such that the metal (silver) content was 1% by mass, the water content was 24% by mass, and the ethanol content was 75% by mass. This dispersion was designated as Example 23.

Example 24

A reaction liquid was obtained in the same manner as Example 16. The reaction liquid was left at room temperature, and the aggregates of metal nanoparticles that settled were separated by decantation. Then deionized water was added to this separated precipitate at an amount of 5 times more than the mass of the precipitate to form a dispersion, and after desalinating by ultrafiltration, the dispersion was further subjected to replacement washing with methanol, and the metal content was adjusted to 50% by mass. Thereafter, the composition of the dispersion was adjusted such that the metal (silver) content was 1% by mass, the water content was 24% by mass, and the ethanol content was 75% by mass. This dispersion was designated as Example 24.

Example 25

A reaction liquid was obtained in the same manner as Example 16. The reaction liquid was left at room temperature, and the aggregates of metal nanoparticles that settled were separated by decantation. Then deionized water was added to this separated precipitate at an amount of 50000 times more than the mass of the precipitate to form a dispersion, and after desalinating by ultrafiltration, the dispersion was further subjected to replacement washing with methanol, and the metal content was adjusted to 50% by mass. Thereafter, the composition of the dispersion was adjusted such that the metal (silver) content was 1% by mass, the water content was 24% by mass, and the ethanol content was 75% by mass. This dispersion was designated as Example 25.

Example 26

A reaction liquid was obtained in the same manner as Example 16. The reaction liquid was left at room temperature, and the aggregates of metal nanoparticles that settled were separated by decantation. Then deionized water was added to this separated precipitate at an amount of 50 times more than the mass of the precipitate to form a dispersion, and after desalinating by ultrafiltration, the dispersion was further subjected to replacement washing with methanol, and the metal content was adjusted to 50% by mass. Thereafter, the composition of the dispersion was adjusted such that the metal (silver) content was 1% by mass, the water content was 24% by mass, and the ethanol content was 75% by mass. This dispersion was designated as Example 26.

Comparative Example 6

A reaction liquid was obtained in the same manner as Example 16. The reaction liquid was left at room temperature, and the aggregates of metal nanoparticles that settled were separated by decantation. Then deionized water was added to this separated precipitate at an amount equal to 1% by mass of the precipitate to form a dispersion, and after desalinating by ultrafiltration, the dispersion was further subjected to replacement washing with methanol, and the metal content was adjusted to 50% by mass. Thereafter, the composition of the dispersion was adjusted such that the metal (silver) content was 1% by mass, the water content was 24% by mass, and the ethanol content was 75% by mass. This dispersion was designated as Comparative Example 6.

Comparative Example 7

A reaction liquid was obtained in the same manner as Example 16. The reaction liquid was left at room temperature, and the aggregates of metal nanoparticles that settled were separated by decantation. Then deionized water was added to this separated precipitate at an amount of 50 times more than the mass of the precipitate to form a dispersion, and after desalinating by ultrafiltration, the dispersion was further subjected to replacement washing with methanol, and the metal content was adjusted to 50% by mass. Thereafter, the composition of the dispersion was adjusted such that the metal (silver) content was 50% by mass, the water content was 17% by mass and the ethanol content was 33% by mass. This dispersion was designated as Comparative Example 7.

<Comparative Test 3 and Evaluation>

The additive concentrations (Sn concentrations) in the dispersions of metal nanoparticles obtained in Examples 23 to 26 and Comparative Examples 6 and 7 were evaluated using inductively coupled plasma emission spectrometry. In addition, the dispersion stabilities (during stored at 3 to 5° C.) of these dispersions were investigated visually. The results are shown in Table 7 below.

TABLE 7

| | Sn concentration in dispersion (ppm) | Dispersion stability |
|---|---|---|
| Example 23 | 10 | Stable for 90 days or more |
| Example 24 | 100 | Stable up to 10 days, precipitate formed within 30 days |
| Example 25 | 0.01 | Stable for 90 days or more |
| Example 26 | 0.01 | Stable for 90 days or more |
| Comp. Ex. 6 | 500 | Precipitate formed within 3 days |
| Comp. Ex. 7 | 500 | Precipitate formed within 3 days |

As is clear from Table 7, the dispersion stability was confirmed to be maintained for a fixed period of time, if the concentration of the metal element that composed the additive in the dispersion was 100 ppm or less as in Examples 23 to 26.

Here, the concentration of the additive could be controlled such that the concentration of the metal element that composed the additive in the dispersion was 0.01 ppm in the manner of Examples 25 and 26. In addition, although not shown in this comparative test, it was also confirmed that the concentration could be controlled to less than 0.01 ppm. In this case as well, the dispersion stability was maintained.

However, it is difficult to use a large amount of deionized water so as to decrease the concentration of the additive to be below that in Example 25 from the viewpoint of cost. In addition, it is difficult to lower the concentration of the metal nanoparticles in the product to be below that of Example 26, because there is a risk of causing problems in terms of use of the product.

On the other hand, as shown in Comparative Examples 6 and 7, it was confirmed that if the element in the additive was contained at an amount of about 500 ppm in the dispersion, remarkable deterioration of dispersion stability was incurred. On the basis thereof, it was confirmed that the concentration of the metal element composing the additive in the dispersion was preferably within a range from 0.01 to 100 ppm.

(Examples Relating to Embodiments According to [18] to [34])

The following provides a detailed explanation of examples of the embodiments according to [18] to [34] together with comparative examples thereof.

Examples 27 to 39 and Comparative Examples 8 to 10

First, the metal salts containing metal elements, carboxylic acids, reducing agents, and additives which are shown in the following Table 8 were respectively dissolved in deionized water to respectively prepare saturated aqueous solutions at room temperature. Here, nitrates were used for the metal salts, with the exception that chlorine compounds were used only for Au and Pt.

Next, the resulting aqueous carboxylic acid solution B was mixed with either one of the aqueous metal salt solution A and the aqueous reducing agent solution C to form a mixed liquid, and the other one of the aqueous metal salt solution A and the aqueous reducing agent solution C was added to the mixed liquid and further mixed therewith. The order of mixing was either one of the case shown in FIG. 1 where the aqueous carboxylic acid solution B was first mixed with the aqueous metal salt solution A, and then the aqueous reducing agent solution C was added to the mixed liquid, and the case shown in FIG. 2 where the aqueous carboxylic acid solution B was first mixed with the aqueous reducing agent solution C, and then the aqueous metal salt solution A was added to the mixed liquid.

Here, in the second mixing step in which all of the aqueous carboxylic acid solution B, the aqueous metal salt solution A, and the aqueous reducing agent solution C were added and mixed, the mixtures were heated to the reaction temperatures listed in the column entitled "reaction temperature" in Table 8 using a water bath, and after reaching the reaction temperatures, the mixtures were continued to be stirred with a magnetic stirrer at a rotating speed of 400 ppm for 4 hours while refluxing. The resulting reaction liquids were used as the reaction liquids of Examples 27 to 39 and Comparative Examples 8 to 10, and information about the aqueous carboxylic acid solution B, the aqueous metal salt solution A, and the aqueous reducing agent solution C which were used to obtain the reaction liquids are shown in Table 8.

Here, with regard to the reaction liquids of Examples 27 to 39, after reacting for 4 hours, dry substances of the reaction liquids were evaluated by X-ray analysis. As a result, carboxylic acid salts of the added metals were not detected.

After the completion of the reaction, the reaction liquids were centrifuged for 3 minutes at 1000 G to separate the precipitates from the reaction liquids. Moreover, 0.1 M of aqueous ammonia was added to the separated precipitate at an amount of 50 times more than the mass of the precipitate, and stirred for 10 minutes. Thereafter, the resulting dispersion was again centrifuged for 3 minutes at 1000 G to separate the precipitate from the dispersion. Water was added to the precipitate, and after desalting by ultrafiltration, solvents of which the types and the proportions are shown in following Table 9 were added and stirred to obtain the dispersions of metal nanoparticles of Examples 27 to 39 and Comparative Examples 8 to 10. The types and mixing ratios of raw materials used to obtain the dispersions of Examples 27 to 39 and Comparative Examples 8 to 10, together with the reaction temperatures and the synthesis flows, are shown in Table 8. Here, the value described in the column entitled "molar ratio" in Table 8 indicates the molar ratio to the total amount of all raw material metal ions. In addition, in the column entitled "synthesis flow" in Table 8, the number "(1)" indicates that the dispersion was synthesized according to the flow shown in FIG. 1, while the number "(2)" indicates that the dispersion was synthesized according to the flow shown in FIG. 2.

material. Then the electrical conductivity of the base materials on which these electrodes were formed was measured. The results are shown in Table 9.

Here, the electrical conductivity was evaluated using the volume resistivity (Ω·cm) measured and calculated according to the four terminal method. More specifically, at first, the thickness of the electrode after baking was directly measured from a cross-section of the electrode using a scanning electron microscope (SEM, Model 5800, Hitachi, Ltd.), and then the measured thickness of the electrode was input into a specific resistance meter (Loresta, Mitsubishi Chemical Corp.). Thereafter, by using this specific resistance meter, the volume resistivity of the electrode was measured according to the four terminal method.

Table 9 show the mean particle diameter of metal nanoparticles in the dispersion, the shape of the particles, the blending ratios of components that compose the electrode-forming composition, the coating method, the type of base material, the film thickness after baking, and the baking temperature, together with the electrical conductivity (volume resistivity). The mean particle diameter of the metal nanoparticles in the dispersions of metal nanoparticles was measured using a field-emission transmission electron microscope (FE-TEM, JEOL Ltd.).

TABLE 8

| | Metal salt | | Carboxylic acid | | Reducing agent | | Additive | | Reaction temp. (° C.) | Synthesis flow |
|---|---|---|---|---|---|---|---|---|---|---|
| | Type | Mass % | Name | Molar ratio | Name | Molar ratio | Name | Molar ratio | | |
| Ex. 27 | Ag | 100 | Glycolic acid | 1 | Hydrazine | 1 | Hydrochloric acid | 0.01 | 25 | (1) |
| Ex. 28 | Ag | 95 | Citric acid | 1 | Hydrazine acetate | 2 | Sulfuric acid | 0.02 | 60 | (1) |
| | Au | 5 | | | | | | | | |
| Ex. 29 | Ag | 75 | Triammonium citrate | 1 | Ammonium formate | 1 | Hydroiodic acid | 0.02 | 60 | (2) |
| | Pt | 25 | | | | | | | | |
| Ex. 30 | Ag | 80 | Diammonium malate | 1 | Na formate | 1 | Hydrobromic acid | 0.01 | 60 | (2) |
| | Pd | 20 | | | | | | | | |
| Ex. 31 | Ag | 99.98 | Maleic acid | 0.5 | Na formate | 1 | Boric acid | 0.02 | 60 | (2) |
| | Ru | 0.02 | | | | | | | | |
| Ex. 32 | Ag | 100 | Disodium maleate | 2 | Na oxalate | 1 | Malic acid | 0.02 | 80 | (1) |
| Ex. 33 | Ag | 100 | Disodium malonate | 2 | Na ascorbate | 0.5 | Triammonium malate | 0.03 | 30 | (2) |
| Ex. 34 | Ag | 100 | Malonic acid | 0.5 | Na ascorbate | 2 | Disodium sulfate | 0.05 | 30 | (2) |
| Ex. 35 | Ag | 100 | Fumaric acid | 1 | Na borohydride | 0.5 | Hydroiodic acid | 0.02 | 40 | (1) |
| Ex. 36 | Ag | 100 | Disodium fumarate | 0.5 | Na borohydride | 0.5 | Hydrobromic acid | 0.03 | 40 | (1) |
| Ex. 37 | Ag | 100 | Succinic acid | 0.5 | K borohydride | 0.5 | Disodium borate | 0.01 | 40 | (1) |
| Ex. 38 | Ag | 100 | Diammonium tartrate | 1 | Glucose | 0.5 | Trisodium malate | 0.01 | 95 | (2) |
| | | | | | Na ascorbate | 0.1 | | | | |
| Ex. 39 | Ag | 100 | Diammonium tartrate | 1 | Glucose | 0.5 | Dipotassium borate | 0.02 | 95 | (2) |
| Comp. Ex. 8 | Ag | 100 | Disodium fumarate | 0.5 | Na borohydride | 0.5 | — | — | 40 | (1) |
| Comp. Ex. 9 | Ag | 60 | Triammonium citrate | 1 | Ammonium formate | 1 | Hydroiodic acid | 0.02 | 60 | (2) |
| | Pt | 40 | | | | | | | | |
| Comp. Ex. 10 | Ag | 100 | Disodium maleate | 2 | Na oxalate | 1 | Malic acid | 0.02 | 100 | (1) |

<Comparative Test 1 and Evaluation>

The dispersions of metal nanoparticles obtained in Examples 27 to 39 and Comparative Examples 8 to 10 were used as electrode-forming compositions, and the electrode-forming compositions were coated on base materials such that the film thicknesses after baking became the values as shown in the following Table 9, and then the base materials having the films were baked for 30 minutes at the temperatures shown in Table 9 to form electrodes on the base materials. Either one of a solar cell with an ITO film, a solar cell without an ITO film, a silicon substrate, a glass plate, a polyimide plate, a PET film, glass plate with an ITO film, an aluminum plate, and a copper plate was used as the base In the column entitled "Alcohol" in Table 9, ME indicates methanol, ET indicates ethanol, EG indicates ethylene glycol, BU indicates butanol, PG indicates propylene glycol, DEG indicates diethylene glycol, GL indicates glycerol, ER indicates erythritol, IH indicates isobornyl hexanol, and PR indicates propanol.

In addition, in the column entitled "Other solvent" in Table 9, "A" indicates a mixed liquid of acetone and isopropyl glycol mixed at a mass ratio of 1:1, "B" indicates a mixed liquid of cyclohexane and methyl ethyl ketone mixed at a mass ratio of 1:1, and "C" indicates a mixed liquid of toluene and hexane mixed at a mass ratio of 1:1.

TABLE 9

| | Mean particle | | Dispersion (composition) (mass %) | | | | Additive in dispersion (metal ion conc. (ppm)) | Coating method | Base material | Film thickness after baking (μm) | Baking temp. (° C.) | Volume resistivity (Ω · cm) |
|---|---|---|---|---|---|---|---|---|---|---|---|---|
| | diameter (nm) | Particle shape | Metal | Water | Alcohol | Other solvent | | | | | | |
| Ex. 27 | 20 | Spheres | 10 | 10 | ME: 80 | None | 10 | Dispenser | Glass | 2.0 | 200 | $3.2 \times 10^{-6}$ |
| Ex. 28 | 20 | Spheres | 10 | 10 | ME: 80 | None | 5 | Spray | Glass | 0.5 | 200 | $3.1 \times 10^{-6}$ |
| Ex. 29 | 20 | Plates | 10 | 10 | ME: 60 ET: 20 | None | 10 | Spin | Silicon substrate | 0.1 | 200 | $3.1 \times 10^{-6}$ |
| Ex. 30 | 20 | Plates | 10 | 10 | EG: 80 | None | 10 | Spin | Glass w/ ITO film | 0.5 | 300 | $3.2 \times 10^{-6}$ |
| Ex. 31 | 30 | Polyhedrons | 10 | 10 | ET: 20 BU: 60 | None | 5 | Knife | Polyimide | 2.0 | 130 | $3.9 \times 10^{-6}$ |
| Ex. 32 | 20 | Spheres | 10 | 10 | PG: 80 | None | 10 | Slit | Glass | 0.5 | 300 | $3.1 \times 10^{-6}$ |
| Ex. 33 | 20 | Spheres | 50 | 10 | DEG: 40 | None | 30 | Screen printing | Glass | 2.0 | 400 | $3.1 \times 10^{-6}$ |
| Ex. 34 | 20 | Spheres | 10 | 10 | ET: 20 GL: 60 | None | 20 | Screen printing | PET film | 2.0 | 150 | $3.9 \times 10^{-6}$ |
| Ex. 35 | 30 | Plates | 50 | 10 | EG: 10 ER: 30 | None | 40 | Offset printing | Solar cell w/ITO film | 2.0 | 150 | $3.8 \times 10^{-6}$ |
| Ex. 36 | 20 | Plates | 10 | 10 | IH: 70 | C: 10 | 30 | Die coating | Solar cell w/o ITO film | 0.3 | 180 | $3.8 \times 10^{-6}$ |
| Ex. 37 | 20 | Polyhedrons | 10 | 10 | ET: 50 EG: 20 | A: 10 | 80 | Knife | Glass | 0.2 | 300 | $2.5 \times 10^{-6}$ |
| Ex. 38 | 10 | Spheres | 50 | 10 | ET: 50 EG: 20 | B: 10 | 90 | Spray | Aluminum | 1.0 | 200 | $2.7 \times 10^{-6}$ |
| Ex. 39 | 25 | Spheres | 10 | 10 | PR: 80 | None | 50 | Spray | Aluminum | 1.0 | 180 | $3.6 \times 10^{-6}$ |
| Comp. Ex. 8 | 50 | Spheres | 10 | 10 | ET: 80 | None | — | Inkjet | Silicon substrate | 1.0 | 250 | $7.4 \times 10^{-6}$ |
| Comp. Ex. 9 | 50 | Plates | 10 | 10 | ME: 60 ET: 20 | None | 1 | Spin | Silicon substrate | 0.1 | 200 | $11 \times 10^{-6}$ |
| Comp. Ex. 10 | 70 | Spheres | 10 | 10 | PG: 80 | None | 20 | Slit | Glass | 0.5 | 300 | $9.8 \times 10^{-6}$ |

As is clear from Table 9, in Examples 27 to 39, the volume resistivities of the formed electrodes were on the order of $2 \times 10^{-6}$ to $3 \times 10^{-6}$ Ω·cm in all cases, and these were preferable values for using the electrode as an electrically conductive material. In addition, the mean particle diameters of the metal particles contained in the dispersions were within a range from 10 to 30 nm, and therefore, it can be cofirmed that so-called metal nanoparticles were formed.

On the other hand, in Comparative Examples 8 to 10, the volume resistivities of the coated films demonstrated higher values than those of Examples 27 to 39, and the mean particle diameters of the metal particles in the dispersions were larger than 30 nm. Therefore, the results show that these dispersions were inferior to those of Examples 27 to 39 in terms of properties necessary for using as electrically conductive materials.

In Comparative Example 8, since an additive was not used during the synthesis of the metal nanoparticles, the particle diameter of the particles increased. As a result, a dense coated film was not formed when coating the dispersion containing metal nanoparticles having a large particle diameter, and an adequately dense film was not formed during sintering; thereby, it is presumed that this caused an increase in volume resistivity.

In addition, in Comparative Example 9, since the proportion of metal component other than silver was high, this caused a detrimental effect during sintering; thereby, it is presumed that this caused an increase in volume resistivity.

Moreover, in Comparative Example 10, since the temperature during the dispersion synthesis was high, the growth of particles progressed remarkably. As a result, the particle diameter of the particles increased; thereby, it is presumed that this caused an increase in volume resistivity for the same reason as in the case of Comparative Example 8.

Example 40

First, silver nitrate was dissolved in deionized water to prepare an aqueous metal salt solution. In addition, triammonium phosphate was dissolved in deionized water to prepare an aqueous additive solution. On the other hand, trisodium citrate was dissolved in deionized water, and particulate ferrous sulfate was added directly to the resulting aqueous trisodium citrate solution having a concentration of 26% in the presence of flowing nitrogen gas at a temperature of 35° C. and was dissolved to prepare a carboxylic acid-reducing agent mixed liquid containing citrate ions and ferrous ions at a molar ratio of 3:2. Next, under conditions where the nitrogen gas flow was maintained at a temperature of 35° C., while stirring the carboxylic acid-reducing agent mixed liquid by rotating a magnetic stirrer at a rotating speed of 100 rpm, the above-mentioned aqueous metal salt solution and the aqueous additive solution were dropped into the carboxylic acid-reducing agent mixed liquid and mixed therewith. Here, as a result of adjusting the concentration of each solution such that the added amount of the aqueous metal salt solution was 1/10 or less the amount of the carboxylic acid-reducing agent mixed liquid, the reaction temperature was maintained at 40° C. even when the aqueous metal salt solution of which the temperature was about room temperature was dropped in. In addition, the mixing ratio of the carboxylic acid-reducing agent mixed liquid to the aqueous metal salt solution was adjusted to be such that the molar ratios of citrate ions and ferrous ions in the carboxylic acid-reducing agent mixed liquid to the total atomic valence of the metal ions in the aqueous metal salt solution were 1.5 and 1, respectively, as shown in Table 10. The mixing ratio of the aqueous additive solution to the aqueous metal salt solution was adjusted to be such that the molar ratio of phosphate ions in the aqueous additive solution to the total atomic valence of the metal ions in the aqueous metal salt solution was 0.02. After the completion of dropping the aqueous metal salt solution, the mixed liquid was further continued to be stirred for 15 minutes to obtain a dispersion including a metal colloid. The pH of this dispersion was 5.5, and the stoichiometric amount of metal particles formed in the dispersion was 5 g/liter. The resulting dispersion was left at room temperature, and the aggregates of metal nanoparticles that settled were separated by decantation. Then deionized water was added to this separated product to form a dispersion, and after desalinating by ultrafiltration, the dispersion was further subjected to replacement washing with methanol, and the content of metal (silver) was adjusted to 50% by mass. This dispersion was designated as Example 40. The final mixed amounts of metal (silver), water, methanol, and solvent A relative to 100% by mass of the dispersion were adjusted to 50.0% by mass, 2.5% by mass, 5.0% by mass, and 42.5% by mass, respectively. Here, the solvent A was a mixed liquid in which acetone and isopropyl glycol were mixed at a mass ratio of 1:1. Furthermore, iron in the ferrous sulfate was removed during the replacement washing with methanol, and the like.

Example 41

A dispersion was obtained in the same manner as Example 40 with the exception of using hydrobromic acid instead of the triammonium phosphate of Example 40. The dispersion was left at room temperature, and the aggregates of metal nanoparticles that settled were separated by decantation. Then deionized water was added to this separated product to form a dispersion, and after desalinating by ultrafiltration, the dispersion was further subjected to replacement washing with ethanol, and the content of metal was adjusted to 50% by mass. This dispersion was designated as a first dispersion.

On the other hand, a dispersion was obtained in the same manner as Example 40, with the exception of using palladium nitrate instead of the silver nitrate of Example 40 and using hydrobromic instead of the triammonium phosphate of Example 40. The dispersion was left at room temperature, and the aggregates of metal nanoparticles that settled were separated by decantation. Then deionized water was added to this separated product to form a dispersion, and after desalinating by ultrafiltration, the dispersion was further subjected to replacement washing with ethanol, and the content of metal was adjusted to 50% by mass. This dispersion was designated as a second dispersion. Next, 77% by mass of the first dispersion and 23% by mass of the second dispersion were mixed. This dispersion was designated as Example 41. Here, the final mixed amounts of metal (total of silver and palladium), water, methanol, and solvent A relative to 100% by mass of the dispersion were adjusted to 50.0% by mass, 1.5% by mass, 2.5% by mass, and 46.0% by mass, respectively.

Comparative Examples 11 and 12

Dispersions were obtained in the same manner as Examples 40 and 41 with the exception of not using the additives.

TABLE 10

| | Metal salt | | Carboxylic acid | | Reducing agent | | Additive | | Reaction temp. |
|---|---|---|---|---|---|---|---|---|---|
| | Type | Mass % | Name | Molar ratio | Name | Molar ratio | Name | Molar ratio | (° C.) |
| Ex. 40 | Ag | 100 | Trisodium citrate | 1.5 | Ferrous sulfate | 1 | Triammonium phosphate | 0.02 | 40 |
| Ex. 41 | Ag Au | 77 23 | Trisodium citrate | 1.5 | Ferrous sulfate | 1 | Hydrobromic acid | 0.20 | 40 |
| Comp. Ex. 11 | Ag | 100 | Trisodium citrate | 1.5 | Ferrous sulfate | 1 | — | — | 40 |
| Comp. Ex. 12 | Ag Au | 77 23 | Trisodium citrate | 1.5 | Ferrous sulfate | 1 | — | — | 40 |

<Comparative Test 2 and Evaluation>

The dispersions of metal nanoparticles obtained in Examples 40 and 41 and Comparative Examples 11 and 12 were used as electrode-forming compositions, and the electrode-forming compositions were coated on silicon substrates such that the film thicknesses after baking became 0.1 µm, and then the silicon substrates having the films were baked at 200° C. in air for 30 minutes to form electrodes on the silicon substrates. The electrical conductivity of the silicon substrates on which the electrodes were formed was measured. The results are shown in Table 11.

TABLE 11

| | Mean particle diameter (nm) | Particle shape | Concentration of additive (metal ions) in dispersion (ppm) | Volume resistivity ($\Omega \cdot cm$) |
|---|---|---|---|---|
| Example 40 | 20 | Spheres | 20 | $3.1 \times 10^{-6}$ |
| Example 41 | 30 | Spheres | 40 | $3.9 \times 10^{-6}$ |
| Comp. Ex. 11 | 50 | Spheres | — | $5.1 \times 10^{-6}$ |
| Comp. Ex. 12 | 55 | Spheres | — | $5.9 \times 10^{-6}$ |

As is clear from Table 11, in Examples 40 and 41, the volume resistivities of the coated films were on the order of $3 \times 10^{-6}$ $\Omega \cdot cm$ in both cases, and these were preferable values for using the coated film as an electrically conductive material. In addition, the mean particle diameters were within a range from 20 to 30 nm, and therefore, it was cofirmed that so-called metal nanoparticles were formed.

On the other hand, in Comparative Examples 11 and 12, the volume resistivities of the coated films were higher than those of Examples 40 and 41 that were synthesized by adding an additive, and the mean particle diameters were larger than 30 nm. Therefore, the results show that these dispersions were inferior to those of Examples 40 and 41 in terms of properties necessary for using as electrically conductive materials. Since an additive was not used during the synthesis of the metal nanoparticles, the particle diameter of the particles increased. As a result, a dense coated film was not formed when coating the dispersion containing metal nanoparticles having a large particle diameter, and an adequately dense film was not formed during sintering; thereby, it is presumed that this caused an increase in volume resistivity.

Example 42

A reaction liquid was obtained in the same manner as Example 28. The reaction liquid was left at room temperature, and the aggregates of metal nanoparticles that settled were separated by decantation. Then deionized water was added to this separated precipitate at an amount of 50 times more than the mass of the precipitate to form a dispersion, and after desalinating by ultrafiltration, the dispersion was further subjected to replacement washing with methanol, and the metal content was adjusted to 50% by mass. Thereafter, the composition of the dispersion was adjusted such that the metal (silver) content was 1% by mass, the water content was 24% by mass, and the ethanol content was 75% by mass. This dispersion was designated as Example 42.

Example 43

A reaction liquid was obtained in the same manner as Example 28. The reaction liquid was left at room temperature, and the aggregates of metal nanoparticles that settled were separated by decantation. Then deionized water was added to this separated precipitate at an amount of 5 times more than the mass of the precipitate to form a dispersion, and after desalinating by ultrafiltration, the dispersion was further subjected to replacement washing with methanol, and the metal content was adjusted to 50% by mass. Thereafter, the composition of the dispersion was adjusted such that the metal (silver) content was 1% by mass, the water content was 24% by mass, and the ethanol content was 75% by mass. This dispersion was designated as Example 43.

Example 44

A reaction liquid was obtained in the same manner as Example 28. The reaction liquid was left at room temperature, and the aggregates of metal nanoparticles that settled were separated by decantation. Then deionized water was added to this separated precipitate at an amount of 50000 times more than the mass of the precipitate to form a dispersion, and after desalinating by ultrafiltration, the dispersion was further subjected to replacement washing with methanol, and the metal content was adjusted to 50% by mass. Thereafter, the composition of the dispersion was adjusted such that the metal (silver) content was 1% by mass, the water content was 24% by mass, and the ethanol content was 75% by mass. This dispersion was designated as Example 44.

Example 45

A reaction liquid was obtained in the same manner as Example 28. The reaction liquid was left at room temperature, and the aggregates of metal nanoparticles that settled were separated by decantation. Then deionized water was added to this separated precipitate at an amount of 50 times more than the mass of the precipitate to form a dispersion, and after desalinating by ultrafiltration, the dispersion was further subjected to replacement washing with methanol, and the metal content was adjusted to 50% by mass. Thereafter, the composition of the dispersion was adjusted such that the metal (silver) content was 1% by mass, the water content was 24% by mass, and the ethanol content was 75% by mass. This dispersion was designated as Example 45.

Comparative Example 13

A reaction liquid obtained in the same manner as Example 28. The reaction liquid was left at room temperature, and the aggregates of metal nanoparticles that settled were separated by decantation. Then deionized water was added to this separated precipitate at an amount equal to 1% by mass of the precipitate to form a dispersion, and after desalinating by ultrafiltration, the dispersion was further subjected to replacement washing with methanol, and the metal content was adjusted to 50% by mass. Thereafter, the composition of the dispersion was adjusted such that the metal (silver) content was 1% by mass, the water content was 24% by mass, and the ethanol content was 75% by mass. This dispersion was designated as Comparative Example 13.

Comparative Example 14

A reaction liquid was obtained in the same manner as Example 28. The reaction liquid was left at room temperature, and the aggregates of metal nanoparticles that settled were separated by decantation. Then deionized water was added to this separated precipitate at an amount of 50 times more than the mass of the precipitate to form a dispersion, and after desalinating by ultrafiltration, the dispersion was further subjected to replacement washing with methanol, and the metal content was adjusted to 50% by mass. Thereafter, the composition of the dispersion was adjusted such that the metal (silver) content was 50% by mass, the water content was 17% by mass and the ethanol content was 33% by mass. This dispersion was designated as Comparative Example 14.

<Comparative Test 3 and Evaluation>

The additive concentrations ($SO_4^{2-}$ concentrations) in the dispersions of metal nanoparticles obtained in Examples 42 to 45 and Comparative Examples 13 and 14 were evaluated using ion chromatography. In addition, the dispersion stabilities (during stored at 3 to 5° C.) of these dispersions were investigated visually. The results are shown in Table 12 below.

TABLE 12

| | $SO_4^{2-}$ concentration in dispersion (ppm) | Dispersion stability |
|---|---|---|
| Example 42 | 10 | Stable for 90 days or more |
| Example 43 | 100 | Stable up to 10 days, precipitate formed within 30 days |
| Example 44 | 0.01 | Stable for 90 days or more |
| Example 45 | 0.01 | Stable for 90 days or more |
| Comp. Ex. 13 | 500 | Precipitate formed within 3 days |
| Comp. Ex. 14 | 500 | Precipitate formed within 3 days |

As is clear from Table 12, the dispersion stability was confirmed to be maintained for a fixed period of time, if the concentration of the ions that composed the additive in the dispersion was 100 ppm or less as in Examples 42 to 45.

Here, the concentration of the additive could be controlled such that the concentration of the ions that composed the additive in the dispersion was 0.01 ppm in the manner of Examples 44 and 45. In addition, although not shown in this comparative test, it was also confirmed that the concentration could be controlled to less than 0.01 ppm. In this case as well, the dispersion stability was maintained. However, it is difficult to use a large amount of deionized water so as to decrease the concentration of the additive to be below that in Example 44 from the viewpoint of cost. In addition, it is difficult to lower the concentration of the metal nanoparticles in the product to be below that of Example 45, because there is the risk of causing problems in terms of use of the product.

On the other hand, as shown in Comparative Examples 13 and 14, it was confirmed that if the ions in the additive were contained at an amount of about 500 ppm in the dispersion, remarkable deterioration of dispersion stability was incurred. On the basis thereof, it was confirmed that the concentration of the ions composing the additive in the dispersion was preferably within a range from 0.01 to 100 ppm.

(Examples Relating to Embodiments According to [35] to [52])

The following provides a detailed explanation of examples of the embodiments according to [35] to [52] together with comparative examples.

Examples 46 to 58 and Comparative Examples 15 to 17

First, metal salts containing metal elements, carboxylic acids, reducing agents, and additives which are shown in the following Table 13 were respectively dissolved in deionized water to respectively prepare saturated aqueous solutions at room temperature. Here, nitrates were used for the metal salts, with the exception that chlorine compounds were used only for Au and Pt.

Next, the resulting aqueous carboxylic acid solution B was mixed with either one of the aqueous metal salt solution A and the aqueous reducing agent solution C to form a mixed liquid, and the other one of the aqueous metal salt solution A and the aqueous reducing agent solution C was added to the mixed liquid and further mixed therewith. The order of mixing was either one of the case shown in FIG. 1 where the aqueous carboxylic acid solution B was first mixed with the aqueous metal salt solution A, and then the aqueous reducing agent solution C was added to the mixed liquid, and the case shown in FIG. 2 where the aqueous carboxylic acid solution B was first mixed with the aqueous reducing agent solution C, and then the aqueous metal salt solution A was added to the mixed liquid.

Here, in the second mixing step in which all of the aqueous carboxylic acid solution B, the aqueous metal salt solution A, and the aqueous reducing agent solution C were added and mixed, the mixtures were heated to the reaction temperatures listed in the column entitled "reaction temperature" in Table 13 using a water bath, and after reaching the reaction temperatures, the mixtures were continued to be stirred with a magnetic stirrer at a rotating speed of 400 ppm for 4 hours while refluxing. The resulting reaction liquids were used as the reaction liquids of Examples 46 to 58 and Comparative Examples 15 to 17, and information about the aqueous carboxylic acid solution B, the aqueous metal salt solution A, and the aqueous reducing agent solution C which were used to obtain the reaction liquids are shown in Table 13.

Here, with regard to the reaction liquids of Examples 46 to 58, after reacting for 4 hours, dry substances of the reaction liquids were evaluated by X-ray analysis. As a result, carboxylic acid salts of the added metals were not detected.

After the completion of the reaction, the reaction liquids were centrifuged for 3 minutes at 1000 G to separate the precipitates from the reaction liquids. Moreover, 0.1 M of aqueous ammonia was added to the separated precipitate at an amount of 50 times more than the mass of the precipitate, and stirred for 10 minutes. Thereafter, the resulting dispersion was again centrifuged for 3 minutes at 1000 G to separate the precipitate from the dispersion. Water was added to the precipitate, and after desalting by ultrafiltration, solvents of which the types and the proportions are shown in following Table 14 were added and stirred to obtain the dispersions of metal nanoparticles of Examples 46 to 58 and Comparative Examples 15 to 17. The types and mixing ratios of raw materials used to obtain the dispersions of Examples 46 to 58 and Comparative Examples 15 to 17, together with the reaction temperatures and the synthesis flows, are shown in Table 13. Here, the value described in the column entitled "molar ratio" in Table 13 indicates the molar ratio to the total amount of all raw material metal ions. The value described in the column entitled "mass ratio" in Table 13 indicates the mass ratio to the total amount of all raw material metal ions. In addition, in the column entitled "synthesis flow" in Table 13, the number "(1)" indicates that the dispersion was synthesized according to the flow shown in FIG. 1, while the number "(2)" indicates that the dispersion was synthesized according to the flow shown in FIG. 2.

TABLE 13

| | Metal salt | | Carboxylic acid | | Reducing agent | | Additive | | Reaction temp. (° C.) | Synthesis flow |
|---|---|---|---|---|---|---|---|---|---|---|
| | Type | Mass % | Name | Molar ratio | Name | Molar ratio | Name | Mass ratio | | |
| Ex. 46 | Ag | 100 | Glycolic acid | 1 | Hydrazine | 1 | PVP* (M.W. = 10000) | 0.01 | 25 | (1) |
| Ex. 47 | Ag | 95 | Citric acid | 1 | Hydrazine acetate | 2 | PVP (M.W. = 50000) | 0.02 | 40 | (1) |
| | Au | 5 | | | | | | | | |
| Ex. 48 | Ag | 75 | Triammonium citrate | 1 | Ammonium formate | 1 | Methyl cellulose | 0.05 | 60 | (2) |
| | Pt | 25 | | | | | | | | |
| Ex. 49 | Ag | 80 | Diammonium malate | 1 | Na formate | 1 | Hydroxypropyl methyl cellulose | 0.02 | 60 | (2) |
| | Pd | 20 | | | | | | | | |
| Ex. 50 | Ag | 99.98 | Maleic acid | 0.5 | Na formate | 1 | PVA* (M.W. = 90000) | 0.04 | 60 | (2) |
| | Ru | 0.02 | | | | | | | | |

TABLE 13-continued

| | Metal salt | | Carboxylic acid | | Reducing agent | | Additive | | Reaction | Synthesis |
|---|---|---|---|---|---|---|---|---|---|---|
| | Type | Mass % | Name | Molar ratio | Name | Molar ratio | Name | | temp. (° C.) | flow |
| Ex. 51 | Ag | 100 | Disodium maleate | 2 | Na oxalate | 1 | PVA (M.W. = 90000) | 0.05 | 80 | (1) |
| Ex. 52 | Ag | 100 | Disodium malonate | 2 | Na ascorbate | 0.5 | Polyacrylic acid (M.W. = 100000) | 0.50 | 30 | (2) |
| Ex. 53 | Ag | 100 | Malonic acid | 0.5 | Na ascorbate | 2 | PVA (M.W. = 90000) | 0.10 | 30 | (2) |
| Ex. 54 | Ag | 100 | Fumaric acid | 1 | Na borohydride | 0.5 | PVP (M.W. = 50000) | 0.05 | 40 | (1) |
| Ex. 55 | Ag | 100 | Disodium fumarate | 0.5 | Na borohydride | 0.5 | PVP (M.W. = 50000) | 0.10 | 40 | (1) |
| Ex. 56 | Ag | 100 | Succinic acid | 0.5 | K borohydride | 0.5 | PVP (M.W. = 50000) | 0.10 | 40 | (1) |
| Ex. 57 | Ag | 100 | Diammonium tartrate | 1 | Glucose / Na ascorbate | 0.5 / 0.1 | Polyacrylic acid (M.W. = 100000) | 0.05 | 95 | (2) |
| Ex. 58 | Ag | 100 | Diammonium tartrate | 1 | Glucose | 0.5 | Polyacrylic acid (M.W. = 100000) | 0.05 | 95 | (2) |
| | | | | | | | | Molar ratio | | |
| Comp. Ex. 15 | Ag | 100 | Disodium fumarate | 0.5 | Na borohydride | 0.5 | — | — | 40 | (1) |
| Comp. Ex. 16 | Ag / Pt | 60 / 40 | Triammonium citrate | 1 | Ammonium formate | 1 | PVA (M.W. = 90000) | 0.02 | 60 | (2) |
| Comp. Ex. 17 | Ag | 100 | Disodium maleate | 2 | Na oxalate | 1 | PVA (MW = 90000) | 0.02 | 100 | (1) |

<Comparative Test 1 and Evaluation>

The dispersions of metal nanoparticles obtained in Examples 46 to 58 and Comparative Examples 15 to 17 were used as electrode-forming compositions, and the electrode-forming compositions were coated on a base materials such that the film thicknesses after baking became the values as shown in the following Table 14, and then the base materials having the films were baked for 30 minutes at the temperatures shown in Table 14 to form electrodes on the base materials. Either one of a solar cell with an ITO film, a solar cell without an ITO film, a silicon substrate, a glass plate, a polyimide plate, a PET film, a glass plate with an ITO film, and an aluminum plate was used for the base material. Then the electrical conductivity of the base materials on which these electrodes were formed was measured. The results are shown in Table 14.

Here, the electrical conductivity was evaluated using the volume resistivity (Ω·cm) measured and calculated according to the four terminal method. More specifically, at first, the thickness of the electrode after baking was directly measured from a cross-section of the electrode using a scanning electron microscope (SEM, Model 5800, Hitachi, Ltd.), and then the measured thickness of the electrode was input into a specific resistance meter (Loresta, Mitsubishi Chemical Corp.). Thereafter, by using this specific resistance meter, the volume resistivity of the electrode was measured according to the four terminal method.

Table 14 shows the mean particle diameter of metal nanoparticles in the dispersion, the shape of the particles, the blending ratios of components that compose the electrode-forming composition, the coating method, the type of base material, the film thickness after baking, and the baking temperature, together with the electrical conductivity (volume resistivity). The mean particle diameter of the metal nanoparticles in the dispersions of metal nanoparticles was measured using a field-emission transmission electron microscope (FE-TEM, JEOL Ltd.).

In the column entitled "Alcohol" in Table 14, ME indicates methanol, ET indicates ethanol, EG indicates ethylene glycol, BU indicates butanol, PG indicates propylene glycol, DEG indicates diethylene glycol, GL indicates glycerol, ER indicates erythritol, IH indicates isobornyl hexanol, and PR indicates propanol.

In addition, in the column entitled "Other solvent" in Table 14, "A" indicates a mixed liquid of acetone and isopropyl glycol mixed at a mass ratio of 1:1, "B" indicates a mixed liquid of cyclohexane and methyl ethyl ketone mixed at a mass ratio of 1:1, and "C" indicates a mixed liquid of toluene and hexane mixed at a mass ratio of 1:1.

TABLE 14

| | Mean particle diameter (nm) | Particle shape | Dispersion (composition) (mass %) | | | | Additive in dispersion (metal ion conc. (ppm)) | Coating method | Base material | Film thickness after baking (μm) | Baking temp. (° C.) | Volume resistivity (Ω · cm) |
|---|---|---|---|---|---|---|---|---|---|---|---|---|
| | | | Metal | Water | Alcohol | Other solvent | | | | | | |
| Ex. 46 | 20 | Spheres | 10 | 10 | ME: 80 | None | 1000 | Dispenser | Glass | 2.0 | 200 | $3.3 \times 10^{-6}$ |
| Ex. 47 | 20 | Spheres | 10 | 10 | ME: 80 | None | 2000 | Spray | Glass | 0.5 | 200 | $3.2 \times 10^{-6}$ |
| Ex. 48 | 30 | Plates | 10 | 10 | ME: 60 | None | 500 | Spin | Silicon | 0.1 | 200 | $3.9 \times 10^{-6}$ |

TABLE 14-continued

| | Mean particle | | Dispersion (composition) (mass %) | | | | Additive in dispersion (metal ion conc. (ppm)) | Coating method | Base material | Film thickness after baking (μm) | Baking temp. (° C.) | Volume resistivity (Ω·cm) |
|---|---|---|---|---|---|---|---|---|---|---|---|---|
| | diameter (nm) | Particle shape | Metal | Water | Alcohol | Other solvent | | | | | | |
| Ex. 49 | 30 | Plates | 10 | 10 | ET: 20 EG: 80 | None | 300 | Spin | substrate Glass w/ ITO film | 0.5 | 300 | $3.8 \times 10^{-6}$ |
| Ex. 50 | 30 | Polyhedrons | 10 | 10 | ET: 20 BU: 60 | None | 500 | Knife | Polyimide | 2.0 | 130 | $3.9 \times 10^{-6}$ |
| Ex. 51 | 15 | Spheres | 10 | 10 | PG: 80 | None | 400 | Slit | Glass | 0.5 | 300 | $3.5 \times 10^{-6}$ |
| Ex. 52 | 10 | Spheres | 50 | 10 | DEG: 40 | None | 400 | Screen printing | Glass | 2.0 | 400 | $3.3 \times 10^{-6}$ |
| Ex. 53 | 25 | Spheres | 10 | 10 | ET: 20 GL: 60 | None | 20 | Screen printing | PET film | 2.0 | 150 | $3.9 \times 10^{-6}$ |
| Ex. 54 | 30 | Plates | 50 | 10 | EG: 10 ER: 30 | None | 3000 | Offset printing | Solar cell w/ITO film | 2.0 | 150 | $3.7 \times 10^{-6}$ |
| Ex. 55 | 30 | Plates | 10 | 10 | IH: 70 | C: 10 | 200 | Die coating | Solar cell w/o ITO film | 0.3 | 180 | $3.2 \times 10^{-6}$ |
| Ex. 56 | 30 | Polyhedrons | 10 | 10 | ET: 50 EG: 20 | A: 10 | 100 | Knife | Glass | 0.2 | 300 | $3.2 \times 10^{-6}$ |
| Ex. 57 | 20 | Spheres | 50 | 10 | ET: 50 EG: 20 | B: 10 | 20 | Spray | Aluminum | 1.0 | 200 | $3.7 \times 10^{-6}$ |
| Ex. 58 | 15 | Spheres | 10 | 10 | PR: 80 | None | 20 | Spray | Aluminum | 1.0 | 180 | $3.3 \times 10^{-6}$ |
| Comp. Ex. 15 | 50 | Spheres | 10 | 10 | ET: 80 | None | — | Inkjet | Silicon substrate | 1.0 | 250 | $9.3 \times 10^{-6}$ |
| Comp. Ex. 16 | 30 | Plates | 10 | 10 | ME: 60 ET: 20 | None | 500 | Spin | Silicon substrate | 0.1 | 200 | $15 \times 10^{-6}$ |
| Comp. Ex. 17 | 70 | Spheres | 10 | 10 | PG: 80 | None | 400 | Slit | Glass | 0.5 | 300 | $8.8 \times 10^{-6}$ |

As is clear from Table 14, in Examples 46 to 58, the volume resistivities of the formed electrodes were on the order of $3 \times 10^{-6}$ Ω·cm in all cases, and these were preferable values for using the electrode as an electrically conductive material. In addition, the mean particle diameters of the metal particles contained in the dispersions were within a range from 10 to 30 nm, and therefore, it was cofirmed that so-called metal nanoparticles were formed.

On the other hand, in Comparative Examples 15 to 17, the volume resistivities of the coated films demonstrated higher values than those of Examples 46 to 58, and the mean particle diameters of the metal particles in the dispersions were equal to or larger than 30 nm. Therefore, the results show that these dispersions were inferior to those of Examples 46 to 58 in terms of properties necessary for using as electrically conductive materials.

In Comparative Example 15, since an additive was not used during the synthesis of the metal nanoparticles, the particle diameter of the particles increased. As a result, a dense coated film was not formed when coating the dispersion containing metal nanoparticles having a large particle diameter, and an adequately dense film was not formed during sintering; thereby, it is presumed that this caused an increase in volume resistivity.

In addition, in Comparative Example 16, since the proportion of metal component other than silver was high, this caused a detrimental effect during sintering; thereby, it is presumed that this caused an increase in volume resistivity.

Moreover, in Comparative Example 17, since the temperature during the dispersion synthesis was high, the growth of particles progressed remarkably. As a result, the particle diameter of the particles increased; thereby, it is presumed that this caused an increase in volume resistivity for the same reason as in the case of Comparative Example 15.

Example 59

First, silver nitrate was dissolved in deionized water to prepare an aqueous metal salt solution. In addition, methyl cellulose was dissolved in deionized water to prepare an aqueous additive solution. On the other hand, trisodium citrate was dissolved in deionized water, and particulate ferrous sulfate was added directly to the resulting aqueous trisodium citrate solution having a concentration of 26% in the presence of flowing nitrogen gas at a temperature of 35° C. and was dissolved to prepare a carboxylic acid-reducing agent mixed liquid containing citrate ions and ferrous ions at a molar ratio of 3:2. Next, under conditions where the nitrogen gas flow was maintained at a temperature of 35° C., while stirring the carboxylic acid-reducing agent mixed liquid by rotating a magnetic stirrer at a rotating speed of 100 rpm, the above-mentioned aqueous metal salt solution and the aqueous additive solution were dropped into the carboxylic acid-reducing agent mixed liquid and mixed therewith. Here, as a result of adjusting the concentration of each solution such that the added amount of the aqueous metal salt solution was 1/10or less the amount of the carboxylic acid-reducing agent mixed liquid, the reaction temperature was maintained at 40° C. even when the aqueous metal salt solution of which the temperature was about room temperature was dropped in. In addition, the mixing ratio of the carboxylic acid-reducing agent mixed liquid to the aqueous metal salt solution was adjusted to be such that the molar ratios of citrate ions and ferrous ions in the carboxylic acid-reducing agent mixed liquid to the total atomic valence of the metal ions in the aqueous metal salt solution were 1.5 and 1, respectively, as shown in Table 15. The mixing ratio of the aqueous additive solution to the aqueous metal salt solution was adjusted to be such that the molar ratio of methyl cellulose in the aqueous additive solution to the total atomic valence of the metal ions in the aqueous metal salt solution was 0.02. After the completion of dropping the aqueous metal salt solution, the mixed liquid was further continued to be stirred for 15 minutes to obtain a dispersion including a metal colloid. The pH of this dispersion was 5.5, and the stoichiometric amount of metal particles formed in the dispersion was 5 g/liter. The resulting dispersion was left at room temperature, and the aggregates of metal nanoparticles that settled were separated by decantation. Then deionized water was added to this separated product to form a dispersion, and after desalinating by ultrafiltration, the dispersion was further subjected to replacement washing with methanol, and the content of metal (silver) was adjusted to 50% by mass. This dispersion was designated as Example 59. The final mixed amounts of metal (silver), water, methanol, and solvent A relative to 100% by mass of the dispersion were adjusted to 50.0% by mass, 2.5% by mass, 5.0% by mass, and 42.5% by mass, respectively. Here, the solvent A was a mixed liquid in which acetone and isopropyl glycol were mixed at a mass ratio of 1:1. Furthremore, iron in the ferrous sulfate was removed during the replacement washing with methanol, and the like.

Example 60

A dispersion was obtained in the same manner as Example 59. The dispersion was left at room temperature, and the aggregates of metal nanoparticles that settled were separated by decantation. Then deionized water was added to this separated product to form a dispersion, and after desalinating by ultrafiltration, the dispersion was further subjected to replacement washing with ethanol, and the content of metal was adjusted to 50% by mass. This dispersion was designated as a first dispersion.

On the other hand, a dispersion was obtained in the same manner as Example 59, with the exception of using palladium nitrate instead of the silver nitrate of Example 59. The dispersion was left at room temperature, and the aggregates of metal nanoparticles that settled were separated by decantation. Then deionized water was added to this separated product to form a dispersion, and after desalinating by ultrafiltration, the dispersion was further subjected to replacement washing with ethanol, and the content of the metal was adjusted to 50% by mass. This dispersion was designated as a second dispersion. Next, 77% by mass of the first dispersion and 23% by mass of the second dispersion were mixed. This dispersion was designated as Example 60. Here, the final mixed amounts of metal (total of silver and palladium), water, methanol, and solvent A relative to 100% by mass of the dispersion were adjusted to 50.0% by mass, 1.5% by mass, 2.5% by mass, and 46.0% by mass, respectively.

Comparative Examples 18 and 19

Dispersions were prepared in the same manner as Examples 59 and 60 with the exception of not using additives.

TABLE 15

| | Metal salt | | Carboxylic acid | | Reducing agent | | Additive | | Reaction temp. (° C.) |
|---|---|---|---|---|---|---|---|---|---|
| | Type | Mass % | Name | Molar ratio | Name | Molar ratio | Name | Molar ratio | |
| Ex. 59 | Ag | 100 | Trisodium citrate | 1.5 | Ferrous sulfate | 1 | Methyl cellulose | 0.02 | 40 |
| Ex. 60 | Ag<br>Au | 77<br>23 | Trisodium citrate | 1.5 | Ferrous sulfate | 1 | Methyl cellulose | 0.20 | 40 |
| Comp. Ex. 18 | Ag | 100 | Trisodium citrate | 1.5 | Ferrous sulfate | 1 | — | — | 40 |
| Comp. Ex. 19 | Ag<br>Au | 77<br>23 | Trisodium citrate | 1.5 | Ferrous sulfate | 1 | — | — | 40 |

<Comparative Test 2 and Evaluation>

The dispersions of metal nanoparticles obtained in Examples 59 and 60 and Comparative Examples 18 and 19 were used as electrode-forming compositions, and the electrode-forming compositions were coated on silicon substrates such that the film thicknesses after baking became 0.1 μm, and then the silicon substrates having the films were baked at 200° C. in air for 30 minutes to form electrodes on the silicon substrates. The electrical conductivity of the silicon substrates on which the electrodes were formed was measured. The results are shown in Table 16.

TABLE 16

| | Mean particle diameter (nm) | Particle shape | Concentration of additive (metal ions) in dispersion (ppm) | Volume resistivity (Ω · cm) |
|---|---|---|---|---|
| Example 59 | 20 | Spheres | 20 | $3.5 \times 10^{-6}$ |
| Example 60 | 25 | Spheres | 20 | $3.7 \times 10^{-6}$ |
| Comp. Ex. 18 | 50 | Spheres | — | $5.1 \times 10^{-6}$ |
| Comp. Ex. 19 | 55 | Spheres | — | $5.9 \times 10^{-6}$ |

As is clear from Table 16, in Examples 59 and 60, the volume resistivities of the coated films were on the order of $3 \times 10^{-6}$ Ω·cm in both cases, and these were preferable values for using the electrode as an electrically conductive material. In addition, the mean particle diameters were within a range from 10 to 30 nm, and therefore, it was cofirmed that so-called metal nanoparticles were formed.

On the other hand, in Comparative Examples 18 and 19, the volume resistivities of the coated films were higher than those of Examples 59 and 60 that were synthesized by adding an additive, and the mean particle diameters were larger than 30 nm. Therefore, the results show that these dispersions were inferior to those of Examples 59 and 60 in terms of properties necessary for using as electrically conductive materials. Since an additive was not used during the synthesis of the metal nanoparticles, the particle diameter of the particles increased. As a result, a dense coated film was not formed when coating the dispersion containing metal nanoparticles having a large particle diameter, and an adequately dense film was not formed during sintering; thereby, it is presumed that this caused an increase in volume resistivity.

Example 61

A reaction liquid was obtained in the same manner as Example 52. The reaction liquid was left at room temperature, and the aggregates of metal nanoparticles that settled were separated by decantation. Then deionized water was added to this separated precipitate at an amount of 50 times more than the mass of the precipitate to form a dispersion, and after desalinating by ultrafiltration, the dispersion was further subjected to replacement washing with methanol, and the metal content was adjusted to 50% by mass. Thereafter, the composition of the dispersion was adjusted such that the metal (silver) content was 1% by mass, the water content was 24% by mass, and the ethanol content was 75% by mass. This dispersion was designated as Example 61.

Example 62

A reaction liquid was obtained in the same manner as Example 52. The reaction liquid was left at room temperature, and the aggregates of metal nanoparticles that settled were separated by decantation. Then deionized water was added to this separated precipitate at an amount of 5 times more than the mass of the precipitate to form a dispersion, and after desalinating by ultrafiltration, the dispersion was further subjected to replacement washing with methanol, and the metal content was adjusted to 50% by mass. Thereafter, the composition of the dispersion was adjusted such that the metal (silver) content was 1% by mass, the water content was 24% by mass, and the ethanol content was 75% by mass. This dispersion was designated as Example 62.

Example 63

A reaction liquid was obtained in the same manner as Example 52. The reaction liquid was left at room temperature, and the aggregates of metal nanoparticles that settled were separated by decantation. Then deionized water was added to this separated precipitate at an amount of 50000 times more than the mass of the precipitate to form a dispersion, and after desalinating by ultrafiltration, the dispersion was further subjected to replacement washing with methanol, and the metal content was adjusted to 50% by mass. Thereafter, the composition of the dispersion was adjusted such that the metal (silver) content was 1% by mass, the water content was 24% by mass, and the ethanol content was 75% by mass. This dispersion was designated as Example 63.

Example 64

A reaction liquid was obtained in the same manner as Example 52. The reaction liquid was left at room temperature, and the aggregates of metal nanoparticles that settled were separated by decantation. Then deionized water was added to this separated precipitate at an amount of 50 times more than the mass of the precipitate to form a dispersion, and after desalinating by ultrafiltration, the dispersion was further subjected to replacement washing with methanol, and the metal content was adjusted to 50% by mass. Thereafter, the composition of the dispersion was adjusted such that the metal (silver) content was 1% by mass, the water content was 24% by mass, and the ethanol content was 75% by mass. This dispersion was designated as Example 64.

Comparative Example 20

A reaction liquid was obtained in the same manner as Example 52. The reaction liquid was left at room temperature, and the aggregates of metal nanoparticles that settled were separated by decantation. Then deionized water was added to this separated precipitate at an amount equal to 1% by mass of the precipitate to form a dispersion, and after desalinating by ultrafiltration, the dispersion was further subjected to replacement washing with methanol, and the metal content was adjusted to 50% by mass. Thereafter, the composition of the dispersion was adjusted such that the metal (silver) content was 1% by mass, the water content was 24% by mass, and the ethanol content was 75% by mass. This dispersion was designated as Comparative Example 20.

Comparative Example 21

A reaction liquid was obtained in the same manner as Example 52. The reaction liquid was left at room temperature, and the aggregates of metal nanoparticles that settled were separated by decantation. Then deionized water was added to this separated precipitate at an amount of 50 times more than the mass of the precipitate to form a dispersion, and after desalinating by ultrafiltration, the dispersion was further subjected to replacement washing with methanol, and the metal content was adjusted to 50% by mass. Thereafter, the composition of the dispersion was adjusted such that the metal (silver) content was 50% by mass, the water content was 17% by mass and the ethanol content was 33% by mass. This dispersion was designated as Comparative Example 21.

<Comparative Test 3 and Evaluation>

The additive concentrations (polyacrylic acid concentrations) in the dispersions of metal nanoparticles obtained in Examples 61 to 64 and Comparative Examples 20 and 21 were evaluated using gas chromatography-mass spectrometry (GC-MS). In addition, the dispersion stabilities (during stored at 3 to 5° C.) of these dispersions were investigated visually. The results are shown in Table 17 below.

TABLE 17

| | Polyacrylic acid concentration in dispersion (ppm) | Dispersion stability |
|---|---|---|
| Example 61 | 500 | Stable for 90 days or more |
| Example 62 | 5000 | Stable up to 10 days, precipitate formed within 30 days |
| Example 63 | 0.5 | Stable for 90 days or more |
| Example 64 | 0.5 | Stable for 90 days or more |
| Comp. Ex. 20 | 25000 | Precipitate formed within 3 days |
| Comp. Ex. 21 | 25000 | Precipitate formed within 3 days |

As is clear from Table 17, dispersion stability was confirmed to be maintained for a fixed period of time, if the concentration of the additive in the dispersion was 5000 ppm or less as in Examples 61 to 64.

Here, the concentration of the additive could be controlled such that the concentration of the additive in the dispersion is 0.5 ppm in the manner of Examples 63 and 64. In addition, although not shown in this comparative test, it was also confirmed that the concentration could be controlled to less than 0.5 ppm. In this case as well, the dispersion stability was maintained. However, it is difficult to use a large amount of deionized water so as to decrease the concentration of the additive to be below that in Example 63 from the viewpoint of cost. In addition, it is difficult to lower the concentration of the metal nanoparticles in the product to be below that of Example 64, because there is a risk of causing problems in terms of use of the product.

On the other hand, as shown in Comparative Examples 20 and 21, it was confirmed that if the additive was contained at an amount of about 25000 ppm in the dispersion, remarkable deterioration of dispersion stability was incurred. On the basis thereof, it was confirmed that the concentration of the additive in the dispersion was preferably within a range from 0.5 to 5000 ppm.

(Examples Relating to Embodiments According to [53] to [57])

The following provides a detailed explanation of examples of embodiments according to [53] to [57] together with comparative examples thereof Examples 65 to 77 and Comparative Examples 22 to 25

First, metal salts containing metal elements, either one of carboxylic acids and carboxylic acid salts, and reducing agents shown in the following Table 18 were respectively dissolved in deionized water to respectively prepare saturated aqueous solutions at room temperature. Here, nitrates were used for the metal salts, with the exception that chlorine compounds were used only for Au and Pt.

Next, the resulting aqueous carboxylic acid solution B was mixed with either one of the aqueous metal salt solution A and the aqueous reducing agent solution C to form a mixed liquid, and the other one of the aqueous metal salt solution A and the aqueous reducing agent solution C was added to the mixed liquid and further mixed therewith. With regard to this order of mixing, the case shown in FIG. 3 where the aqueous carboxylic acid solution B was first mixed with the aqueous metal salt solution A, and then the aqueous reducing agent solution C was added to the mixed liquid is indicated with "1" in the column entitled "Synthesis flow" in Table 18. On the other hand, the case shown in FIG. 4 where the aqueous carboxylic acid solution B was first mixed with the aqueous reducing agent solution C, and then the aqueous metal salt solution A was added to the mixed liquid is indicated with "2" in the column entitled "Synthesis flow" in Table 18.

Here, in the second mixing step in which all of the aqueous carboxylic acid solution B, the aqueous metal salt solution A, and the aqueous reducing agent solution C were added and mixed, the mixtures were heated to the reaction temperatures listed in the column entitled "reaction temperature" in Table 18 using a water bath, and after reaching the reaction temperatures, the mixtures were continued to be stirred with a magnetic stirrer at a rotating speed of 400 ppm for 4 hours while refluxing. The resulting reaction liquids were used as the reaction liquids of Examples 65 to 77 and Comparative Examples 22 to 25, and information about the aqueous carboxylic acid solution B, the aqueous metal salt solution A, and the aqueous reducing agent solution C which were used to obtain the reaction liquids are shown in Table 18.

Here, with regard to Examples 65 to 77, after reacting for 4 hours, dry substances of the reaction liquids were evaluated by X-ray analysis. As a result, carboxylic acid salts of the added metals were not detected.

TABLE 18

| | Metal elements | | Carboxylic acid/ carboxylic acid salt | | Reducing agent | | | |
|---|---|---|---|---|---|---|---|---|
| | Type | Mass % | Name | Molar ratio to metal element | Name | Molar ratio to metal element | Reaction temp. (° C.) | Synthesis flow |
| Ex. 65 | Ag | 100 | Glycolic acid | 1 | Hydrazine | 1 | 25 | (1) |
| Ex. 66 | Ag Au | 95 5 | Citric acid | 1 | Hydrazine acetate | 2 | 40 | (1) |
| Ex. 67 | Ag Pt | 75 25 | Ammonium citrate | 1 | Ammonium formate | 1 | 60 | (2) |
| Ex. 68 | Ag Pd | 80 20 | Ammonium malate | 1 | Na formate | 1 | 60 | (2) |
| Ex. 69 | Ag Ru | 99 1 | Maleic acid | 0.5 | Na formate | 1 | 60 | (2) |
| Ex. 70 | Ag | 100 | Disodium maleate | 3 | Na oxalate | 1 | 80 | (1) |
| Ex. 71 | Ag | 100 | Disodium malonate | 2 | Ascorbic acid | 0.5 | 30 | (2) |
| Ex. 72 | Ag | 100 | Malonic acid | 0.5 | Na ascorbate | 2 | 30 | (2) |
| Ex. 73 | Ag | 100 | Fumaric acid | 1 | Na borohydride | 0.5 | 40 | (1) |
| Ex. 74 | Ag | 100 | Disodium fumarate | 0.5 | Na borohydride | 0.5 | 40 | (1) |
| Ex. 75 | Ag | 100 | Succinic acid | 0.3 | K borohydride | 0.1 | 40 | (1) |
| Ex. 76 | Ag | 100 | Tartaric acid | 1 | Glucose | 3 | 95 | (2) |
| Ex. 77 | Ag | 100 | Ammonium tartrate | 1 | Na borohydride | 0.5 | 40 | (2) |
| Comp. Ex. 22 | Ag | 100 | Sodium acetate | 1 | Na borohydride | 0.5 | 40 | (2) |
| Comp. Ex. 23 | Ag | 100 | Ammonium tartrate | 1 | Na borohydride | 0.5 | 20 | (2) |
| Comp. Ex. 24 | Ag | 100 | Ammonium tartrate | 1 | Na borohydride | 0.5 | 100 | (2) |
| Comp. Ex. 25 | Ag Pd | 60 40 | Ammonium malate | 1 | Na formate | 1 | 60 | (2) |

<Comparative Test and Evaluation>

After the completion of the reaction, the reaction liquids of Examples 65 to 77 and Comparative Examples 22 to 25 were centrifuged for 3 minutes at 1000 G 0.1 M of aqueous ammonia was added to the resulting precipitate at an amount of 50 times more than the mass of the precipitate, and stirred for 10 minutes. Thereafter, the resulting dispersion was again centrifuged for 3 minutes at 1000 G. Water was added to the precipitate, and after desalting by ultrafiltration, a solvent such as ethanol, methanol, and the like was added and stirred to obtain dispersions of metal nanoparticles. The compositions of the resulting dispersions of Examples 65 to 77 and Comparative Examples 22 to 25 are shown in Table 19.

indicates erythritol, IH indicates isobornyl hexanol, and PR indicates propanol.

In addition, in the column entitled "Other solvent" in Table 19, "A" indicates a mixed liquid of acetone and isopropyl glycol mixed at a mass ratio of 1:1, "B" indicates a mixed liquid of cyclohexane and methyl ethyl ketone mixed at a mass ratio of 1:1, and "C" indicates a mixed liquid of toluene and hexane mixed at a mass ratio of 1:1.

TABLE 19

| | Mean particle diameter (nm) | Dispersion (composition) (mass %) | | | | Coating method | Base material | Film thickness after baking (μm) | Baking temp. (° C.) | Volume resistivity ($10^{-6}$ Ω·cm) |
|---|---|---|---|---|---|---|---|---|---|---|
| | | Metal | Water | Alcohol | Other solvent | | | | | |
| Ex. 65 | 70 | 10 | 10 | ME: 80 | None | Dispenser | Glass | 2.0 | 200 | 2.5 |
| Ex. 66 | 40 | 10 | 10 | ME: 80 | None | Spray | Glass | 0.5 | 200 | 3.7 |
| Ex. 67 | 10 | 10 | 10 | ME: 60 ET: 20 | None | Spin | Silicon substrate | 0.1 | 200 | 7.5 |
| Ex. 68 | 50 | 10 | 10 | EG: 80 | None | Spin | Glass w/ITO film | 0.5 | 300 | 4.2 |
| Ex. 69 | 50 | 10 | 10 | ET: 20 BU: 60 | None | Knife | Polyimide | 2.0 | 130 | 5.2 |
| Ex. 70 | 50 | 10 | 10 | PG: 80 | None | Slit | Glass | 0.5 | 300 | 5.1 |
| Ex. 71 | 40 | 50 | 10 | DEG: 40 | None | Screen printing | Glass | 2.0 | 400 | 3.2 |
| Ex. 72 | 40 | 10 | 10 | ET: 20 GL: 60 | None | Screen printing | PET film | 2.0 | 150 | 7.2 |
| Ex. 73 | 50 | 50 | 10 | EG: 10 ER: 30 | None | Offset printing | Solar cell w/ ITO film | 2.0 | 150 | 4.1 |
| Ex. 74 | 50 | 10 | 10 | IH: 70 | C: 10 | Die coating | Solar cell w/o ITO film | 0.3 | 180 | 5.3 |
| Ex. 75 | 50 | 10 | 10 | ET: 50 EG: 20 | A: 10 | Knife | Glass | 0.2 | 300 | 5.8 |
| Ex. 76 | 40 | 50 | 10 | ET: 50 EG: 20 | B: 10 | Spray | Aluminum | 1.0 | 200 | 4.1 |
| Ex. 77 | 30 | 10 | 10 | PR: 80 | None | Spray | Aluminum | 1.0 | 180 | 3.1 |
| Comp. Ex. 22 | 200 | 10 | 10 | PR: 80 | None | Spray | Aluminum | 1.0 | 180 | 22 |
| Comp. Ex. 23 | 30 | 10 | 10 | PR: 80 | None | Spray | Aluminum | 1.0 | 180 | 21 |
| Comp. Ex. 24 | 150 | 10 | 10 | PR: 80 | None | Spray | Aluminum | 1.0 | 180 | 18 |
| Comp. Ex. 25 | 120 | 10 | 10 | EG: 80 | None | Spin | Glass w/ITO film | 0.5 | 300 | 17 |

The dispersions obtained in Examples 65 to 77 and Comparative Examples 22 to 25 were coated on the base materials shown in Table 19 in accordance with the coating methods shown in Table 19, and then were baked in air for 30 minutes at the baking temperatures shown in Table 19. The thicknesses of the coated films after baking, the volume resistivities of the resulting coated films, and the mean particle diameters of the metal nanoparticles are shown in Table 19. The method for measuring mean particle diameter of the metal nanoparticles included: in order, first obtaining images of the resulting metal nanoparticles by a transmission electron microscope (TEM) at a magnification of about 500,000; measuring the primary particle diameters of 200 metal nanoparticles in the resulting images; preparing a particle diameter distribution based on the measurement results; and calculating the mean value which was the mean particle diameter from the prepared particle diameter distribution. In addition, the volume resistivity was measured and calculated according to the four terminal method, and the film thickness was measured by a micrometer.

In the column entitled "Alcohol" in Table 19, ME indicates methanol, ET indicates ethanol, EG indicates ethylene glycol, BU indicates butanol, PG indicates propylene glycol, DEG indicates diethylene glycol, GL indicates glycerol, ER As is clear from Table 19, in Examples 65 to 77, the volume resistivities of the coated films were on the order of $10^{-6}$ Ω·cm in all cases, and these were preferable values for using the coated film as an electrically conductive material. In addition, the mean particle diameters were within a range from 10 to 70 nm, and therefore, it was cofirmed that so-called metal nanoparticles were formed.

On the other hand, in Comparative Examples 22 to 25, the volume resistivities of the coated films demonstrated values that were about ten times more than those of Examples, and these coated films cannot be said to be preferable as electrically conductive materials. In Comparative Example 22, the effect of the acetic acid which was added as the carboxylic acid and served as a protective agent to chemically modify the particle surfaces was small; thereby, the particle diameter was increased. As a result, it is thought that the effect of sintering at low temperatures which is unique to nanoparticles deteriorated. In Comparative Example 23, since the reaction temperature was low, unreacted carboxylic acid salt remained, and this residue impaired sintering between nanoparticles. As a result, it is thought that this caused an increase in volume resistivity. Conversely, in Comparative Example 24, since the reaction temperature was high, the growth of particles progressed. As a result, it is thought that the effect of sintering at low temperatures which is unique to nanoparticles deteriorated in the same manner as in Comparative Example 22. In Comparative Example 25, since Pd was added at an amount of 40 wt % which was more than 25 wt % that was calculated from the lower limit of the range of Ag amount in the present embodiment, it is thought that the volume resistivity and the particle diameter increased.

(Examples Relating to Embodiments According to [58] to [62])

The following provides a detailed explanation of examples of embodiments according to [58] to [62] together with comparative examples.

Examples 78 to 90 and Comparative Examples 26 to 29

First, metal salts containing metal elements, either one of carboxylic acids and carboxylic acid salts, and reducing agents shown in the following Table 20 were respectively dissolved in deionized water to respectively prepare saturated aqueous solutions at room temperature. Here, nitrates were used for the metal salts, with the exception that chlorine compounds were used only for Au and Pt. In addition, the basic compounds shown in Table 20 were dissolved in deionized water to prepare basic aqueous solutions having a concentration of 3 M, and then the aqueous solutions were mixed with the molar ratios shown in Table 20 as follows.

Mixing was carried out according to the synthesis flow shown in FIG. 5.

Here, when dropping the aqueous reducing agent C, the suspension of a carboxylic acid salt was heated to the reaction temperatures indicated in the column entitled "Reaction temperature" in Table 20 using a water bath, and after reaching the reaction temperatures, the mixtures were continued to be stirred with a magnetic stirrer at a rotating speed of 400 ppm for 4 hours while refluxing. The resulting reaction liquids were used as the reaction liquids of Examples 78 to 90 and Comparative Examples 26 to 29, and information about the aqueous carboxylic acid solution B, the aqueous metal salt solution A, the aqueous reducing agent solution C, and the basic aqueous solution D which were used to obtain the reaction liquids are shown in Table 20.

Here, with regard to Examples 78 to 90, after reacting for 4 hours, dry substances of the reaction liquids were evaluated by X-ray analysis. As a result, carboxylic acid salts of the added metals were not detected.

TABLE 20

| | Metal elements | | Carboxylic acid | | Reducing agent | | Basic aqueous solution | | Reaction |
| | | | | Molar ratio to metal | | Molar ratio to metal | | Molar ratio to metal | |
| | Type | Mass % | Name | element | Name | element | Name | element | temp. (° C.) |
|---|---|---|---|---|---|---|---|---|---|
| Ex. 78 | Ag | 100 | Glycolic acid | 1 | Hydrazine | 1 | NaOH | 1 | 25 |
| Ex. 79 | Ag | 95 | Citric acid | 1 | Hydrazine acetate | 2 | KOH | 1 | 40 |
| | Au | 5 | | | | | | | |
| Ex. 80 | Ag | 75 | Citric acid | 1 | Ammonium formate | 1 | $NH_3$ | 1 | 60 |
| | Pt | 25 | | | | | | | |
| Ex. 81 | Ag | 80 | Malic acid | 1 | Na formate | 1 | $NH_3$ | 1 | 60 |
| | Pd | 20 | | | | | | | |
| Ex. 82 | Ag | 99 | Maleic acid | 0.5 | Na formate | 1 | KOH | 2 | 60 |
| | Ru | 1 | | | | | | | |
| Ex. 83 | Ag | 100 | Maleic acid | 3 | Na oxalate | 1 | NaOH | 4 | 80 |
| Ex. 84 | Ag | 100 | Malonic acid | 2 | Na ascorbate | 2 | $NH_3$ | 2 | 30 |
| Ex. 85 | Ag | 100 | Malonic acid | 0.5 | Na ascorbate | 2 | $NH_3$ | 0.5 | 30 |
| Ex. 86 | Ag | 100 | Fumaric acid | 1 | Na borohydride | 0.5 | NaOH | 1 | 40 |
| Ex. 87 | Ag | 100 | Fumaric acid | 0.5 | Na borohydride | 0.5 | NaOH | 0.1 | 40 |
| Ex. 88 | Ag | 100 | Succinic acid | 0.5 | K borohydride | 0.1 | $NH_3$ | 0.1 | 40 |
| Ex. 89 | Ag | 100 | Tartaric acid | 1 | Glucose | 3 | KOH | 1 | 95 |
| Ex. 90 | Ag | 100 | Tartaric acid | 1 | Na borohydride | 0.5 | $NH_3$ | 1 | 40 |
| Comp. Ex. 26 | Ag | 100 | Acetic acid | 1 | Na borohydride | 0.5 | NaOH | 1 | 40 |
| Comp. Ex. 27 | Ag | 100 | Tartaric acid | 1 | Na borohydride | 0.5 | $NH_3$ | 1 | 20 |
| Comp. Ex. 28 | Ag | 100 | Tartaric acid | 1 | Na borohydride | 0.5 | $NH_3$ | 1 | 100 |
| Comp. Ex. 29 | Ag | 60 | Malic acid | 1 | Na formate | 1 | $NH_3$ | 1 | 60 |
| | Pd | 40 | | | | | | | |

<Comparative Test and Evaluation>

After the completion of the reaction, the reaction liquids of Examples 78 to 90 and Comparative Examples 26 to 29 were centrifuged for 3 minutes at 1000 G 0.1 M of aqueous ammonia was added to the resulting precipitate at an amount of 50 times more than the mass of the precipitate, and stirred for 10 minutes. Thereafter, the resulting dispersion was again centrifuged for 3 minutes at 1000 G. Water was added to the precipitate, and after desalting by ultrafiltration, a solvent such as ethanol, methanol, and the like was added and the mixture was stirred to obtain a dispersion of metal nanoparticles. The compositions of the resulting dispersions of Examples 78 to 90 and Comparative Examples 26 to 29 are shown in Table 21.

isopropyl glycol mixed at a mass ratio of 1:1, "B" indicates a mixed liquid of cyclohexane and methyl ethyl ketone mixed at a mass ratio of 1:1, and "C" indicates a mixed liquid of toluene and hexane mixed at a mass ratio of 1:1.

TABLE 21

| | Mean particle diameter (nm) | Dispersion (composition) (mass %) | | | | Coating method | Base material | Film thickness after baking (μm) | Baking temp. (° C.) | Volume resistivity ($10^{-6}$ Ω·cm) |
|---|---|---|---|---|---|---|---|---|---|---|
| | | Metal | Water | Alcohol | Other solvent | | | | | |
| Ex. 78 | 30 | 10 | 10 | ME: 80 | None | Dispenser | Glass | 2.0 | 200 | 2.4 |
| Ex. 79 | 50 | 10 | 10 | ME: 80 | None | Spray | Glass | 0.5 | 200 | 2.8 |
| Ex. 80 | 30 | 10 | 10 | ME: 60 ET: 20 | None | Spin | Silicon substrate | 0.1 | 200 | 4.9 |
| Ex. 81 | 50 | 10 | 10 | EG: 80 | None | Spin | Glass w/ITO film | 0.5 | 300 | 6.5 |
| Ex. 82 | 40 | 10 | 10 | ET: 20 BU: 60 | None | Knife | Polyimide | 2.0 | 130 | 7.1 |
| Ex. 83 | 70 | 10 | 10 | PG: 80 | None | Slit | Glass | 0.5 | 300 | 3.3 |
| Ex. 84 | 40 | 50 | 10 | DEG: 40 | None | Screen printing | Glass | 2.0 | 400 | 5.9 |
| Ex. 85 | 30 | 10 | 10 | ET: 20 GL: 60 | None | Screen printing | PET film | 2.0 | 150 | 6.1 |
| Ex. 86 | 40 | 50 | 10 | EG: 10 ER: 30 | None | Offset printing | Solar cell w/ ITO film | 2.0 | 150 | 7.2 |
| Ex. 87 | 40 | 10 | 10 | IH: 70 | C: 10 | Die coating | Solar cell w/o ITO film | 0.3 | 180 | 4.5 |
| Ex. 88 | 30 | 10 | 10 | ET: 50 EG: 20 | A: 10 | Knife | Glass | 0.2 | 300 | 3.8 |
| Ex. 89 | 30 | 50 | 10 | ET: 50 EG: 20 | B: 10 | Spray | Aluminum | 1.0 | 200 | 4.2 |
| Ex. 90 | 30 | 10 | 10 | PR: 80 | None | Spray | Aluminum | 1.0 | 180 | 7.3 |
| Comp. Ex. 26 | 200 | 10 | 10 | PR: 80 | None | Spray | Aluminum | 1.0 | 180 | 43 |
| Comp. Ex. 27 | 30 | 10 | 10 | PR: 80 | None | Spray | Aluminum | 1.0 | 180 | 37 |
| Comp. Ex. 28 | 150 | 10 | 10 | PR: 80 | None | Spray | Aluminum | 1.0 | 180 | 35 |
| Comp. Ex. 29 | 120 | 10 | 10 | EG: 80 | None | Spin | Glass w/ITO film | 0.5 | 300 | 29 |

The dispersions obtained in Examples 78 to 90 and Comparative Examples 26 to 29 were coated on the base materials shown in Table 21 in accordance with the coating methods shown in Table 21, and then were baked in air for 30 minutes at the baking temperatures shown in Table 21. The thicknesses of the coated films after baking, the volume resistivities of the resulting coated films, and the mean particle diameters of the metal nanoparticles are shown in Table 21. The method for measuring mean particle diameter of the metal nanoparticles included: in order, first obtaining images of the resulting metal nanoparticles by a transmission electron microscope (TEM) at a magnification of about 500,000; measuring the primary particle diameters of 200 metal nanoparticles in the resulting images; preparing a particle diameter distribution based on the measurement results; and calculating the mean value which was the mean particle diameter from the prepared particle diameter distribution. In addition, the volume resistivity was measured and calculated according to the four terminal method, and the film thickness was measured by a micrometer.

In the column entitled "Alcohol" in Table 21, ME indicates methanol, ET indicates ethanol, EG indicates ethylene glycol, BU indicates butanol, PG indicates propylene glycol, DEG indicates diethylene glycol, GL indicates glycerol, ER indicates erythritol, IH indicates isobornyl hexanol, and PR indicates propanol.

In addition, in the column entitled "Other solvent" in Table 21, "A" indicates a mixed liquid of acetone and As is clear from Table 21, in Examples 78 to 90, the volume resistivities of the coated films were on the order of $10^{-6}$ Ω·cm in all cases, and these were preferable values for using the coated film as an electrically conductive material. In addition, the mean particle diameters were within a range from 10 to 70 nm, and therefore, it was cofirmed that so-called metal nanoparticles were formed.

On the other hand, in Comparative Examples 26 to 29, the volume resistivities of the coated films demonstrated values that were about ten times more than those of Examples, and these coated films cannot be said to be preferable as electrically conductive materials. In Comparative Example 26, the effect of the acetic acid which was added as the carboxylic acid and served as a protective agent to chemically modify the particle surfaces was small; thereby, the particle diameter was increased. As a result, it is thought that the effect of sintering at low temperatures which is unique to nanoparticles deteriorated. In Comparative Example 27, since the reaction temperature was low, unreacted carboxylic acid salt remained, and this residue impaired sintering between nanoparticles. As a result, it is thought that this caused an increase in volume resistivity. Conversely, in Comparative Example 28, since the reaction temperature was high, the growth of particles progressed. As a result, it is thought that the effect of sintering at low temperatures which is unique to nanoparticles deteriorated in the same manner as in Comparative Example 26. In Comparative Example 29, since Pd was added at an amount of 40% by mass which was more than 25% by mass that was calculated from the lower limit of the range of Ag amount in the present embodiment, it is thought that the volume resistivity and the particle diameter increased.

(Examples Relating to Embodiments According to [63] to [67])

The following provides a detailed explanation of examples of embodiments according to [63] to [67] together with comparative examples.

Examples 91 to 103 and Comparative Examples 30 to 33

First, the metal salts containing metal elements, either one of carboxylic acids and carboxylic acid salts, and reducing agents shown in the following Table 22 were respectively dissolved in deionized water to respectively prepare saturated aqueous solutions at room temperature. Here, nitrates were used for the metal salts, with the exception that chlorine compounds were used only for Au and Pt. In addition, the basic compounds shown in Table 22 were dissolved in deionized water to prepare basic aqueous solutions having a concentration of 3 M, and then the aqueous solutions were mixed with the molar ratios shown in Table 22 as follows.

Mixing was carried out in accordance with the synthesis flow shown in FIG. 6.

Here, when dropping the aqueous reducing agent C, the suspension of a carboxylic acid salt was heated to the reaction temperatures indicated in the column entitled "Reaction temperature" in Table 22 using a water bath, and after reaching the reaction temperatures, the mixtures were continued to be stirred with a magnetic stirrer at a rotating speed of 400 ppm for 4 hours while refluxing. The resulting reaction liquids were used as the reaction liquids of Examples 91 to 103 and Comparative Examples 30 to 33, and information about the aqueous carboxylic acid solution B, the aqueous metal salt solution A, the aqueous reducing agent solution C, and the basic aqueous solution D which were used to obtain the reaction liquids are shown in Table 22.

Here, with regard to Examples 91 to 103, after reacting for 4 hours, dry substances of the reaction liquids were evaluated by X-ray analysis. As a result, carboxylic acid salts of the added metals were not detected.

TABLE 22

| | Metal elements | | Carboxylic acid | | Reducing agent | | Basic aqueous solution | | Reaction |
| --- | --- | --- | --- | --- | --- | --- | --- | --- | --- |
| | Type | Mass % | Name | Molar ratio to metal element | Name | Molar ratio to metal element | Name | Molar ratio to metal element | temp. (° C.) |
| Ex. 91 | Ag | 100 | Glycolic acid | 1 | Hydrazine | 1 | NaOH | 1 | 25 |
| Ex. 92 | Ag | 95 | Citric acid | 1 | Hydrazine acetate | 2 | KOH | 1 | 40 |
| | Au | 5 | | | | | | | |
| Ex. 93 | Ag | 75 | Citric acid | 1 | Ammonium formate | 1 | $NH_3$ | 1 | 60 |
| | Pt | 25 | | | | | | | |
| Ex. 94 | Ag | 80 | Malic acid | 1 | Na formate | 1 | $NH_3$ | 1 | 60 |
| | Pd | 20 | | | | | | | |
| Ex. 95 | Ag | 99 | Maleic acid | 0.5 | Na formate | 1 | KOH | 2 | 60 |
| | Ru | 1 | | | | | | | |
| Ex. 96 | Ag | 100 | Maleic acid | 3 | Na oxalate | 1 | NaOH | 4 | 80 |
| Ex. 97 | Ag | 100 | Malonic acid | 2 | Ascorbic acid | 0.5 | NaOH | 2 | 30 |
| Ex. 98 | Ag | 100 | Malonic acid | 0.5 | Na ascorbate | 2 | $NH_3$ | 0.5 | 30 |
| Ex. 99 | Ag | 100 | Fumaric acid | 1 | Na borohydride | 0.5 | NaOH | 1 | 40 |
| Ex. 100 | Ag | 100 | Fumaric acid | 0.5 | Na borohydride | 0.5 | NaOH | 0.1 | 40 |
| Ex. 101 | Ag | 100 | Succinic acid | 0.5 | K borohydride | 0.1 | $NH_3$ | 0.1 | 40 |
| Ex. 102 | Ag | 100 | Tartaric acid | 1 | Glucose | 3 | KOH | 1 | 95 |
| Ex. 103 | Ag | 100 | Tartaric acid | 1 | Na borohydride | 0.5 | $NH_3$ | 1 | 40 |
| Comp. Ex. 30 | Ag | 100 | Acetic acid | 1 | Na borohydride | 0.5 | NaOH | 1 | 40 |
| Comp. Ex. 31 | Ag | 100 | Tartaric acid | 1 | Na borohydride | 0.5 | $NH_3$ | 1 | 20 |
| Comp. Ex. 32 | Ag | 100 | Tartaric acid | 1 | Na borohydride | 0.5 | $NH_3$ | 1 | 100 |
| Comp. Ex. 33 | Ag | 60 | Malic acid | 1 | Na formate | 1 | $NH_3$ | 1 | 60 |
| | Pd | 40 | | | | | | | |

<Comparative Test and Evaluation>

After the completion of the reaction, the reaction liquids of Examples 91 to 103 and Comparative Examples 30 to 33 were centrifuged for 3 minutes at 1000 G 0.1 M of aqueous ammonia was added to the resulting precipitate at an amount of 50 times more than the weight of the precipitate, and stirred for 10 minutes. Thereafter, the resulting dispersion was again centrifuged for 3 minutes at 1000 G. Then water and solvent were added to the precipitate, and the mixture was stirred to obtain a dispersion of metal nanoparticles. The compositions of the resulting dispersions of Examples 91 to 103 and Comparative Examples 30 to 33 are shown in Table 23.

In the column entitled "Alcohol" in Table 23, ME indicates methanol, ET indicates ethanol, EG indicates ethylene glycol, BU indicates butanol, PG indicates propylene glycol, DEG indicates diethylene glycol, GL indicates glycerol, ER indicates erythritol, IH indicates isobornyl hexanol, and PR indicates propanol.

In addition, in the column entitled "Other solvent" in Table 23, "A" indicates a mixed liquid of acetone and isopropyl glycol mixed at a weight ratio of 1:1, "B" indicates a mixed liquid of cyclohexane and methyl ethyl ketone mixed at a weight ratio of 1:1, and "C" indicates a mixed liquid of toluene and hexane mixed at a weight ratio of 1:1.

TABLE 23

| | Mean particle diameter (nm) | Dispersion (composition) (mass %) | | | | Coating method | Base material | Film thickness after baking (μm) | Baking temp. (° C.) | Volume resistivity ($10^{-6}$ Ω·cm) |
|---|---|---|---|---|---|---|---|---|---|---|
| | | Metal | Water | Alcohol | Other solvent | | | | | |
| Ex. 91 | 40 | 10 | 10 | ME: 80 | None | Dispenser | Glass | 2.0 | 200 | 2.5 |
| Ex. 92 | 50 | 10 | 10 | ME: 80 | None | Spray | Glass | 0.5 | 200 | 2.4 |
| Ex. 93 | 20 | 10 | 10 | ME: 60 ET: 20 | None | Spin | Silicon substrate | 0.1 | 200 | 4.5 |
| Ex. 94 | 50 | 10 | 10 | EG: 80 | None | Spin | Glass w/ITO film | 0.5 | 300 | 5.2 |
| Ex. 95 | 50 | 10 | 10 | ET: 20 BU: 60 | None | Knife | Polyimide | 2.0 | 130 | 6.1 |
| Ex. 96 | 50 | 10 | 10 | PG: 80 | None | Slit | Glass | 0.5 | 300 | 4.8 |
| Ex. 97 | 40 | 50 | 10 | DEG: 40 | None | Screen printing | Glass | 2.0 | 400 | 3.7 |
| Ex. 98 | 20 | 10 | 10 | ET: 20 GL: 60 | None | Screen printing | PET film | 2.0 | 150 | 5.3 |
| Ex. 99 | 60 | 50 | 10 | EG: 10 ER: 30 | None | Offset printing | Solar cell w/ ITO film | 2.0 | 150 | 6.8 |
| Ex. 100 | 40 | 10 | 10 | IH: 70 | C: 10 | Die coating | Solar cell w/o ITO film | 0.3 | 180 | 6.4 |
| Ex. 101 | 70 | 10 | 10 | ET: 50 EG: 20 | A: 10 | Knife | Glass | 0.2 | 300 | 5.9 |
| Ex. 102 | 30 | 50 | 10 | ET: 50 EG: 20 | B: 10 | Spray | Aluminum | 1.0 | 200 | 4.2 |
| Ex. 103 | 20 | 10 | 10 | PR: 80 | None | Spray | Aluminum | 1.0 | 180 | 6.3 |
| Comp. Ex. 30 | 200 | 10 | 10 | PR: 80 | None | Spray | Aluminum | 1.0 | 180 | 43 |
| Comp. Ex. 31 | 30 | 10 | 10 | PR: 80 | None | Spray | Aluminum | 1.0 | 180 | 34 |
| Comp. Ex. 32 | 150 | 10 | 10 | PR: 80 | None | Spray | Aluminum | 1.0 | 180 | 31 |
| Comp. Ex. 33 | 120 | 10 | 10 | EG: 80 | None | Spin | Glass w/ITO film | 0.5 | 300 | 29 |

The dispersions obtained in Examples 91 to 103 and Comparative Examples 30 to 33 were coated on the base materials shown in Table 23 in accordance with the coating methods shown in Table 23, and then were baked in air for 30 minutes at the baking temperatures shown in Table 23. The thicknesses of the coated films after baking, the volume resistivities of the resulting coated films, and the mean particle diameters of the metal nanoparticles are shown in Table 23. The method for measuring mean particle diameter of the metal nanoparticles included: in order, first obtaining images of the resulting metal nanoparticles by a transmission electron microscope (TEM) at a magnification of about 500,000; measuring the primary particle diameters of 200 metal nanoparticles in the resulting images; preparing a particle diameter distribution based on the measurement results; and calculating the mean value which was the mean particle diameter from the prepared particle diameter distribution. In addition, the volume resistivity was measured and calculated according to the four terminal method, and the film thickness was measured by a micrometer.

As is clear from Table 23, in Examples 91 to 103, the volume resistivities of the coated films were on the order of $10^{-6}$ Ω·cm in all cases, and these were preferable values for using the coated film as an electrically conductive material. In addition, the mean particle diameters were within a range from 10 to 70 nm, and therefore, it was cofirmed that so-called metal nanoparticles were formed.

On the other hand, in Comparative Examples 30 to 33, the volume resistivities of the coated films demonstrated values that were about ten times more than those of Examples, and these coated films cannot be said to be preferable as electrically conductive materials. In Comparative Example 30, the effect of the acetic acid which was added as the carboxylic acid and served as a protective agent to chemically modify the particle surfaces was small; thereby, the particle diameter was increased. As a result, it is thought that the effect of sintering at low temperatures which is unique to nanoparticles deteriorated. In Comparative Example 31, since the reaction temperature was low, unreacted carboxylic acid salt remained, and this residue impaired sintering between nanoparticles. As a result, it is thought that this caused an increase in volume resistivity. Conversely, in Comparative Example 32, since the reaction temperature was high, the growth of particles progressed. As a result, it is thought that the effect of sintering at low temperatures which is unique to nanoparticles deteriorated in the same manner as in Comparative Example 26. In Comparative Example 33, since Pd was added at an amount of 40% by mass which was more than 25% by mass that was calculated from the lower limit of the range of Ag amount in the present embodiment, it is thought that the volume resistivity and the particle diameter increased.

(Examples Relating to Embodiments According to [68] to [72])

The following provides a detailed explanation of examples of embodiments according to [68] to [72] together with comparative examples.

Examples 104 to 116 and Comparative Examples 34 to 37

First, the metal salts containing metal elements, either one of carboxylic acids and carboxylic acid salts, and reducing agents shown in the following Table 24 were respectively dissolved in deionized water to respectively prepare saturated aqueous solutions at room temperature. Here, nitrates were used for the metal salts, with the exception that chlorine compounds were used only for Au and Pt. In addition, the basic compounds shown in Table 24 were dissolved in deionized water to prepare basic aqueous solutions having a concentration of 3 M, and then the aqueous solutions were mixed with the molar ratios shown in Table 24 as follows.

Mixing was carried out in accordance with the synthesis flow shown in FIG. 7.

Here, when dropping the aqueous reducing agent C, the suspension of a carboxylic acid salt was heated to the reaction temperatures indicated in the column entitled "Reaction temperature" in Table 20 using a water bath, and after reaching the reaction temperatures, the mixtures were continued to be stirred with a magnetic stirrer at a rotating speed of 400 ppm for 4 hours while refluxing. The resulting reaction liquids were used as the reaction liquids of Examples 104 to 116 and Comparative Examples 34 to 37, and information about the aqueous carboxylic acid solution B, the aqueous metal salt solution A, the aqueous reducing agent solution C, and the basic aqueous solution D which were used to obtain the reaction liquids are shown in Table 24.

Here, with regard to Examples 104 to 116, after reacting for 4 hours, dry substances of the reaction liquids were evaluated by X-ray analysis. As a result, carboxylic acid salts of the added metals were not detected.

TABLE 24

| | Metal elements | | Carboxylic acid | | Reducing agent | | Basic aqueous solution | | Reaction |
| | | | | Molar ratio to metal | | Molar ratio to metal | | Molar ratio to metal | |
| | Type | Mass % | Name | element | Name | element | Name | element | temp. (° C.) |
|---|---|---|---|---|---|---|---|---|---|
| Ex. 104 | Ag | 100 | Glycolic acid | 1 | Hydrazine | 1 | NaOH | 1 | 25 |
| Ex. 105 | Ag | 95 | Citric acid | 1 | Hydrazine acetate | 2 | KOH | 1 | 40 |
| | Au | 5 | | | | | | | |
| Ex. 106 | Ag | 75 | Citric acid | 1 | Ammonium formate | 1 | NH$_3$ | 1 | 60 |
| | Pt | 25 | | | | | | | |
| Ex. 107 | Ag | 80 | Malic acid | 1 | Na formate | 1 | NH$_3$ | 1 | 60 |
| | Pd | 20 | | | | | | | |
| Ex. 108 | Ag | 99 | Maleic acid | 0.5 | Na formate | 1 | KOH | 2 | 60 |
| | Ru | 1 | | | | | | | |
| Ex. 109 | Ag | 100 | Maleic acid | 3 | Na oxalate | 1 | NaOH | 4 | 80 |
| Ex. 110 | Ag | 100 | Malonic acid | 2 | Ascorbic acid | 0.5 | NaOH | 2 | 30 |
| Ex. 111 | Ag | 100 | Malonic acid | 0.5 | Na ascorbate | 2 | NH$_3$ | 0.5 | 30 |
| Ex. 112 | Ag | 100 | Fumaric acid | 1 | Na borohydride | 0.5 | NaOH | 1 | 40 |
| Ex. 113 | Ag | 100 | Fumaric acid | 0.5 | Na borohydride | 0.5 | NaOH | 0.1 | 40 |
| Ex. 114 | Ag | 100 | Succinic acid | 0.5 | K borohydride | 0.1 | NH$_3$ | 0.1 | 40 |
| Ex. 115 | Ag | 100 | Tartaric acid | 1 | Glucose | 3 | KOH | 1 | 95 |
| Ex. 116 | Ag | 100 | Tartaric acid | 1 | Na borohydride | 0.5 | NH$_3$ | 1 | 40 |
| Comp. Ex. 34 | Ag | 100 | Acetic acid | 1 | Na borohydride | 0.5 | NaOH | 1 | 40 |
| Comp. Ex. 35 | Ag | 100 | Tartaric acid | 1 | Na borohydride | 0.5 | NH$_3$ | 1 | 20 |
| Comp. Ex. 36 | Ag | 100 | Tartaric acid | 1 | Na borohydride | 0.5 | NH$_3$ | 1 | 100 |
| Comp. Ex. 37 | Ag | 60 | Malic acid | 1 | Na formate | 1 | NH$_3$ | 1 | 60 |
| | Pd | 40 | | | | | | | |

<Comparative Test and Evaluation>

After the completion of the reaction, the reaction liquids of Examples 104 to 116 and Comparative Examples 34 to 37 were centrifuged for 3 minutes at 1000 G 0.1 M of aqueous ammonia was added to the resulting precipitate at an amount of 50 times more than the mass of the precipitate, and stirred for 10 minutes. Thereafter, the resulting dispersion was again centrifuged for 3 minutes at 1000 G. Water was added to the precipitate, and after desalting by ultrafiltration, a solvent such as ethanol, methanol, and the like was added and the mixture was stirred to obtain a dispersion of metal nanoparticles. The compositions of the resulting dispersions of Examples 104 to 116 and Comparative Examples 34 to 37 are shown in Table 25.

calculated according to the four terminal method, and the film thickness was measured by a micrometer.

In the column entitled "Alcohol" in Table 25, ME indicates methanol, ET indicates ethanol, EG indicates ethylene glycol, BU indicates butanol, PG indicates propylene glycol, DEG indicates diethylene glycol, GL indicates glycerol, ER indicates erythritol, IH indicates isobornyl hexanol, and PR indicates propanol.

In addition, in the column entitled "Other solvent" in Table 25, "A" indicates a mixed liquid of acetone and isopropyl glycol mixed at a mass ratio of 1:1, "B" indicates a mixed liquid of cyclohexane and methyl ethyl ketone mixed at a mass ratio of 1:1, and "C" indicates a mixed liquid of toluene and hexane mixed at a mass ratio of 1:1.

TABLE 25

| | Mean particle diameter (nm) | Dispersion (composition) (mass %) | | | | Coating method | Base material | Film thickness after baking (μm) | Baking temp. (° C.) | Volume resistivity ($10^{-6}$ Ω·cm) |
|---|---|---|---|---|---|---|---|---|---|---|
| | | Metal | Water | Alcohol | Other solvent | | | | | |
| Ex. 104 | 30 | 10 | 10 | ME: 80 | None | Dispenser | Glass | 2.0 | 200 | 2.9 |
| Ex. 105 | 40 | 10 | 10 | ME: 80 | None | Spray | Glass | 0.5 | 200 | 3.2 |
| Ex. 106 | 20 | 10 | 10 | ME: 60 ET: 20 | None | Spin | Silicon substrate | 0.1 | 200 | 5.5 |
| Ex. 107 | 70 | 10 | 10 | EG: 80 | None | Spin | Glass w/ ITO film | 0.5 | 300 | 6.1 |
| Ex. 108 | 30 | 10 | 10 | ET: 20 BU: 60 | None | Knife | Polyimide | 2.0 | 130 | 7.1 |
| Ex. 109 | 70 | 10 | 10 | PG: 80 | None | Slit | Glass | 0.5 | 300 | 3.1 |
| Ex. 110 | 20 | 50 | 10 | DEG: 40 | None | Screen printing | Glass | 2.0 | 400 | 2.9 |
| Ex. 111 | 50 | 10 | 10 | ET: 20 GL: 60 | None | Screen printing | PET film | 2.0 | 150 | 6.4 |
| Ex. 112 | 60 | 50 | 10 | EG: 10 ER: 30 | None | Offset printing | Solar cell w/ ITO film | 2.0 | 150 | 8.1 |
| Ex. 113 | 60 | 10 | 10 | IH: 70 | C: 10 | Die coating | Solar cell w/o ITO film | 0.3 | 180 | 5.2 |
| Ex. 114 | 30 | 10 | 10 | ET: 50 EG: 20 | A: 10 | Knife | Glass | 0.2 | 300 | 4.4 |
| Ex. 115 | 20 | 50 | 10 | ET: 50 EG: 20 | B: 10 | Spray | Aluminum | 1.0 | 200 | 4.9 |
| Ex. 116 | 40 | 10 | 10 | PR: 80 | None | Spray | Aluminum | 1.0 | 180 | 5.2 |
| Comp. Ex. 34 | 200 | 10 | 10 | PR: 80 | None | Spray | Aluminum | 1.0 | 180 | 37 |
| Comp. Ex. 35 | 30 | 10 | 10 | PR: 80 | None | Spray | Aluminum | 1.0 | 180 | 34 |
| Comp. Ex. 36 | 150 | 10 | 10 | PR: 80 | None | Spray | Aluminum | 1.0 | 180 | 32 |
| Comp. Ex. 37 | 120 | 10 | 10 | EG: 80 | None | Spin | Glass w/ ITO film | 0.5 | 300 | 27 |

The dispersions obtained in Examples 104 to 116 and Comparative Examples 34 to 37 were coated on the base materials shown in Table 25 in accordance with the coating methods shown in Table 25, and then were baked in air for 30 minutes at the baking temperatures shown in Table 25. The thicknesses of the coated films after baking, the volume resistivities of the resulting coated films, and the mean particle diameters of the metal nanoparticles are shown in Table 25. The method for measuring mean particle diameter of the metal nanoparticles included: in order, first obtaining images of the resulting metal nanoparticles by a transmission electron microscope (TEM) at a magnification of about 500,000; measuring the primary particle diameters of 200 metal nanoparticles in the resulting images; preparing a particle diameter distribution based on the measurement results; and calculating the mean value which was the mean particle diameter from the prepared particle diameter distribution. In addition, the volume resistivity was measured and As is clear from Table 25, in Examples 103 to 116, the volume resistivities of the coated films were on the order of $10^{-6}$ Ω·cm in all cases, and these were preferable values for using the coated film as an electrically conductive material. In addition, the mean particle diameters were within a range from 10 to 70 nm, and therefore, it was cofirmed that so-called metal nanoparticles were formed.

On the other hand, in Comparative Examples 34 to 37, the volume resistivities of the coated films demonstrated values that were about ten times more than those of Examples, and these coated films cannot be said to be preferable as electrically conductive materials. In Comparative Example 34, the effect of the acetic acid which was added as the carboxylic acid and served as a protective agent to chemically modify the particle surfaces was small; thereby, the particle diameter was increased. As a result, it is thought that the effect of sintering at low temperatures which is unique to nanoparticles deteriorated. In Comparative Example 35, since the reaction temperature was low, unreacted carboxylic acid salt remained, and this residue impaired sintering between nanoparticles. As a result, it is thought that this caused an increase in volume resistivity. Conversely, in Comparative Example 36, since the reaction temperature was high, the growth of particles progressed. As a result, it is thought that the effect of sintering at low temperatures which is unique to nanoparticles deteriorated in the same manner as in Comparative Example 34. In Comparative Example 37, since Pd was added at an amount of 40% by mass which was more than 25% by mass that was calculated from the lower limit of the range of Ag amount in the present embodiment, it is thought that the volume resistivity and the particle diameter increased.

(Examples Relating to Embodiments According to [73] to [77])

The following provides a detailed explanation of examples of embodiments according to [73] to [77] together with comparative examples.

Examples 117 to 129 and Comparative Examples 38 to 41

First, the metal salts containing metal elements, either one of carboxylic acids and carboxylic acid salts, and reducing agents shown in the following Table 26 were respectively dissolved in deionized water to respectively prepare saturated aqueous solutions at room temperature. Here, nitrates were used for the metal salts, with the exception that chlorine compounds were used only for Au and Pt. In addition, the basic compounds shown in Table 26 were dissolved in deionized water to prepare basic aqueous solutions having a concentration of 3 M, and then the aqueous solutions were mixed with the molar ratios shown in Table 26 as follows.

Mixing was carried out in accordance with the synthesis flow shown in FIG. 8.

Here, when dropping the aqueous reducing agent C, the suspension of a carboxylic acid salt was heated to the reaction temperatures indicated in the column entitled "Reaction temperature" in Table 26 using a water bath, and after reaching the reaction temperatures, the mixtures were continued to be stirred with a magnetic stirrer at a rotating speed of 400 ppm for 4 hours while refluxing. The resulting reaction liquids were used as the reaction liquids of Examples 117 to 129 and Comparative Examples 38 to 41, and information about the aqueous carboxylic acid solution B, the aqueous metal salt solution A, the aqueous reducing agent solution C, and the basic aqueous solution D which were used to obtain the reaction liquids are shown in Table 26.

Here, with regard to Examples 117 to 129, after reacting for 4 hours, dry substances of the reaction liquids were evaluated by X-ray analysis. As a result, carboxylic acid salts of the added metals were not detected.

TABLE 26

| | Metal elements | | Carboxylic acid | | Reducing agent | | Basic aqueous solution | | Reaction temp. (° C.) |
|---|---|---|---|---|---|---|---|---|---|
| | Type | Mass % | Name | Molar ratio to metal element | Name | Molar ratio to metal element | Name | Molar ratio to metal element | |
| Ex. 117 | Ag | 100 | Glycolic acid | 1 | Hydrazine | 1 | NaOH | 1 | 25 |
| Ex. 118 | Ag Au | 95 5 | Citric acid | 1 | Hydrazine acetate | 2 | KOH | 1 | 40 |
| Ex. 119 | Ag Pt | 75 25 | Citric acid | 1 | Ammonium formate | 1 | NH$_3$ | 1 | 60 |
| Ex. 120 | Ag Pd | 80 20 | Malic acid | 1 | Na formate | 1 | NH$_3$ | 1 | 60 |
| Ex. 121 | Ag Ru | 99 1 | Maleic acid | 0.5 | Na formate | 1 | KOH | 2 | 60 |
| Ex. 122 | Ag | 100 | Maleic acid | 3 | Na oxalate | 1 | NaOH | 4 | 80 |
| Ex. 123 | Ag | 100 | Malonic acid | 2 | Ascorbic acid | 0.5 | NaOH | 2 | 30 |
| Ex. 124 | Ag | 100 | Malonic acid | 0.5 | Na ascorbate | 2 | NH$_3$ | 0.5 | 30 |
| Ex. 125 | Ag | 100 | Fumaric acid | 1 | Na borohydride | 0.5 | NaOH | 1 | 40 |
| Ex. 126 | Ag | 100 | Fumaric acid | 0.5 | Na borohydride | 0.5 | NaOH | 0.1 | 40 |
| Ex. 127 | Ag | 100 | Succinic acid | 0.5 | K borohydride | 0.1 | NH$_3$ | 0.1 | 40 |
| Ex. 128 | Ag | 100 | Tartaric acid | 1 | Glucose | 3 | KOH | 1 | 95 |
| Ex. 129 | Ag | 100 | Tartaric acid | 1 | Na borohydride | 0.5 | NH$_3$ | 1 | 40 |
| Comp. Ex. 38 | Ag | 100 | Acetic acid | 1 | Na borohydride | 0.5 | NaOH | 1 | 40 |
| Comp. Ex. 39 | Ag | 100 | Tartaric acid | 1 | Na borohydride | 0.5 | NH$_3$ | 1 | 20 |
| Comp. Ex. 40 | Ag | 100 | Tartaric acid | 1 | Na borohydride | 0.5 | NH$_3$ | 1 | 100 |
| Comp. Ex. 41 | Ag Pd | 60 40 | Malic acid | 1 | Na formate | 1 | NH$_3$ | 1 | 60 |

<Comparative Test and Evaluation>

After the completion of the reaction, the reaction liquids of Examples 117 to 129 and Comparative Examples 38 to 41 were centrifuged for 3 minutes at 1000 G 0.1 M of aqueous ammonia was added to the resulting precipitate at an amount of 50 times more than the weight of the precipitate, and stirred for 10 minutes. Thereafter, the resulting dispersion was again centrifuged for 3 minutes at 1000 G. Water and solvent were added to the precipitate and the mixture was stirred to obtain dispersions of metal nanoparticles. The compositions of the resulting dispersions of Examples 117 to 129 and Comparative Examples 38 to 41 are shown in Table 27.

The dispersions obtained in Examples 117 to 129 and Comparative Examples 38 to 41 were coated on the base materials shown in Table 27 in accordance with the coating methods shown in Table 27, and then were baked in air for 30 minutes at the baking temperatures shown in Table 27.

In the column entitled "Alcohol" in Table 27, ME indicates methanol, ET indicates ethanol, EG indicates ethylene glycol, BU indicates butanol, PG indicates propylene glycol, DEG indicates diethylene glycol, GL indicates glycerol, ER indicates erythritol, IH indicates isobornyl hexanol, and PR indicates propanol.

In addition, in the column entitled "Other solvent" in Table 27, "A" indicates a mixed liquid of acetone and isopropyl glycol mixed at a weight ratio of 1:1, "B" indicates a mixed liquid of cyclohexane and methyl ethyl ketone mixed at a weight ratio of 1:1, and "C" indicates a mixed liquid of toluene and hexane mixed at a weight ratio of 1:1.

TABLE 27

| | Mean particle diameter (nm) | Dispersion (composition) (mass %) | | | | Coating method | Base material | Film thickness after baking (μm) | Baking temp. (° C.) | Volume resistivity ($10^{-6}$ Ω·cm) |
|---|---|---|---|---|---|---|---|---|---|---|
| | | Metal | Water | Alcohol | Other solvent | | | | | |
| Ex. 117 | 40 | 10 | 10 | ME: 80 | None | Dispenser | Glass | 2.0 | 200 | 4.5 |
| Ex. 118 | 60 | 10 | 10 | ME: 80 | None | Spray | Glass | 0.5 | 200 | 4.2 |
| Ex. 119 | 30 | 10 | 10 | ME: 60 ET: 20 | None | Spin | Silicon substrate | 0.1 | 200 | 3.1 |
| Ex. 120 | 20 | 10 | 10 | EG: 80 | None | Spin | Glass w/ITO film | 0.5 | 300 | 5.4 |
| Ex. 121 | 60 | 10 | 10 | ET: 20 BU: 60 | None | Knife | Polyimide | 2.0 | 130 | 4.9 |
| Ex. 122 | 50 | 10 | 10 | PG: 80 | None | Slit | Glass | 0.5 | 300 | 4.8 |
| Ex. 123 | 50 | 50 | 10 | DEG: 40 | None | Screen printing | Glass | 2.0 | 400 | 2.7 |
| Ex. 124 | 20 | 10 | 10 | ET: 20 GL: 60 | None | Screen printing | PET film | 2.0 | 150 | 4.2 |
| Ex. 125 | 40 | 50 | 10 | EG: 10 ER: 30 | None | Offset printing | Solar cell w/ ITO film | 2.0 | 150 | 3.3 |
| Ex. 126 | 20 | 10 | 10 | IH: 70 | C: 10 | Die coating | Solar cell w/o ITO film | 0.3 | 180 | 7.4 |
| Ex. 127 | 70 | 10 | 10 | ET: 50 EG: 20 | A: 10 | Knife | Glass | 0.2 | 300 | 5.5 |
| Ex. 128 | 30 | 50 | 10 | ET: 50 EG: 20 | B: 10 | Spray | Aluminum | 1.0 | 200 | 4.2 |
| Ex. 129 | 20 | 10 | 10 | PR: 80 | None | Spray | Aluminum | 1.0 | 180 | 7.3 |
| Comp. Ex. 38 | 200 | 10 | 10 | PR: 80 | None | Spray | Aluminum | 1.0 | 180 | 31 |
| Comp. Ex. 39 | 30 | 10 | 10 | PR: 80 | None | Spray | Aluminum | 1.0 | 180 | 42 |
| Comp. Ex. 40 | 150 | 10 | 10 | PR: 80 | None | Spray | Aluminum | 1.0 | 180 | 28 |
| Comp. Ex. 41 | 120 | 10 | 10 | EG: 80 | None | Spin | Glass w/ITO film | 0.5 | 300 | 32 |

The thicknesses of the coated films after baking, the volume resistivities of the resulting coated films, and the mean particle diameters of the metal nanoparticles are shown in Table 27. The method for measuring mean particle diameter of the metal nanoparticles included: in order, first obtaining images of the resulting metal nanoparticles by a transmission electron microscope (TEM) at a magnification of about 500,000; measuring the primary particle diameters of 200 metal nanoparticles in the resulting images; preparing a particle diameter distribution based on the measurement results; and calculating the mean value which was the mean particle diameter from the prepared particle diameter distribution. In addition, the volume resistivity was measured and calculated according to the four terminal method, and the film thickness was measured by a micrometer.

As is clear from Table 27, in Examples 117 to 129, the volume resistivities of the coated films were on the order of $10^{-6}$ Ω·cm in all cases, and these were preferable values for using the coated film as an electrically conductive material. In addition, the mean particle diameters were within a range from 10 to 70 nm, and therefore, it was cofirmed that so-called metal nanoparticles were formed.

On the other hand, in Comparative Examples 38 to 41, the volume resistivities of the coated films demonstrated values that were about ten times more than those of Examples, and these coated films cannot be said to be preferable as electrically conductive materials. In Comparative Example 38, the effect of the acetic acid which was added as the carboxylic acid and served as a protective agent to chemically modify the particle surfaces was small; thereby, the particle diameter was increased. As a result, it is thought that the effect of sintering at low temperatures which is unique to nanoparticles deteriorated. In Comparative Example 39, since the reaction temperature was low, unreacted carboxylic acid salt remained, and this residue impaired sintering between nanoparticles. As a result, it is thought that this caused an increase in volume resistivity. Conversely, in Comparative Example 40, since the reaction temperature was high, the growth of particles progressed. As a result, it is thought that the effect of sintering at low temperatures which is unique to nanoparticles deteriorated in the same manner as in Comparative Example 38. In Comparative Example 41, since Pd was added at an amount of 40% by mass which was more than 25% by mass that was calculated from the lower limit of the range of Ag amount in the present embodiment, it is thought that the volume resistivity and the particle diameter increased.

According to the dispersion of metal nanoparticles, the method for producing the same, and the method for synthesizing metal nanoparticles of the present invention, an electrode of a solar cell can be formed that is capable of maintaining low volume resistivity and high reflectance over a long period of time, and a solar cell having superior long-term stability can be produced without impairing cost effectiveness and productivity.

Accordingly, the present invention has high industrial applicability.

The invention claimed is:

1. A method for synthesizing metal nanoparticles, comprising the steps of:
preparing an aqueous metal salt solution (A) by dissolving a metal salt, said aqueous metal salt solution (A) consisting essentially of the metal salt and a solvent;
preparing an aqueous carboxylic acid solution (B) by dissolving one type or two or more types of compounds selected from the group consisting of citric acid, maleic acid and salts thereof;
preparing an aqueous reducing agent solution (C) by dissolving one type or two or more types of compounds selected from the group consisting of oxalic acid and salts thereof;
mixing the aqueous carboxylic acid solution (B) with the aqueous metal salt solution (A) so as to obtain a suspension of a carboxylic acid salt in which poorly-soluble carboxylic acid salt precipitates; and
forming metal nanoparticles by adding and mixing the aqueous reducing agent solution (C) with the suspension of the carboxylic acid salt,
wherein the aqueous solutions (A), (B), and (C) are separately prepared,
metal elements contained in the metal salt comprise 75% by mass or more of silver, and
the mixing with the aqueous reducing agent solution is carried out by stirring at a temperature of 25 to 95° C.

2. The method for synthesizing metal nanoparticles according to claim 1, wherein one type or two or more types of metals selected from the group consisting of gold, platinum, palladium, and ruthenium are included as the remainder of the metal elements contained in the metal salt of the aqueous metal salt solution (A) other than silver.

3. A method for producing a metal film, comprising the steps of:
obtaining a dispersion of metal nanoparticles by dispersing the metal nanoparticles which are obtained by the synthesis method according to claim 1 in a dispersion medium; and
forming a metal film by coating the dispersion of metal nanoparticles as a composition for producing a metal film on a base material by a wet coating process.

4. A dispersion of metal nanoparticles comprising metal nanoparticles which are dispersed in a dispersion medium,
wherein the metal nanoparticles are synthesized by adding and mixing a metal salt in which the proportion of silver to metal elements is 75% by mass or more, a carboxylic acid, a reducing agent, and an additive containing borate ions in a liquid phase, and stirring the resulting suspension at a temperature of 25 to 95° C.,
the concentration of the additive contained in the dispersion is within a range from 0.01 to 100 ppm,
the carboxylic acid is an aqueous carboxylic acid solution that is prepared by dissolving one type or two or more types of compounds selected from the group consisting of citric acid, maleic acid, and salts thereof,
the metal salt is an aqueous metal salt solution that is prepared by dissolving the metal salt therein, said aqueous metal salt solution consisting essentially of the metal salt and a solvent,
the additive is an aqueous additive solution,
the reducing agent is an aqueous reducing agent solution,
the aqueous metal salt solution, the aqueous carboxylic acid solution, and the aqueous reducing agent solution are separately prepared,
the aqueous carboxylic acid solution is mixed with the aqueous metal salt solution and the aqueous additive solution so as to obtain a suspension of a carboxylic acid salt in which poorly-soluble carboxylic acid salt precipitates, and
the suspension of the carboxylic acid salt is subsequently mixed with the aqueous reducing agent solution.

5. The dispersion according to claim 4, wherein the dispersion medium contains 1% by mass or more of water and 2% by mass or more of alcohol.

6. The dispersion according to claim 5, wherein the alcohol is one type or two or more types selected from the group consisting of methanol, ethanol, propanol, butanol, ethylene glycol, propylene glycol, diethylene glycol, isobornyl hexanol, glycerol, and erythritol.

7. A method for producing a dispersion of metal nanoparticles, comprising the steps of:
synthesizing metal nanoparticles by mixing a metal salt in which the proportion of silver to metal elements is 75% by mass or more, a carboxylic acid, and a reducing agent in a liquid phase;
dispersing the synthesized metal nanoparticles in a dispersion medium;
wherein the synthesizing of the metal nanoparticles is carried out by adding and mixing an additive containing borate ions together with the metal salt, the carboxylic acid, and the reducing agent in the liquid phase, and stirring the resulting suspension at a temperature of 25 to 95° C.;
preparing the carboxylic acid in the form of an aqueous carboxylic acid solution by dissolving one type or two or more types of compounds selected from the group consisting of citric acid, maleic acid, and salts thereof;
preparing the metal salt in the form of an aqueous metal salt solution by dissolving the metal salt, said aqueous metal salt solution consisting essentially of the metal salt and a solvent;
preparing the additive in the form of an aqueous additive solution;
preparing the reducing agent in the form of an aqueous reducing agent solution;

mixing the aqueous carboxylic acid solution with the aqueous metal salt solution and the aqueous additive solution so as to obtain a suspension of a carboxylic acid salt in which poorly-soluble carboxylic acid salt precipitates;

subsequently mixing the suspension of the carboxylic acid salt with the aqueous reducing agent solution; and reducing the concentration of the additive contained in the prepared dispersion to be within a range from 0.01 to 100 ppm after the synthesizing of the metal nanoparticles, and wherein the aqueous metal salt solution, the aqueous carboxylic acid solution, and the aqueous reducing agent solution are separately prepared.

8. The production method according to claim 7, wherein the reducing agent is one type or two or more types selected from the group consisting of hydrazine, sodium borohydride, ascorbic acid, oxalic acid, formic acid, salts thereof, and salts of Fe(II).

9. The production method according to claim 7, wherein metal nanoparticles which has a composition, a mixed composition, or an alloy composition composed of one type or two or more types selected from the group consisting of gold, platinum, palladium, and ruthenium, are contained at a content within a range from 0.02% by mass or more to less than 25% by mass.

10. The production method according to claim 7, wherein the dispersion medium contains 1% by mass or more of water and 2% by mass or more of alcohol.

11. The production method according to claim 10, wherein the alcohol is one type or two or more types selected from the group consisting of methanol, ethanol, propanol, butanol, ethylene glycol, propylene glycol, diethylene glycol, isobornyl hexanol, glycerol, and erythritol.

12. A dispersion of metal nanoparticles which is obtained by the production method according to claim 7,
wherein the concentration of the additive contained in the dispersion is within a range from 0.01 to 100 ppm.

13. A method for forming an electrode for a solar cell, comprising the steps of:
preparing an electrode-forming composition by using the dispersion of metal nanoparticles according to claim 4, a dispersion of metal nanoparticles obtained by the method according to claim 7, or the dispersion of metal nanoparticles according to claim 12; and
coating the electrode-forming composition on a base material by a wet coating process.

14. A method for forming an electrode of a solar cell according to claim 13,
wherein in the coating of the electrode-forming composition on the base material, a film is formed such that the thickness of the film after baking becomes within a range from 0.1 to 2.0 µm, and
the method further comprises baking the base material having the film on the upper surface thereof at 130 to 400° C.

15. The method for forming an electrode of a solar cell according to claim 13, wherein the base material is a substrate composed of either one of silicon, glass, ceramic containing a transparent electrically conductive material, polymer material, and metal, or a laminate of two or more types of materials selected from the group consisting of silicon, glass, ceramic containing a transparent electrically conductive material, polymer material, and metal.

16. The method for forming an electrode of a solar cell according to claim 13, wherein the base material is either one of a solar cell element and a solar cell element having a transparent electrode.

17. The method for forming an electrode of a solar cell according to claim 13, wherein the wet coating process is either one of spray coating, dispenser coating, spin coating, knife coating, slit coating, ink jet coating, screen printing, offset printing, and die coating.

18. An electrode for a solar cell which is obtained by the method for forming an electrode of a solar cell according to claim 13.

19. A solar cell comprising the electrode according to claim 18.

20. A dispersion of metal nanoparticles comprising metal nanoparticles which are dispersed in a dispersion medium,
wherein the metal nanoparticles are synthesized by adding and mixing a metal salt in which the proportion of silver to metal elements is 75% by mass or more, a carboxylic acid, a reducing agent, and an additive in the form of a salt of one type or two or more types of metal elements selected from the group consisting of magnesium, barium, lead, bismuth, and cerium, which differ from the metal elements that compose the metal salt and which are not reduced by the reducing agent, in a liquid phase, and stirring the resulting suspension at a temperature of 25 to 95° C., the concentration of the additive contained in the dispersion is within a range from 0.01 to 100 ppm,
the carboxylic acid is an aqueous carboxylic acid solution that is prepared by dissolving one type or two or more types of compounds selected from the group consisting of citric acid, maleic acid, and salts thereof,
the metal salt is an aqueous metal salt solution that is prepared by dissolving the metal salt, said aqueous metal salt solution consisting essentially of the metal salt and a solvent,
the additive is an aqueous additive solution,
the reducing agent is an aqueous reducing agent solution,
the aqueous metal salt solution, the aqueous carboxylic acid solution, and the aqueous reducing agent solution are separately prepared,
the aqueous carboxylic acid solution is mixed with the aqueous metal salt solution and the aqueous additive solution so as to obtain a suspension of a carboxylic acid salt in which poorly-soluble carboxylic acid salt precipitates, and
the suspension of the carboxylic acid salt is subsequently mixed with the aqueous reducing agent solution.

21. The dispersion according to claim 20, wherein the dispersion medium contains 1% by mass or more of water and 2% by mass or more of alcohol.

22. The dispersion according to claim 21, wherein the alcohol is one type or two or more types of alcohol selected from the group consisting of methanol, ethanol, propanol, butanol, ethylene glycol, propylene glycol, diethylene glycol, isobornyl hexanol, glycerol, and erythritol.

23. A method for producing a dispersion of metal nanoparticles, comprising the steps of:
synthesizing metal nanoparticles by mixing a metal salt in which the proportion of silver to the metal elements is 75% by mass or more, a carboxylic acid, and a reducing agent in a liquid phase;
dispersing the synthesized metal nanoparticles in a dispersion medium, wherein the synthesizing of the metal nanoparticles is carried out by adding and mixing an additive in the form of a salt of one type or two or more types of metal elements selected from the group consisting of magnesium, barium, lead, bismuth and cerium, which differ from the metal elements that compose the metal salt and which are not reduced by the reducing agent, together with the metal salt, the carboxylic acid, and the reducing agent in the liquid phase, and stirring the resulting suspension at a temperature of 25 to 95° C.;

preparing the carboxylic acid in the form of an aqueous carboxylic acid solution by dissolving one type or two or more types of compounds selected from the group consisting of citric acid, maleic acid, and salts thereof;

preparing the metal salt in the form of an aqueous metal salt solution by dissolving the metal salt, said aqueous metal salt solution consisting essentially of the metal salt and a solvent;

preparing the additive in the form of an aqueous additive solution;

preparing the reducing agent in the form of an aqueous reducing agent solution;

mixing the aqueous carboxylic acid solution with the aqueous metal salt solution and the aqueous additive solution so as to obtain a suspension of a carboxylic acid salt in which poorly-soluble carboxylic acid salt precipitates;

subsequently mixing the suspension of the carboxylic acid salt with the aqueous reducing agent solution; and reducing the concentration of the additive contained in the prepared dispersion to be within a range from 0.01 to 100 ppm after the synthesizing of the metal nanoparticles, wherein the aqueous metal salt solution, the aqueous carboxylic acid solution, and the aqueous reducing agent solution are separately prepared.

24. The production method according to claim 23, wherein the reducing agent is one type or two or more types selected from the group consisting of hydrazine, sodium borohydride, ascorbic acid, oxalic acid, formic acid, salts thereof, and salts of Fe(II).

25. The production method according to claim 23, wherein metal nanoparticles which has a composition, a mixed composition, or an alloy composition composed of one type or two or more types selected from the group consisting of gold, platinum, palladium, and ruthenium, are contained at a content within a range from 0.02% by mass or more to less than 25% by mass.

26. The production method according to claim 23, wherein the dispersion medium contains 1% by mass or more of water and 2% by mass or more of alcohol.

27. The production method according to claim 26, wherein the alcohol is one type or two or more types selected from the group consisting of methanol, ethanol, propanol, butanol, ethylene glycol, propylene glycol, diethylene glycol, isobornyl hexanol, glycerol, and erythritol.

28. A dispersion of metal nanoparticles which is obtained by the production method according to claim 23,
wherein the concentration of the additive contained in the dispersion is within a range from 0.01 to 100 ppm.

29. A method for forming an electrode for a solar cell, comprising the steps of:
preparing an electrode-forming composition by using the dispersion of metal nanoparticles according to claim 20, a dispersion of metal nanoparticles obtained by the method according to claim 23, or the dispersion of metal nanoparticles according to claim 28; and
coating the electrode-forming composition on a base material by a wet coating process.

30. A method for forming an electrode of a solar cell according to claim 29,
wherein in the coating of the electrode-forming composition on the base material, a film is formed such that the thickness of the film after baking becomes within a range from 0.1 to 2.0 μm, and
the method further comprises baking the base material having the film on the upper surface thereof at 130 to 400° C.

31. The method for forming an electrode of a solar cell according to claim 29, wherein the base material is a substrate composed of either one of silicon, glass, ceramic containing a transparent electrically conductive material, polymer material, and metal, or a laminate of two or more types of materials selected from the group consisting of silicon, glass, ceramic containing a transparent electrically conductive material, polymer material, and metal.

32. The method for forming an electrode of a solar cell according to claim 29, wherein the base material is either one of a solar cell element and a solar cell element having a transparent electrode.

33. The method for forming an electrode of a solar cell according to claim 29, wherein the wet coating process is either one of spray coating, dispenser coating, spin coating, knife coating, slit coating, ink jet coating, screen printing, offset printing, and die coating.

34. An electrode for a solar cell which is obtained by the method for forming an electrode of a solar cell according to claim 29.

35. A solar cell comprising the electrode according to claim 34.

36. A dispersion of metal nanoparticles comprising metal nanoparticles which are dispersed in a dispersion medium,
wherein the metal nanoparticles are synthesized by adding and mixing a metal salt in which the proportion of silver to metal elements is 75% by mass or more, a carboxylic acid, a reducing agent, and an additive containing polyvinyl alcohol in a liquid phase, and stirring the resulting suspension at a temperature of 25 to 95° C.,
the concentration of the additive contained in the dispersion is within a range from 0.5 to 5000 ppm,
the carboxylic acid is an aqueous carboxylic acid solution that is prepared by dissolving one type or two or more types of compounds selected from the group consisting of citric acid, maleic acid, and salts thereof,
the metal salt is an aqueous metal salt solution that is prepared by dissolving the metal salt, said aqueous metal salt solution consisting essentially of the metal salt and a solvent,
the additive is an aqueous additive solution,
the reducing agent is an aqueous reducing agent solution,
the aqueous metal salt solution, the aqueous carboxylic acid solution, and the aqueous reducing agent solution are separately prepared,
the aqueous carboxylic acid solution is mixed with the aqueous metal salt solution and the aqueous additive solution so as to obtain a suspension of a carboxylic acid salt in which poorly-soluble carboxylic acid salt precipitates, and
the suspension of the carboxylic acid salt is subsequently mixed with the aqueous reducing agent solution.

37. The dispersion according to claim 36, wherein the dispersion medium contains 1% by mass or more of water and 2% by mass or more of alcohol.

38. The dispersion according to claim 37, wherein the alcohol is one type or two or more types of alcohol selected from the group consisting of methanol, ethanol, propanol, butanol, ethylene glycol, propylene glycol, diethylene glycol, isobornyl hexanol, glycerol and erythritol.

39. A method for producing a dispersion of metal nanoparticles, comprising the steps of:
synthesizing metal nanoparticles by mixing a metal salt in which the proportion of silver to the metal elements is 75% by mass or more, a carboxylic acid, and a reducing agent in a liquid phase; and
dispersing the synthesized metal nanoparticles in a dispersion medium, wherein the synthesizing of the metal nanoparticles is carried out by adding and mixing an additive containing polyvinyl alcohol together with the metal salt, the carboxylic acid, and the reducing agent in the liquid phase, and stirring the resulting suspension at a temperature of 25 to 95° C.;
preparing the carboxylic acid in the form of an aqueous carboxylic acid solution by dissolving one type or two or more types of compounds selected from the group consisting of citric acid, maleic acid, and salts thereof;
preparing the metal salt in the form of an aqueous metal salt solution by dissolving the metal salt, said aqueous metal salt solution consisting essentially of the metal salt and a solvent;
preparing the additive in the form of an aqueous additive solution;
preparing the reducing agent in the form of an aqueous reducing agent solution;
mixing the aqueous carboxylic acid solution with the aqueous metal salt solution and the aqueous additive solution so as to obtain a suspension of a carboxylic acid salt in which poorly-soluble carboxylic acid salt precipitates;
subsequently mixing the suspension of the carboxylic acid salt with the aqueous reducing agent solution; and
reducing the concentration of the additive contained in the prepared dispersion to be within a range from 0.5 to 5000 ppm after the synthesizing of the metal nanoparticles, wherein
the aqueous metal salt solution, the aqueous carboxylic acid solution, and the aqueous reducing agent solution are separately prepared.

40. The production method according to claim 39, wherein the reducing agent is one type or two or more types selected from the group consisting of hydrazine, sodium borohydride, ascorbic acid, oxalic acid, formic acid, salts thereof, glucose, and salts of Fe(II).

41. The production method according to claim 39, wherein metal nanoparticles which has a composition, a mixed composition, or an alloy composition composed of one type or two or more types selected from the group consisting of gold, platinum, palladium, ruthenium, nickel, copper, tin, indium, zinc, iron, chromium, manganese, and molybdenum, are contained at a content within a range from 0.02% by mass or more to less than 25% by mass.

42. The production method according to claim 39, wherein the metal nanoparticles are synthesized by adding and mixing the metal salt, the carboxylic acid, the reducing agent, and the additive in an oxygen-free atmosphere.

43. The production method according to claim 39, wherein the dispersion medium contains 1% by mass or more of water and 2% by mass or more of alcohol.

44. The production method according to claim 43, wherein the alcohol is one type or two or more types selected from the group consisting of methanol, ethanol, propanol, butanol, ethylene glycol, propylene glycol, diethylene glycol, isobornyl hexanol, glycerol, and erythritol.

45. A dispersion of metal nanoparticles which is obtained by the production method according to claim 39, wherein the concentration of the additive contained in the dispersion is within a range from 0.5 to 5000 ppm.

46. A method for forming an electrode for a solar cell, comprising the steps of:
preparing an electrode-forming composition by using the dispersion of metal nanoparticles according to claim 36, a dispersion of metal nanoparticles obtained by the method according to claim 39, or the dispersion of metal nanoparticles according to claim 45; and
coating the electrode-forming composition on a base material by a wet coating process.

47. A method for forming an electrode of a solar cell according to claim 46,
wherein in the coating of the electrode-forming composition on the base material, a film is formed such that the thickness of the film after baking becomes within a range from 0.1 to 2.0 μm, and
the method further comprises baking the base material having the film on the upper surface thereof at 130 to 400° C.

48. The method for forming an electrode of a solar cell according to claim 46, wherein the base material is a substrate composed of either one of silicon, glass, ceramic containing a transparent electrically conductive material, polymer material, and metal, or a laminate of two or more types of materials selected from the group consisting of silicon, glass, ceramic containing a transparent electrically conductive material, polymer material, and metal.

49. The method for forming an electrode of a solar cell according to claim 46, wherein the base material is either one of a solar cell element and a solar cell element having a transparent electrode.

50. The method for forming an electrode of a solar cell according to claim 46, wherein the wet coating process is either one of spray coating, dispenser coating, spin coating, knife coating, slit coating, ink jet coating, screen printing, offset printing, and die coating.

51. An electrode for a solar cell which is obatained by the method for forming an electrode according to claim 46.

52. A solar cell comprising the electrode according to claim 51.

53. A method for synthesizing metal nanoparticles, comprising the steps of:
preparing an aqueous metal salt solution (A) by dissolving a metal salt, said aqueous metal salt solution (A) consisting essentially of the metal salt and a solvent;
preparing an aqueous carboxylic acid solution (B) by dissolving one type or two or more types of compounds selected from the group consisting of citric acid, maleic acid and salts thereof;
preparing an aqueous reducing agent solution (C) by dissolving one type or two or more types of compounds selected from the group consisting of oxalic acid and salts thereof;
preparing a basic aqueous solution (D);
forming a mixed liquid by dropping the aqueous metal salt solution (A) into the aqueous carboxylic acid solution (B) while stirring;
forming a suspension of a carboxylic acid salt in which poorly-soluble carboxylic acid salt precipitates by dropping the basic aqueous solution (D) into the mixed liquid while stirring; and
forming metal nanoparticles by dropping the aqueous reducing agent solution (C) into the suspension of a carboxylic acid salt while stirring, wherein the aqueous solutions (A), (B), and (C) are separately prepared, metal elements contained in the metal salt comprise 75% by mass or more of silver, and the forming of the metal nanoparticles by dropping the aqueous reducing agent solution (C) while stirring is carried out by stirring at a temperature of 25 to 95° C.

54. The method for synthesizing metal nanoparticles according to claim 53, wherein one type or two or more types of metals selected from the group consisting of gold, platinum, palladium, and ruthenium are included as the remainder of the metal elements contained in the metal salt of the aqueous metal salt solution (A) other than silver.

55. A method for producing a metal film, comprising the steps of:
obtaining a dispersion of metal nanoparticles by dispersing the metal nanoparticles which are obtained by the synthesis method according to claim 53 in a dispersion medium; and
forming a metal film by coating the dispersion of metal nanoparticles as a composition for producing a metal film on a base material by a wet coating process.

56. A method for synthesizing metal nanoparticles, comprising the steps of:
preparing an aqueous metal salt solution (A) by dissolving a metal salt, said aqueous metal salt solution (A) consisting essentially of the metal salt and a solvent;
preparing an aqueous carboxylic acid solution (B) by dissolving one type or two or more types of compounds selected from the group consisting of citric acid, maleic acid and salts thereof;
preparing an aqueous reducing agent solution (C) by dissolving one type or two or more types of compounds selected from the group consisting of oxalic acid and salts thereof;
preparing a basic aqueous solution (D);
forming a mixed liquid by dropping the basic aqueous solution (D) into the aqueous metal salt solution (A) while stirring;
forming a suspension of a carboxylic acid salt in which poorly-soluble carboxylic acid salt precipitates by dropping the aqueous carboxylic acid solution (B) into the mixed liquid while stirring; and
forming metal nanoparticles by dropping the aqueous reducing agent solution (C) into the suspension of a carboxylic acid salt while stirring,
wherein the aqueous solutions (A), (B), and (C) are separately prepared,
metal elements contained in the metal salt comprise 75% by mass or more of silver, and
the forming of the metal nanoparticles by dropping the aqueous reducing agent solution (C) while stirring is carried out by stirring at a temperature of 25 to 95° C.

57. The method for synthesizing metal nanoparticles according to claim 56, wherein one type or two or more types of metals selected from the group consisting of gold, platinum, palladium, and ruthenium are included as the remainder of the metal elements contained in the metal salt of the aqueous metal salt solution (A) other than silver.

58. A method for producing a metal film, comprising the steps of:
obtaining a dispersion of metal nanoparticles by dispersing the metal nanoparticles which are obtained by the synthesis method according to claim 56 in a dispersion medium; and
forming a metal film by coating the dispersion of metal nanoparticles as a composition for producing a metal film on a base material by a wet coating process.

59. A method for synthesizing metal nanoparticles, comprising the steps of:
preparing an aqueous metal salt solution (A) by dissolving a metal salt, said aqueous metal salt solution (A) consisting essentially of the metal salt and a solvent;
preparing an aqueous carboxylic acid solution (B) by dissolving one type or two or more types of compounds selected from the group consisting of citric acid, maleic acid and salts thereof
preparing an aqueous reducing agent solution (C) by dissolving one type or two or more types of compounds selected from the group consisting of oxalic acid and salts thereof;
preparing a basic aqueous solution (D);
forming a mixed liquid by dropping the aqueous metal salt solution (A) into the basic aqueous solution (D) while stirring;
forming a suspension of a carboxylic acid salt in which poorly-soluble carboxylic acid salt precipitates by dropping the aqueous carboxylic acid solution (B) into the mixed liquid while stirring; and
forming metal nanoparticles by dropping the aqueous reducing agent solution (C) into the suspension of a carboxylic acid salt,
wherein the aqueous solutions (A), (B), and (C) are separately prepared,
metal elements contained in the metal salt comprise 75% by mass or more of silver, and
the forming of the metal nanoparticles by dropping the aqueous reducing agent solution (C) while stirring is carried out by stirring at a temperature of 25 to 95° C.

60. The method for synthesizing metal nanoparticles according to claim 59, wherein one type or two or more types of metals selected from the group consisting of gold, platinum, palladium, and ruthenium are included as the remainder of the metal elements contained in the metal salt of the aqueous metal salt solution (A) other than silver.

61. A method for producing a metal film, comprising the steps of:
obtaining a dispersion of metal nanoparticles by dispersing the metal nanoparticles which are obtained by the synthesis method according to claim 59 in a dispersion medium; and
forming a metal film by coating the dispersion of metal nanoparticles as a composition for producing a metal film on a base material by a wet coating process.

62. A method for synthesizing metal nanoparticles, comprising the steps of:
preparing an aqueous metal salt solution (A) by dissolving a metal salt, said aqueous metal salt solution (A) consisting essentially of the metal salt and a solvent;
preparing an aqueous carboxylic acid solution (B) by dissolving one type or two or more types of compounds selected from the group consisting of citric acid, maleic acid and salts thereof;
preparing an aqueous reducing agent solution (C) by dissolving one type or two or more types of compounds selected from the group consisting of oxalic acid and salts thereof;
preparing a basic aqueous solution (D);
forming a mixed liquid by dropping the aqueous carboxylic acid solution (B) into the aqueous metal salt solution (A) while stirring;

forming a suspension of a carboxylic acid salt in which poorly-soluble carboxylic acid salt precipitates by dropping the basic aqueous solution (D) into the mixed liquid while stirring; and forming metal nanoparticles by dropping the aqueous reducing agent solution (C) into the suspension of a carboxylic acid salt, wherein the aqueous solutions (A), (B), and (C) are separately prepared, metal elements contained in the metal salt comprise 75% by mass or more of silver, and the forming of the metal nanoparticles by dropping the aqueous reducing agent solution (C) while stirring is carried out by stirring at a temperature of 25 to 95° C.

63. The method for synthesizing metal nanoparticles according to claim 62, wherein one type or two or more types of metals selected from the group consisting of gold, platinum, palladium, and ruthenium are included as the remainder of the metal elements contained in the metal salt of the aqueous metal salt solution (A) other than silver.

64. A method for producing a metal film, comprising the steps of:

obtaining a dispersion of metal nanoparticles by dispersing the metal nanoparticles which are obtained by the synthesis method according to claim 62 in a dispersion medium; and forming a metal film by coating the dispersion of metal nanoparticles as a composition for producing a metal film on a base material by a wet coating process.

* * * * *